US011231568B2

(12) United States Patent
Woodgate et al.

(10) Patent No.: US 11,231,568 B2
(45) Date of Patent: Jan. 25, 2022

(54) ILLUMINATION APPARATUS

(71) Applicant: Optovate Limited, Hemel Hempstead (GB)

(72) Inventors: Graham J. Woodgate, Henley-on-Thames (GB); Jonathan Harrold, Leamington Spa (GB)

(73) Assignee: RealD Spark, LLC, Beverly Hills, CA (US)

( * ) Notice: Subject to any disclaimer, the term of this patent is extended or adjusted under 35 U.S.C. 154(b) by 167 days.

(21) Appl. No.: 16/500,260

(22) PCT Filed: Mar. 29, 2018

(86) PCT No.: PCT/GB2018/050894
§ 371 (c)(1),
(2) Date: Oct. 2, 2019

(87) PCT Pub. No.: WO2018/185476
PCT Pub. Date: Oct. 11, 2018

(65) Prior Publication Data
US 2020/0124834 A1 Apr. 23, 2020

(30) Foreign Application Priority Data
Apr. 3, 2017 (GB) .................................... 1705365

(51) Int. Cl.
*G02B 19/00* (2006.01)
*G02F 1/13357* (2006.01)
(Continued)

(52) U.S. Cl.
CPC ..... *G02B 19/0028* (2013.01); *G02B 19/0066* (2013.01); *G02F 1/133603* (2013.01);
(Continued)

(58) Field of Classification Search
CPC ............ G02B 19/0028; G02B 19/0066; G02F 1/133607; G02F 1/133603;
(Continued)

(56) References Cited

U.S. PATENT DOCUMENTS

| 5,184,114 A | 2/1993 | Brown |
| 5,812,105 A | 9/1998 | Ven |

(Continued)

FOREIGN PATENT DOCUMENTS

| DE | 102010031945 A1 | 1/2012 |
| EP | 1387412 A | 2/2004 |

(Continued)

OTHER PUBLICATIONS

International search report and written opinion of international searching authority in co-pending PCT/US2019/021570, dated May 24, 2019.

(Continued)

*Primary Examiner* — Mary Ellen Bowman
(74) *Attorney, Agent, or Firm* — Penny L. Lowry

(57) ABSTRACT

An illumination apparatus comprises an array of micro-LEDs, an aligned plurality of directional catadioptric optical elements, light redirecting micro-optics and a reflective polariser. The directional illumination apparatus is arranged to provide a uniform spatial distribution across its output area by recirculating reflected high luminous intensity regions into low luminous intensity regions of the catadioptric optical element. A thin and efficient illumination apparatus with high spatial uniformity may be provided for illumination in environmental lighting, display backlighting or direct display.

60 Claims, 44 Drawing Sheets

(51) Int. Cl.
  *G09G 3/34* (2006.01)
  *H01L 25/075* (2006.01)
  *H01L 33/60* (2010.01)
  *G02F 1/1335* (2006.01)

(52) U.S. Cl.
  CPC .. *G02F 1/133605* (2013.01); *G02F 1/133606* (2013.01); *G02F 1/133611* (2013.01); *G09G 3/3406* (2013.01); *H01L 25/0753* (2013.01); *H01L 33/60* (2013.01); *G02F 1/133607* (2021.01)

(58) Field of Classification Search
  CPC ......... G02F 1/133605; G02F 1/133611; G09G 3/3406; H01L 25/0753; H01L 33/60
  See application file for complete search history.

(56) References Cited

U.S. PATENT DOCUMENTS

| | | | |
|---|---|---|---|
| 6,547,423 B2 | 4/2003 | Marshall et al. | |
| 6,570,324 B1 | 5/2003 | Tutt et al. | |
| 7,014,964 B1 | 3/2006 | Hsu et al. | |
| 7,171,874 B1 | 2/2007 | Huang | |
| 7,863,614 B2 | 1/2011 | Toyama et al. | |
| 7,994,531 B2 | 8/2011 | Lin et al. | |
| 9,519,153 B2 | 12/2016 | Robinson et al. | |
| 10,121,772 B1 | 11/2018 | Wu et al. | |
| 10,126,575 B1 | 11/2018 | Robinson et al. | |
| 10,303,030 B2 | 5/2019 | Robinson et al. | |
| 10,533,730 B2 | 1/2020 | Harrold et al. | |
| 2004/0089935 A1 | 5/2004 | Lehner | |
| 2004/0126911 A1 | 7/2004 | Kimura | |
| 2004/0161871 A1 | 8/2004 | Omori | |
| 2004/0218390 A1 | 11/2004 | Holman et al. | |
| 2004/0239243 A1 | 12/2004 | Roberts et al. | |
| 2004/0263061 A1 | 12/2004 | Ishikawa et al. | |
| 2005/0111100 A1 | 5/2005 | Mather et al. | |
| 2005/0219693 A1 | 10/2005 | Hartkop et al. | |
| 2006/0152931 A1 | 7/2006 | Holman | |
| 2006/0256255 A1 | 11/2006 | Minami | |
| 2006/0290276 A1 | 12/2006 | Cok et al. | |
| 2007/0007237 A1 | 1/2007 | Wu et al. | |
| 2007/0019131 A1 | 1/2007 | Choi et al. | |
| 2007/0047254 A1 | 3/2007 | Schardt et al. | |
| 2007/0116424 A1 | 5/2007 | Ting et al. | |
| 2007/0165394 A1 | 7/2007 | Chang | |
| 2007/0176195 A1 | 8/2007 | Kuiseko et al. | |
| 2007/0242477 A1 | 10/2007 | Yoo et al. | |
| 2007/0256453 A1 | 11/2007 | Barnes et al. | |
| 2008/0043466 A1 | 2/2008 | Chakmakjian et al. | |
| 2008/0089093 A1 | 4/2008 | Miller et al. | |
| 2008/0123350 A1 | 5/2008 | Choe et al. | |
| 2008/0225523 A1 | 9/2008 | Samber et al. | |
| 2008/0237612 A1 | 10/2008 | Cok | |
| 2008/0258162 A1 | 10/2008 | Koung et al. | |
| 2008/0315755 A1 | 12/2008 | Han | |
| 2009/0001869 A1 | 1/2009 | Tanimoto et al. | |
| 2009/0086508 A1 | 4/2009 | Bierhuizen | |
| 2009/0109656 A1 | 4/2009 | Chang | |
| 2009/0128735 A1 | 5/2009 | Larson et al. | |
| 2009/0242929 A1 | 10/2009 | Lin | |
| 2009/0268428 A1 | 10/2009 | Tsukada | |
| 2009/0296389 A1 | 12/2009 | Hsu | |
| 2010/0097809 A1 | 4/2010 | Munro et al. | |
| 2010/0165635 A1 | 7/2010 | Chen et al. | |
| 2010/0171215 A1 | 7/2010 | Fischer et al. | |
| 2010/0195330 A1 | 8/2010 | Schaefer et al. | |
| 2010/0258543 A1 | 10/2010 | Mizuno et al. | |
| 2010/0295762 A1 | 11/2010 | Yeom et al. | |
| 2010/0317132 A1 | 12/2010 | Rogers et al. | |
| 2011/0018860 A1 | 1/2011 | Parry-Jones et al. | |
| 2011/0038150 A1* | 2/2011 | Woodgate | G02B 19/0066 362/235 |
| 2011/0090672 A1 | 4/2011 | Zhu et al. | |
| 2011/0194034 A1 | 8/2011 | Shimizu | |
| 2011/0255303 A1 | 10/2011 | Nichol et al. | |
| 2012/0086875 A1 | 4/2012 | Yokota | |
| 2012/0119237 A1 | 5/2012 | Leatherdale et al. | |
| 2012/0140462 A1 | 6/2012 | Pickard | |
| 2012/0258963 A1 | 10/2012 | Berger et al. | |
| 2013/0039062 A1 | 2/2013 | Vinther et al. | |
| 2013/0107525 A1 | 5/2013 | Woodgate et al. | |
| 2013/0121000 A1* | 5/2013 | Lee | H01L 33/56 362/293 |
| 2013/0258663 A1* | 10/2013 | Woodgate | F21K 9/64 362/236 |
| 2013/0293793 A1 | 11/2013 | Lu | |
| 2014/0098418 A1 | 4/2014 | Lin | |
| 2014/0140654 A1 | 5/2014 | Brown et al. | |
| 2014/0186979 A1 | 7/2014 | Tu et al. | |
| 2014/0211462 A1 | 7/2014 | Keller et al. | |
| 2014/0211503 A1 | 7/2014 | Tarsa | |
| 2014/0240839 A1 | 8/2014 | Yang et al. | |
| 2014/0316742 A1 | 10/2014 | Sun et al. | |
| 2015/0054011 A1 | 2/2015 | Koizumi et al. | |
| 2015/0062490 A1 | 3/2015 | Kwon | |
| 2015/0160396 A1 | 6/2015 | Wilcox et al. | |
| 2015/0268479 A1 | 9/2015 | Woodgate et al. | |
| 2015/0268513 A1 | 9/2015 | Chang et al. | |
| 2015/0295154 A1 | 10/2015 | Tu et al. | |
| 2015/0308635 A1 | 10/2015 | Li et al. | |
| 2016/0018077 A1 | 1/2016 | Mallory et al. | |
| 2016/0211413 A1 | 7/2016 | Park et al. | |
| 2016/0299281 A1 | 10/2016 | Robinson et al. | |
| 2017/0031085 A1 | 2/2017 | Lim et al. | |
| 2017/0045666 A1 | 2/2017 | Vasylyev | |
| 2017/0059127 A1 | 3/2017 | Jansma et al. | |
| 2017/0102127 A1 | 4/2017 | Woodgate et al. | |
| 2017/0139114 A1 | 5/2017 | Woodgate et al. | |
| 2017/0154919 A1 | 6/2017 | Chen et al. | |
| 2017/0161179 A1 | 6/2017 | Maple et al. | |
| 2017/0205959 A1 | 7/2017 | Seong | |
| 2017/0248289 A1 | 8/2017 | Vasylyev | |
| 2017/0261179 A1 | 9/2017 | Wu et al. | |
| 2018/0014007 A1 | 1/2018 | Brown | |
| 2018/0226384 A1 | 8/2018 | Park et al. | |
| 2018/0321553 A1 | 11/2018 | Robinson et al. | |
| 2019/0086706 A1 | 3/2019 | Robinson et al. | |
| 2019/0139243 A1 | 5/2019 | You et al. | |
| 2019/0220121 A1 | 7/2019 | Kim et al. | |
| 2019/0250458 A1 | 8/2019 | Robinson et al. | |
| 2019/0265478 A1 | 8/2019 | Cok et al. | |
| 2019/0278135 A1* | 9/2019 | Woodgate | G02F 1/133603 |
| 2019/0294004 A1 | 9/2019 | Hashimoto | |
| 2019/0377067 A1 | 12/2019 | Han et al. | |
| 2020/0049876 A1 | 2/2020 | Watanabe et al. | |
| 2020/0159055 A1 | 5/2020 | Robinson et al. | |
| 2020/0166783 A1 | 5/2020 | Roy et al. | |
| 2020/0259307 A1 | 8/2020 | Sharma et al. | |
| 2020/0321553 A1 | 10/2020 | Kwon et al. | |
| 2020/0355896 A1* | 11/2020 | Woodgate | G02B 1/14 |

FOREIGN PATENT DOCUMENTS

| | | |
|---|---|---|
| EP | 1835550 A | 9/2007 |
| EP | 1890343 A | 2/2008 |
| EP | 1986023 A | 10/2008 |
| EP | 2182783 A | 5/2010 |
| EP | 2595295 A1 | 5/2013 |
| GB | 2464102 A | 4/2010 |
| GB | 2484711 A | 4/2012 |
| JP | 2000323755 A | 11/2000 |
| JP | 2009295309 A | 12/2009 |
| JP | 2010238846 A | 10/2010 |
| JP | 2013219397 A | 10/2013 |
| WO | 2007074932 A1 | 7/2007 |
| WO | 2010038025 A | 4/2010 |
| WO | 2010038025 A2 | 4/2010 |
| WO | 2011131200 A1 | 10/2011 |
| WO | 2012052722 A | 4/2012 |
| WO | 2012052723 A1 | 4/2012 |
| WO | 2013064801 A1 | 5/2013 |
| WO | 2013112435 A1 | 8/2013 |

(56) References Cited

FOREIGN PATENT DOCUMENTS

| WO | 2014043384 A1 | 3/2014 |
|----|---------------|--------|
| WO | 2015089517 A1 | 6/2015 |
| WO | 2017007770 A2 | 1/2017 |
| WO | 2018185475 A1 | 10/2018 |
| WO | 2018185476 A  | 10/2018 |
| WO | 2018208618 A1 | 11/2018 |
| WO | 2019067846 A1 | 4/2019 |
| WO | 2019107826 A1 | 6/2019 |

OTHER PUBLICATIONS

EP18200530.6—European Search Report of the European Patent Office dated May 23, 2019.
International search report and written opinion of international searching authority for PCT application PCT/GB2018/050893 dated Aug. 27, 2018.
International search report and written opinion of international searching authority for PCT application PCT/GB2018/050894 dated Aug. 27, 2018.
International search report and written opinion of international searching authority for PCT application PCT/GB2019/050076 dated May 9, 2019.
International search report and written opinion of international searching authority for PCT application PCT/US2019/031526 dated Jul. 29, 2019.
International search report and written opinion of international searching authority for PCT application PCT/US2020/040686 dated Nov. 20, 2020.
International search report and written opinion of international searching authority for PCT application PCT/US2020/047383 dated Dec. 4, 2020.
International search report and written opinion of international searching authority for PCT application PCT/US2020/050460 dated Dec. 8, 2020.
International search report and written opinion of international searching authority for PCT application PCT/US2020/053864 dated Dec. 14, 2020.
International search report and written opinion of international searching authority for PCT application PCT/US2020/050527 dated Feb. 3, 2021.
International search report and written opinion of international searching authority for PCT application PCT/US2020/053825 dated Dec. 30, 2020.
International search report and written opinion of international searching authority for PCT application PCT/US2021/018544 dated Apr. 29, 2021.

* cited by examiner

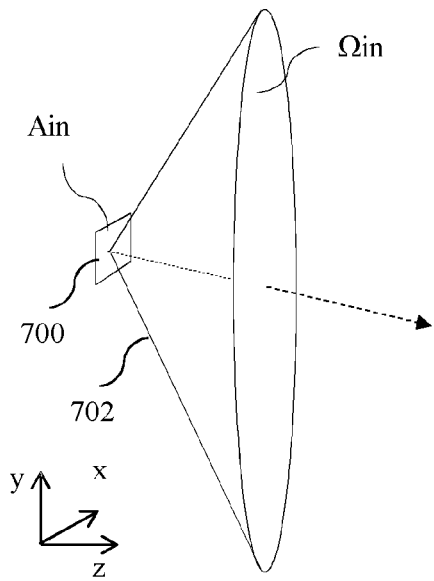
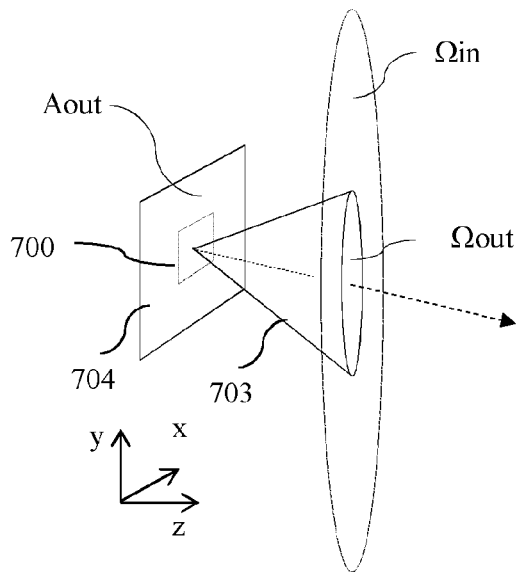
FIG. 4A    FIG. 4B
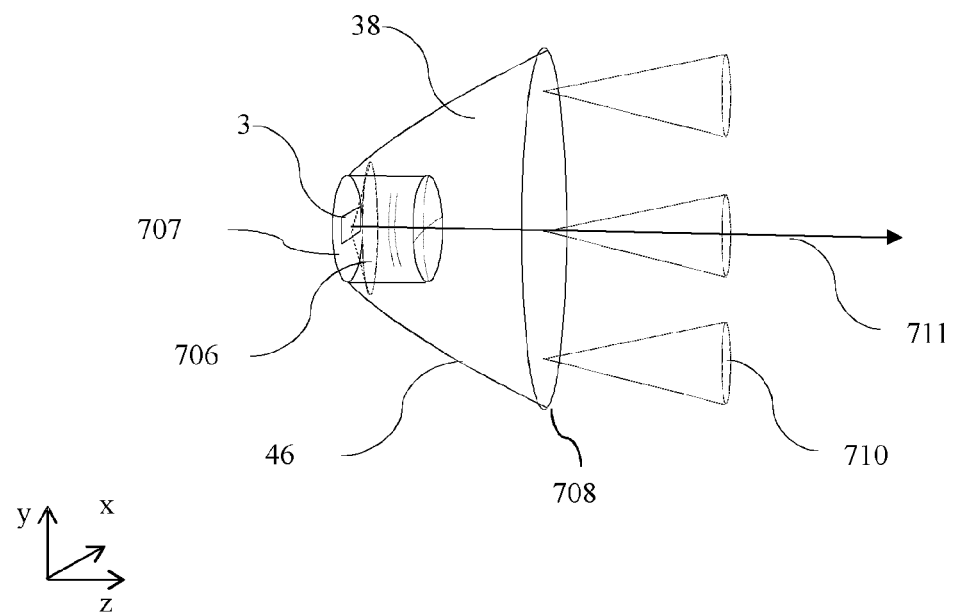
FIG. 4C

ILLUMINATION APPARATUS

TECHNICAL FIELD

The present disclosure relates to an apparatus comprising a plurality of addressable light-emitting elements aligned to a plurality of optical elements. Such an apparatus may be used for environmental lighting, for indoor or outdoor electronic display screens, or for a backlight to an LCD display.

BACKGROUND

Displays with wide directional light output distributions are typically used to achieve comfortable display viewing from many different viewing angles. Such displays are desirable for multiple users to share image content, and for displays where the viewing position is not substantially fixed in relation to the display centreline.

By way of comparison displays with narrow directional light output distributions are typically used to provide image data for the eyes of users over reduced viewing angles. Such displays are typically used to achieve privacy display (where images that may be seen by snoopers are suppressed), night time display (where ambient illumination is suppressed—for example to reduce reflections from windscreens), low power viewing (where illumination is not supplied to regions away from the eyes of users) and outdoors viewing (where high luminance is provided to a narrow range of viewing positions for no or small increases in backlight power).

In a known method, narrow directional light output distributions can be achieved by the addition of a micro louvered film. Such films can be permanently fixed on display such as for ATM cash machines for privacy viewing or automotive displays for night time operation. Alternatively, such films may be manually placed on the surface of a conventional wide directional light output distribution display by the user for private display use and removed and stored to restore a normal wide angle viewing. Micro louver films are inefficient because they work by absorbing light from the backlight in the unwanted display angular directions. As a side effect of construction they also significantly attenuate of the light in the wanted direction.

The viewing angle of a transmissive spatial light modulator such as an LCD (liquid crystal display) is controlled by the output light distribution of a backlight and the angular transmission properties of the LCD panel used. Typically the backlight incorporates a light guide plate (LGP) that accepts light from sources such as LEDs (light emitting diodes) arranged at an input edge of the LGP. A structured pattern on the LGP output face provides a defined leakage of light across its face as the light propagates through the LGP.

Other known backlights incorporate an array of light emitting diodes (LEDs) in a matrix behind the LCD. The light from the LEDs is strongly diffused to create a largely uniform backlight illumination. The directional light output distribution of light from the backlight, or directional light output distribution, can be altered by the addition of fixed layers such as prismatic films and diffusers within the backlight assembly. The backlight and therefore the display angular light directional light output distribution is fixed by design at the time of manufacture.

Illumination systems for environmental lighting such as automobile headlights, architectural, commercial or domestic lighting may provide a narrow directional light output distribution, for example by means of focussing optics to provide spotlighting effects, or can achieve a wide directional light output distribution for example by means of diffusing optics to achieve broad area illumination effects.

Inorganic LEDs formed using semiconductor growth onto monolithic wafers demonstrate high levels of luminous efficiency (lm/W) and high luminous emittance (lm/mm$^2$). The source size is defined by the area of LED die, and so in principle can be made of arbitrary size up to the size of the monolithic wafer. In cooperation with light conversion layers, LEDs may provide acceptable CIE Colour Rendering Indices (CRI) or colour space coverage.

Organic light-emitting diodes (OLEDs) can be formed on arbitrarily large substrates; however luminous emittance may be more than 1000 times lower than may be achieved by inorganic LEDs. Such low luminous emittance is typically not sufficient for LCD backlighting.

In this specification LED refers to an unpackaged LED die chip extracted directly from a monolithic wafer, i.e. a semiconductor element. This is different from packaged LEDs which have been attached to a lead frame in order to provide electrodes and may be assembled into a plastic package to facilitate subsequent assembly.

Packaged LEDs are typically of dimension greater than 1 mm, and more typically of dimension greater than 3 mm and can be assembled by conventional Printed Circuit Board assembly techniques including pick and place methods. The accuracy of components placed by such assembly machines may typically be about plus or minus 30 microns. Such sizes and tolerances prevent application to very high resolution displays.

Micro-LEDs may be formed by array extraction methods in which multiple LEDs are removed from a monolithic wafer in parallel and may be arranged with positional tolerances that are less than 5 microns.

White LED lighting sources can be comprised of separate spectral bands such as red, green, blue and yellow, each created by a separate LED element. Such sources enable users to resolve the separate colours, and as a result of the separation of the sources in the lamp, can create coloured illumination patches. It would be desirable if the sources were homogenized so that their separation was less than the visual resolution limit.

LED Displays for outdoor use are often constructed of LED chips embedded in a black plastic resin in order to suppress background light reflections and thereby increase the overall contrast and viewing quality of the display. The black resin material absorbs a substantial amount of the emitted light, which reduces the efficiency and increases overall power consumption of the display.

BRIEF SUMMARY

Directional LED elements can use reflective optics (including total internal reflective optics) or more typically catadioptric optic type reflectors, as described for example in U.S. Pat. No. 6,547,423. Catadioptric optical elements employ both refraction and reflection, which may be total internal reflection or reflection from metallised surfaces.

Such catadioptric optical elements provide non-uniform spatial distributions of output luminance for some viewing angles. In backlight arrangements, such non-uniform spatial distributions may provide Moiré and mura (non uniformity) artefacts that are undesirable.

It would be desirable to provide increased spatial uniformity for a directional display backlight comprising catadioptric optical elements in a thin package with high efficiency and high resolution.

According to a first aspect of the present disclosure there is provide an illumination apparatus, comprising: a plurality of micro-LEDs, the plurality of micro-LEDs being arranged in a micro-LED array; a plurality of catadioptric optical elements arranged in a catadioptric optical element array, wherein each of the catadioptric optical elements of the plurality of catadioptric optical elements is aligned in correspondence with a respective one or more of the micro-LEDs of the plurality of micro-LEDs, each of the micro-LEDs of the plurality of micro-LEDs being aligned with only a respective one of the catadioptric optical elements of the plurality of catadioptric optical elements; the alignment being such that some of the light output from each of the micro-LEDs exits its respective catadioptric optical element with a first light output distribution; one or more reflective members, the one or more reflective members arranged relative to the first light output distribution such that some of the light that exits the respective catadioptric optical element is reflected by the one or more reflective members back into the catadioptric optical element; and a plurality of light recycle systems, the plurality of light recycle systems being arranged in an array, wherein each of the light recycle systems of the plurality of light recycle systems are aligned in correspondence with a respective micro-LED of the plurality of micro-LEDs, each of the light recycle systems being arranged relative to the catadioptric optical element and the one or more reflective members such as to further reflect some of said light that has been reflected back into its respective catadioptric optical element to provide recycled light that exits its respective catadioptric optical element with a second light output distribution, thereby providing a combined light output distribution comprising in combination the first light output distribution and the second light output distribution, the combined light output distribution having increased spatial uniformity compared to the spatial uniformity of the first light output distribution alone.

Advantageously an illumination apparatus may achieve increased spatial uniformity in comparison to an illumination apparatus with no recycle system. Further efficiency of output of polarised light is increased and power consumption may be reduced for a given luminance, or luminance may be increased for a given power consumption. Further the illumination apparatus may be used to provide a narrow cone of illumination or directional light output distribution, that may be used for privacy display, power savings, and reduced stray light operation. Further high dynamic range operation may be provided.

Each light recycle system may comprise at least a first part and a second part, the first part having a different reflection characteristic compared to the second part. The first part of the light recycle system may have a different reflectivity compared to the second part of the light recycle system. Advantageously light recycling may be provided with increased efficiency and controlled directional light output distribution cone width.

The first part of the light recycle system may provide a different direction of reflection compared to the second part of the light recycle system. Advantageously the spatial uniformity may be further increased and efficiency increased.

The different direction of reflection may be provided by the first part of the light recycle system being of a different shape compared to the second part of the light recycle system. Advantageously the spatial light output distribution of recycled light may be arranged to complement the spatial light output of light exiting the catadioptric optical element, increasing efficiency.

The different direction of reflection may be provided by the first part of the light recycle system facing a direction that is different compared to a direction faced by the second part of the light recycle system. Advantageously a symmetric increase of spatial uniformity may be provided.

Each of the catadioptric optical elements of the plurality of catadioptric optical elements may comprise, in at least one cross-sectional plane through its optical axis: a first outer surface and a second outer surface facing the first outer surface; wherein the first and second outer surfaces extend from a first end of the catadioptric optical element to a second end of the catadioptric optical element, the second end of the catadioptric optical element facing the first end of the catadioptric optical element; wherein the distance between the first and second outer surfaces at the first end of the catadioptric optical element is less than the distance between the first and second outer surfaces at the second end of the catadioptric optical element; and at least one transparent inner surface arranged between the first and second ends and between the first and second outer surfaces. The alignment in correspondence between a catadioptric optical element of the plurality of catadioptric optical elements and its respective one or more of the LEDs of the first plurality of LEDs may comprise the respective one or more of the LEDs of the first plurality of LEDs being positioned at the first end of the catadioptric optical element and aligned with the catadioptric optical element or positioned between the first end of the catadioptric optical element and the at least one transparent inner surface of the catadioptric optical element and aligned with the catadioptric optical element. Advantageously a narrow cone angle with low stray light output can be provided from a micro-LED The width or diameter of the micro-LEDs may be less than 300 microns, preferably less than 200 microns and more preferably less than 100 microns. The distance between the first and second outer surfaces at the second end of the catadioptric optical element may be less than 3 mm, preferably less than 1.5 mm and more preferably less than 0.75 mm. Advantageously a high resolution illumination apparatus may be provided to improve cosmetic quality of the appearance of the output of the illumination apparatus and reduce Moiré and mura visibility in a display apparatus.

The micro-LEDs of the plurality of micro-LEDs may be from a monolithic wafer arranged in an array with their original monolithic wafer positions and orientations relative to each other preserved; and wherein in at least one direction, for at least one pair of the plurality of micro-LEDs in the at least one direction, for each respective pair there was at least one respective micro-LED in the monolithic wafer that was positioned in the monolithic wafer between the pair of micro-LEDs in the at least one direction and that is not positioned between them in the array of micro-LEDs. Advantageously a compact illumination apparatus may be provided. Further large area array extraction methods may be provided, reducing cost and complexity of fabrication in comparison to pick-and-place methods.

The cross-section from one side to the other side of the micro-LED may be aligned within the first end of the catadioptric optical element. Advantageously stray light and cross talk between light output from adjacent catadioptric optical elements may be reduced.

Each of the light recycle systems of the plurality of light recycle systems may be aligned in correspondence with a respective catadioptric optical element of the plurality of catadioptric optical elements. Advantageously increased spatial uniformity may be provided for each optical output across the plurality of catadioptric optical elements.

The second part of the light recycle systems may comprise a light absorbing material. Advantageously the cone angle of the directional light output distribution can be controlled to be similar to the cone angle of output of the light from the micro-LED that exits the catadioptric optical elements. The reflective member may comprise a planar reflective structure. Advantageously increased spatial uniformity may be provided by patterning of planar and tilted reflective optical surfaces.

The reflective member may comprise a reflective polariser. Advantageously a large area and efficient polariser can be provided to provide light for recirculation in an efficient manner while outputting polarised light to a spatial light modulator.

A retarder layer may be arranged between the plurality of catadioptric optical elements and the reflective member. Advantageously the recycled light may have a polarisation state that is transmitted through the reflective polariser after recycling by the recycle systems.

The reflective member may comprise a patterned reflector. Advantageously the spatial uniformity can be further increased in an efficient manner by recycling light that is reflected in high luminance regions to low luminance regions of the spatial light output distribution of the catadioptric optical element.

The patterned reflector may be arranged between the catadioptric optical elements and LEDs of a second plurality of LEDs. Advantageously a switchable directional backlight or display may provide increased spatial uniformity.

The reflective member may comprise at least one prism microstructure. The at least one prism microstructure may be arranged to reflect light by means of total internal reflection. Advantageously non-metallic spatially patterned reflectors may be provided, increasing efficiency and reducing cost.

The light recycle system may comprise at least one tilted reflective surface that is inclined with respect to the optical axis of the catadioptric optical elements of the plurality of catadioptric optical elements.

The light recycle system may be arranged in proximity to a micro-LED that is aligned with the respective catadioptric optical element. The normal of the tilted reflective surfaces may be arranged to intersect an inner side wall of the catadioptric optical element. The intersection of the normal of the tilted reflective surfaces and inner side wall of the catadioptric optical element is in the central one third region of the extent of the side wall. The intersection of the normal of the tilted reflective surfaces may bisect the inner side wall of the catadioptric optical element. The least two tilted reflective surfaces may have different tilt angles. At least two of the tilted reflective surfaces may have different normal directions that are opposing and disposed on either side of the optical axis of the catadioptric optical element. Advantageously high luminance light that exits the catadioptric optical element may be recycled to low luminance spatial locations, increasing spatial uniformity.

The light recycle system may comprise a plurality of tilted reflective surfaces arranged in an array. The at least two tilted surfaces may be interleaved. Advantageously the thickness of the light recycle system may be reduced The catadioptric optical elements of the plurality of catadioptric optical elements may be elongate in a first direction; at least some of the micro-LEDs of the plurality of micro-LEDs may be separated by gaps in the first direction; and the at least two tilted surfaces may be arranged in the gaps. Advantageously recycled light that is incident in the gaps may be efficiently recycled into narrow cone angles, achieving reduced directional light output distribution solid angle, and achieving improved privacy level, reduced stray light and increased luminous efficiency for display users.

The at least two tilted surfaces may be arranged proximate to and around at least some of the micro-LEDs of the plurality of micro-LEDs. Advantageously the light recycle system may be provided on the backplane substrate in alignment with the micro-LEDs, reducing cost and complexity and increasing efficiency.

At least one transparent prism may be provided between at least one micro-LED of the plurality of micro-LEDs and the transparent inner surface of the catadioptric optical elements. Advantageously spatial uniformity may be increased.

In the at least one catadioptric cross-sectional plane, the distance between the first and second outer surfaces at the second end of the catadioptric optical element may be less than 3 mm, preferably less than 1.5 mm and more preferably less than 0.75 mm. The exterior angle between the first end and the first and second outer surfaces at the first end may be less than the exterior angle between the first end and the first and second outer surface at the second end. At least one of the transparent inner surfaces may have positive optical power. At least one of the transparent inner surfaces may have zero optical power. In the at least one catadioptric cross-sectional plane some of the light output of micro-LEDs of the plurality of micro-LEDs may be transmitted by the at least one transparent inner surface before it is reflected at the first or second outer surfaces and directed into the first directional light output distribution; and some of the light output of the micro-LEDs of the plurality of micro-LEDs may be transmitted by the at least one transparent inner surface and directed into the first directional light output distribution without reflection at the first or second outer surfaces.

Advantageously a narrow output solid angle may be provided in a thin and efficient optical structure.

A refractive optical element may be provided between the micro-LEDs of the plurality of micro-LEDs and the at least one transparent inner surface. The refractive optical element may be a hemispherical lens. Advantageously output coupling efficiency from the micro-LEDs may be increased.

The plurality of micro-LEDs may comprise inorganic micro-LEDs. Advantageously high luminance output may be achieved in comparison to organic micro-LEDs, providing backlight and high luminous output functions.

The plurality of micro-LEDs may further comprise a wavelength converting layer. The wavelength converting layer may comprise a phosphor material or a quantum dot material. Advantageously a colour display, backlight or illumination apparatus may be provided.

At least some of the catadioptric optical elements of the plurality of catadioptric optical elements may be extended in a direction that is normal to the catadioptric optical element cross sectional plane. Advantageously a one dimensional narrow cone angle may be provided for display users for comfortable viewing in mobile applications.

The second end of at least one catadioptric optical element of the plurality of catadioptric optical elements may be arranged on the first side of an optical element support substrate. The catadioptric optical elements of the plurality of catadioptric optical elements may comprise a material transparent to at least one operating wavelength of at least one element of the plurality of micro-LEDs. The catadioptric optical elements of the plurality of catadioptric optical elements may comprise a transparent plastics material.

A large area array of accurately positioned catadioptric optical elements may be conveniently formed and aligned to a large area array of micro-LEDs on a backplane substrate. Advantageously cost and complexity of manufacture may be reduced and uniformity of output increased.

According to a second aspect of the present disclosure a backlight for a display apparatus may comprise the illumination apparatus of the first aspect. Advantageously a backlight may provide high luminance polarised output with high spatial uniformity and a controlled solid angle of output in at least one direction.

According to a third aspect of the present disclosure a display apparatus may comprise the backlight apparatus of the second aspect and a spatial light modulator. Advantageously a directional display may be provided with high efficiency, low thickness, high uniformity and directional operation including for Privacy display, reduced power consumption and reduced stray light.

The reflective polariser may be arranged between the backlight and the spatial light modulator. Advantageously the reflective polariser may be conveniently arranged in alignment with the input absorbing polariser of an LCD.

According to a fourth aspect of the present disclosure a direct display apparatus may comprise an illumination apparatus according to the first aspect and a control apparatus arranged to provide image data to the plurality of micro-LEDs arranged in the micro-LED array. The micro-LEDs may be of width or diameter less than 100 microns, preferably less than 50 microns and more preferably less than 25 microns. Advantageously a directional display may be provided with increased efficiency and reduced thickness in comparison to the display apparatus of the third aspect. Further frontal reflections from the display apparatus may be reduced and light output uniformity increased.

According to a fifth aspect of the present disclosure there is provided an illumination apparatus, comprising: a plurality of micro-LEDs, the plurality of micro-LEDs being arranged in a micro-LED array; a plurality of catadioptric optical elements arranged in a catadioptric optical element array, wherein each of the catadioptric optical elements of the plurality of catadioptric optical elements comprises, in at least one cross-sectional plane through its optical axis: a first outer surface and a second outer surface facing the first outer surface; wherein the first and second outer surfaces extend from a first end of the catadioptric optical element to a second end of the catadioptric optical element, the second end of the catadioptric optical element facing the first end of the catadioptric element; wherein the distance between the first and second outer surfaces at the first end of the catadioptric optical element is less than the distance between the first and second outer surfaces at the second end of the catadioptric optical element; and at least one transparent inner surface arranged between the first and second ends and between the first and second outer surfaces; wherein each of the catadioptric optical elements of the plurality of catadioptric optical elements is aligned in correspondence with a respective one or more of the micro-LEDs of the plurality of micro-LEDs, each of the micro-LEDs of the plurality of micro-LEDs being aligned with only a respective one of the catadioptric optical elements of the plurality of catadioptric optical elements; the alignment being such that some of the light output from each of the micro-LEDs exits the second end of its respective catadioptric optical element with a first light output distribution; one or more reflective members, the one or more reflective members arranged relative to the first light output distribution such that some of the light that exits the second end of the respective catadioptric optical element is reflected by the one or more reflective members back into the catadioptric optical element; and a plurality of light recycle systems, the plurality of light recycle systems being arranged in an array, wherein each of the light recycle systems of the plurality of light recycle systems is aligned in correspondence with a respective micro-LED of the plurality of micro-LEDs, each of the light recycle systems being arranged relative to the first end of the catadioptric optical element and the one or more reflective members such as to further reflect some of said light that has been reflected back into its respective catadioptric optical element to provide recycled light that exits the second end of its respective catadioptric optical element with a second light output distribution, thereby providing a combined light output distribution comprising in combination the first light output distribution and the second light output distribution, the combined light output distribution having increased spatial uniformity compared to the spatial uniformity of the first light output distribution alone.

Each light recycle system may comprise at least a first part and a second part, the first part having a different reflection characteristic compared to the second part. The first part of the light recycle system may have a different reflectivity compared to the second part of the light recycle system. The first part of the light recycle system may provide a different direction of reflection compared to the second part of the light recycle system. The different direction of reflection may be provided by the first part of the light recycle system being of a different shape compared to the second part of the light recycle system. The different direction of reflection may be provided by the first part of the light recycle system facing a direction that is different compared to a direction faced by the second part of the light recycle system.

The alignment in correspondence between a catadioptric optical element of the plurality of catadioptric elements and its respective one or more of the micro-LEDs of the first plurality of micro-LEDs may comprise the respective one or more of the micro-LEDs of the first plurality of micro-LEDs being positioned at the first end of the catadioptric optical element and aligned with the catadioptric optical element or positioned between the first end of the catadioptric optical element and the at least one transparent inner surface of the catadioptric optical element and aligned with the catadioptric optical element.

The width or diameter of the micro-LEDs may be less than 300 microns, preferably less than 200 microns and more preferably less than 100 microns. The distance between the first and second outer surfaces at the second end of the catadioptric optical element may be less than 3 mm, preferably less than 1.5 mm and more preferably less than 0.75 mm. The cross-section from one side to the other side of the micro-LED is aligned within the first end of the catadioptric optical element.

Each of the light recycle systems of the plurality of light recycle systems may be aligned in correspondence with a respective catadioptric optical element of the plurality of catadioptric optical elements.

The cross-section from one side to the other side of the micro-LED may be aligned within the first end of the catadioptric optical element.

Each of the light recycle systems of the plurality of light recycle systems may be aligned in correspondence with a respective catadioptric optical element of the plurality of catadioptric optical elements. The second part of the light recycle systems may comprise a light absorbing material. The reflective member may comprise a planar reflective structure. The reflective member may comprise a reflective polariser. A retarder layer may be arranged between the plurality of catadioptric optical elements and the reflective member. The reflective member may comprise a patterned reflector. The patterned reflector may be arranged between the catadioptric optical elements and LEDs of a second plurality of LEDs. The reflective member may comprise at least one prism microstructure.

The at least one prism microstructure may be arranged to reflect light by means of total internal reflection.

The light recycle system may comprise at least one tilted reflective surface that is inclined with respect to the optical axis of the catadioptric optical elements of the plurality of catadioptric optical elements. The light recycle system may be arranged in proximity to a micro-LED that is aligned with the respective catadioptric optical element. The normal of the tilted reflective surfaces may be arranged to intersect an inner side wall of the catadioptric optical element. The intersection of the normal of the tilted reflective surfaces and inner side wall of the catadioptric optical element is in the central one third region of the extent of the side wall. The intersection of the normal of the tilted reflective surfaces may bisect the inner side wall of the catadioptric optical element. The least two tilted reflective surfaces may have different tilt angles. At least two of the tilted reflective surfaces may have different normal directions that are opposing and disposed on either side of the optical axis of the catadioptric optical element. The light recycle system may comprise a plurality of tilted reflective surfaces arranged in an array. The at least two tilted surfaces may be interleaved.

The catadioptric optical elements of the plurality of catadioptric optical elements may be elongate in a first direction; at least some of the micro-LEDs of the plurality of micro-LEDs may be separated by gaps in the first direction; and the at least two tilted surfaces may be arranged in the gaps.

The at least two tilted surfaces may be arranged proximate to and around at least some of the micro-LEDs of the plurality of micro-LEDs.

At least one transparent prism may be provided between at least one micro-LED of the plurality of micro-LEDs and the transparent inner surface of the catadioptric optical elements.

In the at least one catadioptric cross-sectional plane, the distance between the first and second outer surfaces at the second end of the catadioptric optical element may be less than 3 mm, preferably less than 1.5 mm and more preferably less than 0.75 mm.

The exterior angle between the first end and the first and second outer surfaces at the first end may be less than the exterior angle between the first end and the first and second outer surface at the second end. At least one of the transparent inner surfaces may have positive optical power. At least one of the transparent inner surfaces may have zero optical power. In the at least one catadioptric cross-sectional plane some of the light output of micro-LEDs of the plurality of micro-LEDs may be transmitted by the at least one transparent inner surface before it is reflected at the first or second outer surfaces and directed into the first directional light output distribution; and some of the light output of the micro-LEDs of the plurality of micro-LEDs may be transmitted by the at least one transparent inner surface and directed into the first directional light output distribution without reflection at the first or second outer surfaces.

A refractive optical element may be provided between the micro-LEDs of the plurality of micro-LEDs and the at least one transparent inner surface. The refractive optical element may be a hemispherical lens.

The plurality of micro-LEDs may comprise inorganic micro-LEDs. The plurality of micro-LEDs may further comprise a wavelength converting layer. The wavelength converting layer may comprise a phosphor material or a quantum dot material.

The micro-LEDs of the plurality of micro-LEDs may be from a monolithic wafer arranged in an array with their original monolithic wafer positions and orientations relative to each other preserved; and wherein in at least one direction, for at least one pair of the plurality of micro-LEDs in the at least one direction, for each respective pair there was at least one respective micro-LED in the monolithic wafer that was positioned in the monolithic wafer between the pair of micro-LEDs in the at least one direction and that is not positioned between them in the array of micro-LEDs.

At least some of the catadioptric optical elements of the plurality of catadioptric optical elements may be extended in a direction that is normal to the catadioptric optical element cross sectional plane. The second end of at least one catadioptric optical element of the plurality of catadioptric optical elements may be arranged on the first side of an optical element support substrate. The catadioptric optical elements of the plurality of catadioptric optical elements may comprise a material transparent to at least one operating wavelength of at least one element of the plurality of micro-LEDs. The catadioptric optical elements of the plurality of catadioptric optical elements may comprise a transparent plastics material.

According to a sixth aspect of the present disclosure a backlight for a display apparatus may comprise the illumination apparatus of the fourth aspect.

According to a seventh aspect of the present disclosure a display apparatus may comprise the backlight apparatus of the fifth aspect and a spatial light modulator. The reflective polariser may be arranged between the backlight and the spatial light modulator.

According to an eighth aspect of the present disclosure a direct display apparatus may comprise an illumination apparatus according to the first aspect and a control apparatus arranged to provide image data to the plurality of micro-LEDs arranged in the micro-LED array. The micro-LEDs may be of width or diameter less than 100 microns, preferably less than 50 microns and more preferably less than 25 microns.

According to a ninth aspect of the present disclosure there is provided an illumination apparatus, comprising: a plurality of micro-LEDs, the plurality of micro-LEDs being arranged in a micro-LED array; a plurality of catadioptric optical elements arranged in a catadioptric optical element array, wherein each of the catadioptric optical elements of the plurality of catadioptric optical elements is aligned in correspondence with a respective one or more of the micro-LEDs of the plurality of micro-LEDs, each of the micro-LEDs of the plurality of micro-LEDs being aligned with only a respective one of the catadioptric optical elements of the plurality of catadioptric optical elements; and a plurality of light recycle systems, the plurality of light recycle systems being arranged in an array, wherein each of the light recycle systems of the plurality of light recycle systems is aligned in correspondence with a respective micro-LED of the plurality of micro-LEDs; wherein each light recycle system comprises at least a first part and a second part, the first part having a different reflection characteristic compared to the second part.

The first part of the light recycle system may have a different reflectivity compared to the second part of the light recycle system. The first part of the light recycle system may provide a different direction of reflection compared to the second part of the light recycle system. The different direction of reflection may be provided by the first part of the light recycle system being of a different shape compared to the second part of the light recycle system. The different direction of reflection may be provided by the first part of the light recycle system facing a direction that is different compared to a direction faced by the second part of the light recycle system. The illumination apparatus may further comprise one or more reflective members.

The width or diameter of the micro-LEDs may be less than 300 microns, preferably less than 200 microns and more preferably less than 100 microns. The cross-section from one side to the other side of the micro-LED may be aligned within the first end of the catadioptric optical element.

Each of the catadioptric optical elements of the plurality of catadioptric optical elements may comprise, in at least one cross-sectional plane through its optical axis: a first outer surface and a second outer surface facing the first outer surface; wherein the first and second outer surfaces extend from a first end of the catadioptric optical element to a second end of the catadioptric optical element, the second end of the catadioptric optical element facing the first end of the catadioptric optical element; wherein the distance between the first and second outer surfaces at the first end of the catadioptric optical element is less than the distance between the first and second outer surfaces at the second end of the catadioptric optical element; and at least one transparent inner surface arranged between the first and second ends and between the first and second outer surfaces.

Each of the light recycle systems of the plurality of light recycle systems may be aligned in correspondence with a respective catadioptric optical element of the plurality of catadioptric optical elements. The second part of the light recycle systems may comprise a light absorbing material. The reflective member may comprise a planar reflective structure. The reflective member may comprise a reflective polariser. A retarder layer may be arranged between the plurality of catadioptric optical elements and the reflective member. The reflective member may comprise a patterned reflector. The patterned reflector may be arranged between the catadioptric optical elements and LEDs of a second plurality of LEDs. The reflective member may comprise at least one prism microstructure.

The at least one prism microstructure may be arranged to reflect light by means of total internal reflection.

The light recycle system may comprise at least one tilted reflective surface that is inclined with respect to the optical axis of the catadioptric optical elements of the plurality of catadioptric optical elements. The light recycle system may be arranged in proximity to a micro-LED that is aligned with the respective catadioptric optical element. The normal of the tilted reflective surfaces may be arranged to intersect an inner side wall of the catadioptric optical element. The intersection of the normal of the tilted reflective surfaces and inner side wall of the catadioptric optical element is in the central one third region of the extent of the side wall. The intersection of the normal of the tilted reflective surfaces may bisect the inner side wall of the catadioptric optical element. The least two tilted reflective surfaces may have different tilt angles. At least two of the tilted reflective surfaces may have different normal directions that are opposing and disposed on either side of the optical axis of the catadioptric optical element. The light recycle system may comprise a plurality of tilted reflective surfaces arranged in an array. The at least two tilted surfaces may be interleaved.

The catadioptric optical elements of the plurality of catadioptric optical elements may be elongate in a first direction; at least some of the micro-LEDs of the plurality of micro-LEDs may be separated by gaps in the first direction; and the at least two tilted surfaces may be arranged in the gaps.

The at least two tilted surfaces may be arranged proximate to and around at least some of the micro-LEDs of the plurality of micro-LEDs.

At least one transparent prism may be provided between at least one micro-LED of the plurality of micro-LEDs and the transparent inner surface of the catadioptric optical elements.

In the at least one catadioptric cross-sectional plane, the distance between the first and second outer surfaces at the second end of the catadioptric optical element may be less than 6 mm.

The exterior angle between the first end and the first and second outer surfaces at the first end may be less than the exterior angle between the first end and the first and second outer surface at the second end. At least one of the transparent inner surfaces may have positive optical power. At least one of the transparent inner surfaces may have zero optical power. In the at least one catadioptric cross-sectional plane some of the light output of micro-LEDs of the plurality of micro-LEDs may be transmitted by the at least one transparent inner surface before it is reflected at the first or second outer surfaces and directed into the first directional light output distribution; and some of the light output of the micro-LEDs of the plurality of micro-LEDs may be transmitted by the at least one transparent inner surface and directed into the first directional light output distribution without reflection at the first or second outer surfaces.

A refractive optical element may be provided between the micro-LEDs of the plurality of micro-LEDs and the at least one transparent inner surface. The refractive optical element may be a hemispherical lens.

The plurality of micro-LEDs may comprise inorganic micro-LEDs. The plurality of micro-LEDs may further comprise a wavelength converting layer. The wavelength converting layer may comprise a phosphor material or a quantum dot material.

The micro-LEDs of the plurality of micro-LEDs may be from a monolithic wafer arranged in an array with their original monolithic wafer positions and orientations relative to each other preserved; and wherein in at least one direction, for at least one pair of the plurality of micro-LEDs in the at least one direction, for each respective pair there was at least one respective micro-LED in the monolithic wafer that was positioned in the monolithic wafer between the pair of micro-LEDs in the at least one direction and that is not positioned between them in the array of micro-LEDs.

At least some of the catadioptric optical elements of the plurality of catadioptric optical elements may be extended in a direction that is normal to the catadioptric optical element cross sectional plane. The second end of at least one catadioptric optical element of the plurality of catadioptric optical elements may be arranged on the first side of an optical element support substrate. The catadioptric optical elements of the plurality of catadioptric optical elements may comprise a material transparent to at least one operating wavelength of at least one element of the plurality of micro-LEDs. The catadioptric optical elements of the plurality of catadioptric optical elements may comprise a transparent plastics material.

According to a tenth aspect of the present disclosure a backlight for a display apparatus may comprise the illumination apparatus of the fourth aspect.

According to an eleventh aspect of the present disclosure a display apparatus may comprise the backlight apparatus of the fifth aspect and a spatial light modulator. The reflective polariser may be arranged between the backlight and the spatial light modulator.

According to a twelfth aspect of the present disclosure a direct display apparatus may comprise an illumination apparatus according to the first aspect and a control apparatus arranged to provide image data to the plurality of micro-LEDs arranged in the micro-LED array. The micro-LEDs may be of width or diameter less than 100 microns, preferably less than 50 microns and more preferably less than 25 microns.

According to a further aspect of the present disclosure there is provided an illumination apparatus, comprising: a plurality of micro-LEDs, the plurality of micro-LEDs being arranged in a micro-LED array; a first optical system aligned with the micro-LEDs of the plurality of micro-LEDs, the first optical system comprising a plurality of catadioptric optical elements, the plurality of catadioptric optical elements being arranged in a catadioptric optical element array; wherein each catadioptric optical element of the plurality of catadioptric optical elements comprises in at least one catadioptric cross-sectional plane through its optical axis, a first outer surface and a second outer surface facing the first outer surface; wherein the first and second outer surfaces comprise curved surfaces; wherein the first and second outer surfaces extend from a first end of the catadioptric optical element to a second end of the catadioptric optical element, the second end of the catadioptric optical element facing the first end of the catadioptric optical element; wherein the distance between the first and second outer surfaces at the first end of the catadioptric optical element is less than the distance between the first and second outer surfaces at the second end of the catadioptric optical element; and at least one transparent inner surface arranged between the first and second ends and between the first and second outer surfaces; wherein the transparent inner surface comprises at least one curved surface; wherein each micro-LED is aligned with one of the catadioptric optical elements to provide a first spatial light output distribution proximate to the second end with a first directional light output distribution; the first spatial light output distribution with a first directional light output distribution being of light output from the micro-LEDs of the plurality of micro-LEDs; a reflective member arranged to receive light output from the micro-LEDs of the plurality of micro-LEDs and respective aligned catadioptric optical element and reflect some of the light back towards the catadioptric optical element; a light recycle system aligned with the micro-LEDs of the plurality of micro-LEDs to reflect at least some of the reflected light to the respective catadioptric optical element as recycled light; wherein the recycled light provides a second spatial light output distribution with a second directional light output distribution; wherein the first and second spatial light output distributions have in combination less spatial variation than the spatial variation of the first spatial light output distribution.

Such an apparatus may be used for domestic or professional lighting, for display.

BRIEF DESCRIPTION OF THE DRAWINGS

Embodiments are illustrated by way of example in the accompanying figures, wherein like reference numbers indicate similar parts.

FIG. 4A is a schematic diagram illustrating in perspective view a light source with first area and first solid angle of light cone for input into an optical system, in accordance with the present disclosure;

FIG. 4B is a schematic diagram illustrating in perspective view the area and solid angles for output light after light from the light source of FIG. 4A has been directed by the optical system, in accordance with the present disclosure;

FIG. 4C is a schematic diagram illustrating in perspective view source and output areas and solid angles for a catadioptric optical element, in accordance with the present disclosure;

DETAILED DESCRIPTION

It would be desirable to provide a directional backlight for transmissive spatial light modulators such as liquid crystal displays with high spatial uniformity for directional viewing.

The operation of directional displays comprising plurality of micro-LEDs 3 and corresponding plurality of catadioptric optical elements 38 will first be described.

Figure 1A:
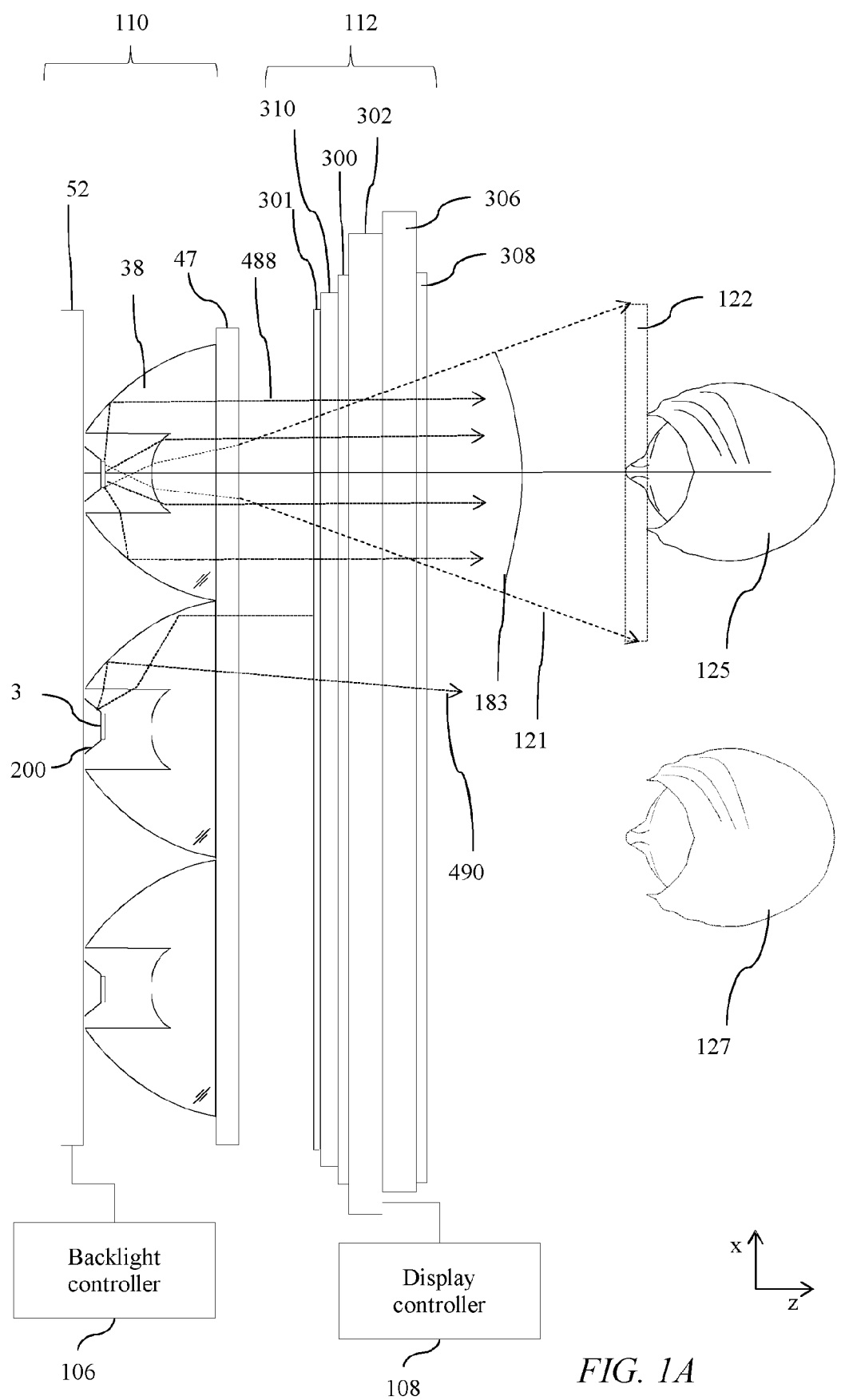
FIG. 1A is a schematic diagram illustrating a top view of a directional display comprising a liquid crystal display and a directional backlight comprising a plurality of micro-LEDs that are each aligned with light deflecting surfaces; and a plurality of one dimensional catadioptric optical elements that are linearly extended, in accordance with the present disclosure.
Figure 1B:
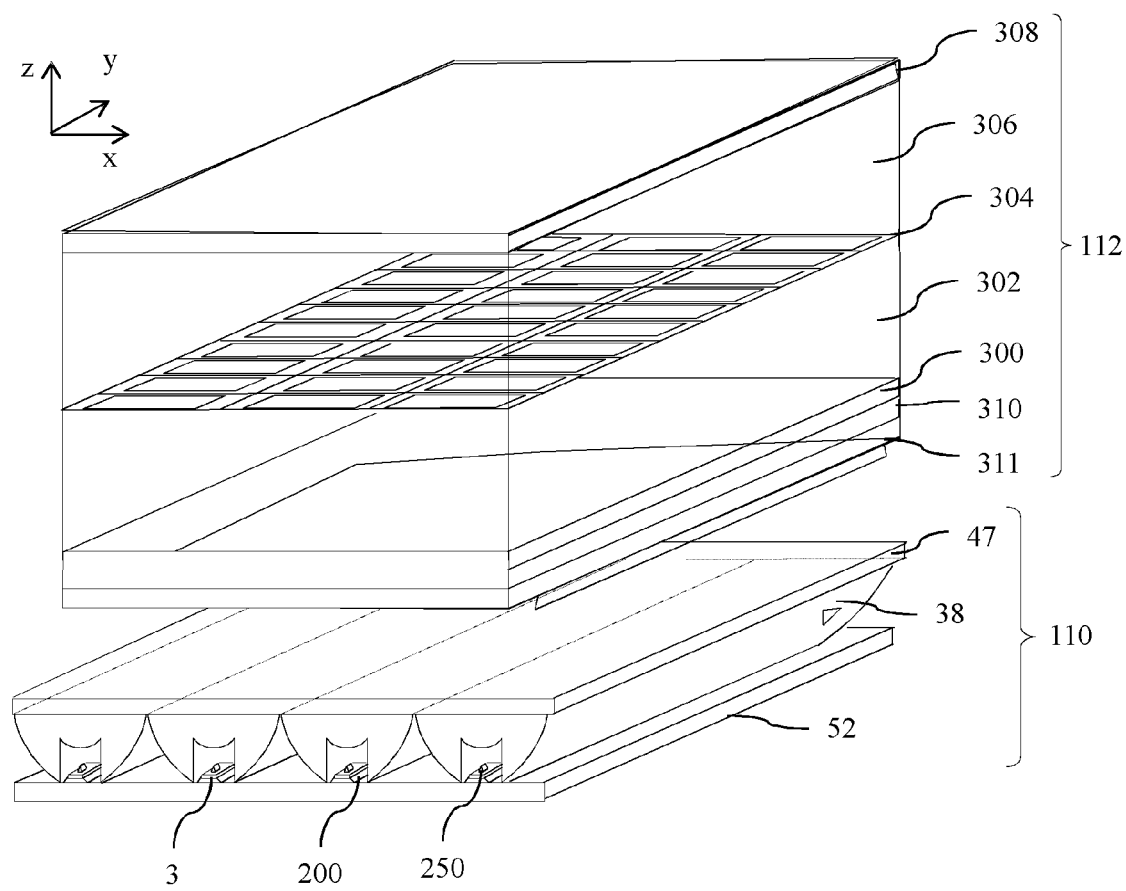
FIG. 1B is a schematic diagram illustrating a perspective side view a directional display comprising a liquid crystal display and a directional backlight comprising a plurality of micro-LEDs that are each aligned with light deflecting surfaces and internally reflecting prisms; and a plurality of one dimensional catadioptric optical elements that are linearly extended, in accordance with the present disclosure.

FIG. 1A is a schematic diagram illustrating a top view of a directional display comprising a spatial light modulator 112 and a directional backlight 110 comprising a plurality of micro-LEDs 3 that are each aligned with regions 204 of light deflecting surfaces 200; and a plurality of one dimensional catadioptric optical elements 38 that are linearly extended. FIG. 1B is a schematic diagram illustrating a perspective side view of the directional display of FIG. 1A. The catadioptric optical elements 38 are extended in the y direction, that may be the vertical direction for a display user.

Thus an illumination apparatus may comprise a plurality of micro-LEDs 3, the plurality of micro-LEDs 3 being arranged in a micro-LED array; a plurality of catadioptric optical elements 38 arranged in a catadioptric optical element array, wherein each of the catadioptric optical elements 38 of the plurality of catadioptric optical elements is aligned in correspondence with a respective one or more of the micro-LEDs 3 of the plurality of micro-LEDs.

Light rays 488, 490 are examples of light rays 488 that exit the catadioptric optical elements 38 of the plurality of optical elements.

The present embodiments further comprise a plurality of light recycle systems such as light deflecting surfaces 200. The plurality of light recycle systems are arranged in an array, wherein each of the light recycle systems of the plurality of light recycle systems are aligned in correspondence with a respective micro-LED 3 of the plurality of micro-LEDs.

The spatial light modulator 112 may comprise a liquid crystal display (LCD) with an array of pixels 303, input polariser 300, TFT substrate 302, pixel layer 304, colour filter substrate 306 and output polariser 308. A further reflective member 310 may comprise a reflective polariser to achieve recirculation of polarised light that is not transmitted through polariser 300, advantageously increasing system efficiency. The reflective polariser may comprise for example a DBEF™ material from 3M Corporation, or may be a wire grid polariser.

In the present disclosure, the plurality of micro-LEDs, or plurality of LEDs, or plurality of catadioptric optical elements, or plurality of light deflecting elements, or plurality of refractive optical elements may each be arranged as one or more arrays. Such arrays may comprise an ordered series or arrangement of the components, or in some embodiments it may be desirable to provide some randomisation of spatial location of the pluralities of components, for example to reduce Moiré patterning artefacts. The present disclosure thus refers to both pluralities and arrays of optical components.

In the present embodiments, increased efficiency may achieve increased luminance for a given power consumption, may achieve reduced power consumption and/or may achieve reduced cost of components, as less area of micro-LEDs 3 and/or catadioptric optical elements 38 are required for a given output luminance.

Further diffuser elements 311, 309 are provided on outer surfaces of the LCD. Alternatively or additionally diffuser element 311 and/or reflective member 310 that may be a reflective polariser may be provided on the transparent substrate 47. Further diffuser layers may be incorporated in the gap between the backlight 110 and spatial light modulator 112.

Diffuser layers may advantageously provide reduction of image Moiré, increased display uniformity and reduction of image mura. The word mura, derived from Japanese, and in common use in the display industry is used herein to mean a defect region, area or a patch of an otherwise generally uniform display or backlight, where an irregularity or non-uniformity is visible or detectable.

Further diffusers may achieve expansion of solid angle 181, to achieve wider viewing angle, and increase comfort of display viewing by increasing headbox size.

Diffusers may further be incorporated onto the surface of the catadioptric optical elements 38 and light guides 100 for example. Such diffusers may achieve increased cone angle and reduce sharpness of penumbra of the beam shape of the directional light output distribution 120. For example, a smooth roll off may be desirable for a display apparatus in comparison to a sharp penumbra for an environmental illumination apparatus.

The spatial light modulator may be arranged to provide pixel data, and the backlight controller may be arranged to provide addressed drive data to the micro-LEDs of the plurality of micro-LEDs.

In a backlight apparatus, the micro-LEDs 3 may be for example blue emitting elements such as gallium nitride semiconductor elements, and may further be provided with colour conversion materials such as phosphors or quantum dot materials to provide white colour output.

A transparent output substrate 47 may have formed thereon a plurality of catadioptric optical elements 38 that are aligned with the plurality of micro-LEDs 3.

The backlight 110 may be arranged to illuminate the spatial light modulator 112 to provide spatially uniform directional illumination as will be described herein.

Directional light output distribution 120 may be provided with solid angle 181 and may be formed by rays 121 from the respective micro-LED 3.

In operation light rays 121 are provided by illumination of micro-LED 3 towards an observer 125 within a directional light output distribution provided by directional light output distribution 120. Directional light output distribution 120 may be formed by rays 121 that are in a cone 181 and that are directed from the micro-LED 3. An observer in the window 120 sees illumination of the spatial light modulator 112 from the output of the catadioptric optical element, and thus the pixels 303 of the spatial light modulator are backlit. A viewer 127 outside the window 120 does not see the display illuminated and thus, directional display operation is provided.

Such cone angle 181 may be further expanded further diffuser elements 311, 309 that are provided on outer surfaces of the LCD. Alternatively or additionally diffuser element 311 and/or reflective member 310 that may be a reflective polariser may be provided on transparent substrate 47. Diffuser layers may advantageously achieve reduction of image Moiré, increased display uniformity and reduction of image mura. Further diffusers may achieve expansion of solid angle 181, to achieve wider viewing angle, and increase comfort of display viewing by increasing headbox size; that is the comfortable range of viewer locations.

Diffusers may further be incorporated onto the surface of the catadioptric optical elements 38 and light guides 100 for example. Such diffusers may achieve increased cone angle and reduce sharpness of penumbra of the beam shape of the directional light output distribution 120. For example, a smooth roll off may be desirable for a display apparatus in comparison to a sharp penumbra for an environmental illumination apparatus. Advantageously viewer comfort may be increased.

A narrow directional light output distribution is provided by light rays 121 that are directed to directional light output distribution 120 with width 132 and height 130 by a two dimensional plurality of catadioptric optical elements 38. An observer with eyes within directional light output distribution 120 sees at least some of the pixels 303 of the transmissive spatial light modulator 112 illuminated. An observer outside the directional light output distribution 120 does not see the pixel data from the spatial light modulator 112.

A directional display may thus be arranged to provide a narrow viewing angle for an observer 125 within the directional light output distribution 120, and no display visibility for an observer 127 that is outside the directional light output distribution 120.

Advantageously such a display may provide reduced power consumption, as no light is directed to regions where there is no observer 125. Further the display may provide privacy operation, so that an undesirable side viewer 127 cannot see the pixel information on the surface of the display. Further, the display may provide reduced stray light in comparison to a conventional wide angle display. Thus the display may be suitable for night time operation with reduced disturbing stray light. Further for outdoors operation, a very high luminance display can be provided for the viewer 125 without increasing the power consumption in comparison to the power consumption of a wide angle display.

FIG. 1A further illustrates that backlight 110 may comprise backplane substrate 52 on which a plurality of micro-LEDs 3 is formed with light recycle systems comprising light deflecting surfaces 200 arranged to provide recycled light rays 490. In the present embodiments light recycle systems advantageously achieve spatial uniformity is increased as will be described further below.

The directional display of the present embodiments may be used for mobile displays, sign boards, private display terminals, monitors and other known display applications.

It may be desirable to provide a directional display with high dynamic range operation, to achieve high levels of image contrast by means of high dynamic range operation in the directional mode of operation. The control system may comprise a backlight controller 106 arranged to drive at least one of the first and second plurality of LEDs 3, 103 in a first region of the backlight apparatus 110 with a higher light output than the light output in a second region of the backlight apparatus 110. The backlight controller 106 may be arranged to drive regions of micro-LEDs in correspondence with image data provided to the transmissive spatial light modulator 112 by a display controller 108.

The backlight may be addressed as regions of micro-LEDs 3 so that micro-LEDs 3 in a first region (corresponding to a high luminance of input image data) may be provided with a high luminous flux, whereas the micro-LEDs 3 in a second region (corresponding to a low luminance of input image data) may be provided with a small luminous flux. In this manner, the contrast of the image may be increased in the directional mode of operation.

The viewing characteristics of the directional display of FIGS. 1A-B will now be described further.

Figure 1C:
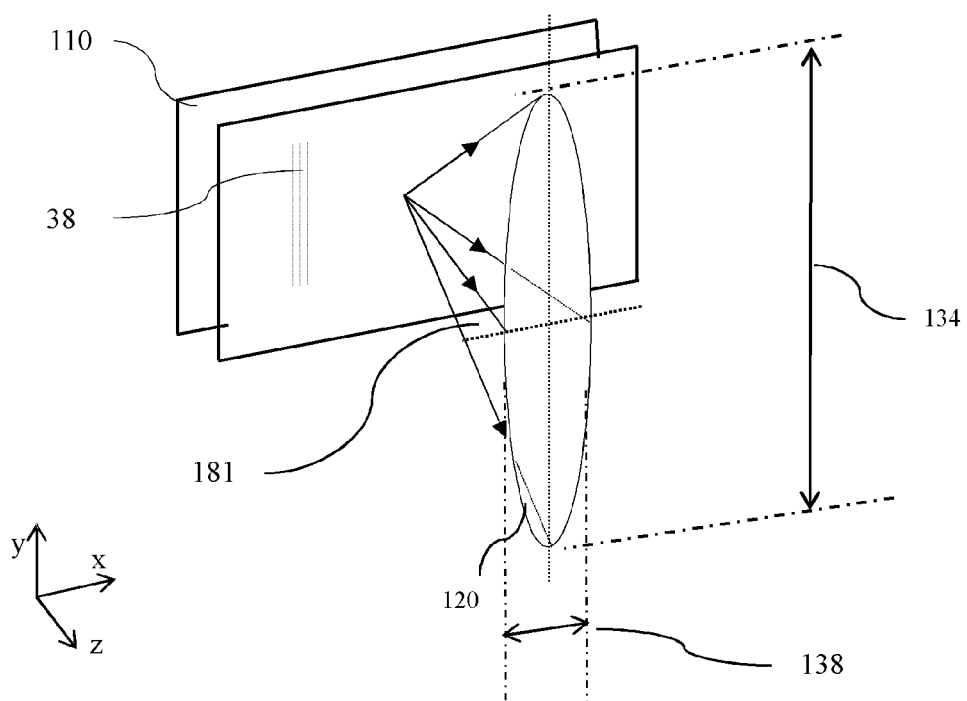
FIG. 1C is a schematic diagram illustrating a perspective front view of the directional light output distribution from the directional display of FIGS. 1A-B for a landscape display orientation, in accordance with the present disclosure.

FIG. 1C is a schematic diagram illustrating a perspective front view of the directional light output distribution from the directional display 110, 112 of FIGS. 1A-B for a landscape display orientation. The backlight 110 and spatial light modulator 112 are arranged to provide directional light output distribution 120 with solid angle 181. The spatial light modulator 112 is rectangular and the catadioptric optical elements 38 are extended in a direction parallel to the short side of the spatial light modulator 112. The directional light output distribution 120 has an angular width 138 in the horizontal direction (x-axis), and an angular height 134 in the vertical direction (y-axis). The angular width may be defined for example as the full width half maximum of the display luminance with viewing angle.

The micro-LEDs 3 and aligned catadioptric optical elements 38 may provide a Lambertian output in the y-axis direction. For a Lambertian display, the display luminance is constant with viewing angle, so that the height 134 may alternatively be defined as 180 degrees.

The embodiment of FIG. 1C may advantageously achieve a wide viewing freedom for rotation of the directional display about the x-axis, while providing a narrower viewing freedom about the lateral direction in the x-axis.

It may be desirable to provide a portrait display with wide vertical viewing freedom.

Figure 1D:
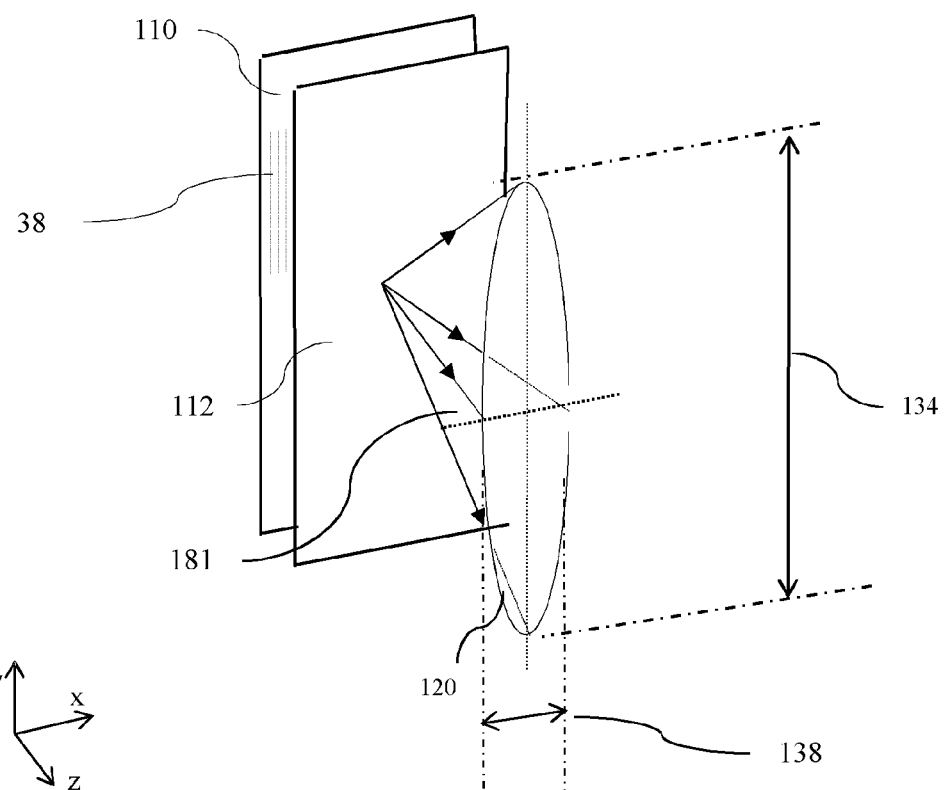
FIG. 1D is a schematic diagram illustrating a perspective front view of the directional light output distribution from the directional display of FIGS. 1A-B for a portrait display orientation, in accordance with the present disclosure.

FIG. 1D is a schematic diagram illustrating a perspective front view of the directional light output distribution from the directional display of FIGS. 1A-B for a portrait display orientation. In this embodiment, the catadioptric optical elements are extended in the direction that is parallel to the long edge of a rectangular spatial light modulator 112. Advantageously comfortable viewing can be achieved for rotation about the x-axis, while achieving directional display characteristics.

It may be desirable to provide restricted display visibility in two dimensions.

Figure 2A:
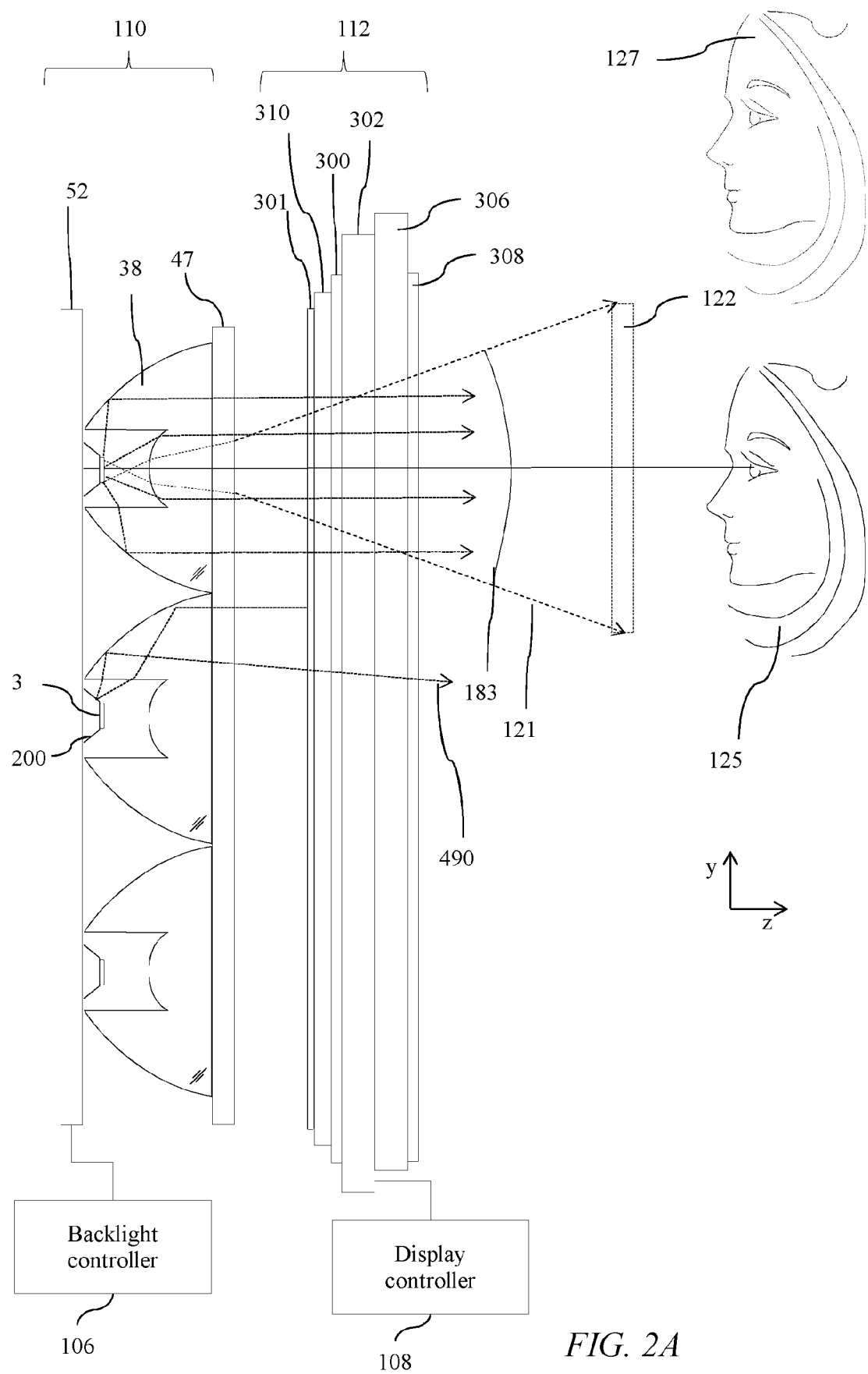
FIG. 2A is a schematic diagram illustrating a side view of a directional display comprising a directional backlight and a liquid crystal display wherein a two dimensional plurality of micro-LEDs is respectively aligned with an array of light deflecting surfaces; and a catadioptric optical element array arranged to form a directional light output distribution for an observer, in accordance with the present disclosure.
Figure 2B:
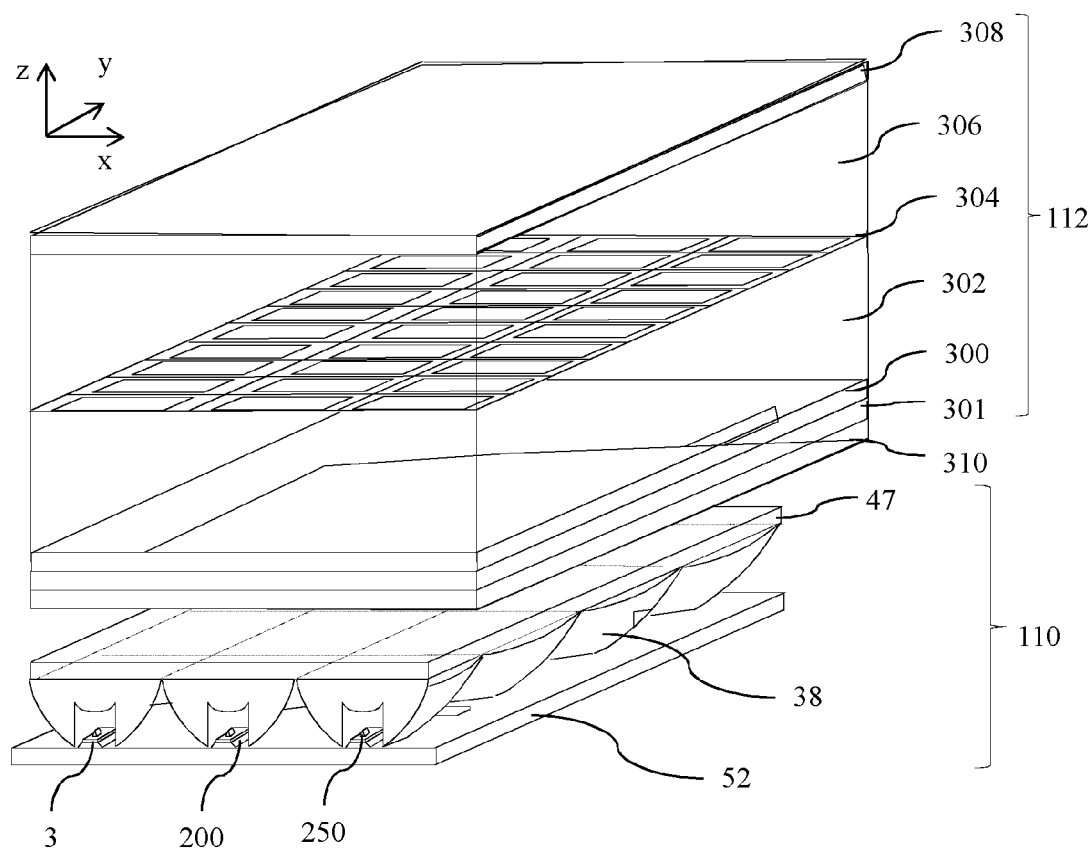
FIG. 2B is a schematic diagram illustrating a perspective side view of the directional display of FIG. 2A, in accordance with the present disclosure.
Figure 2C:
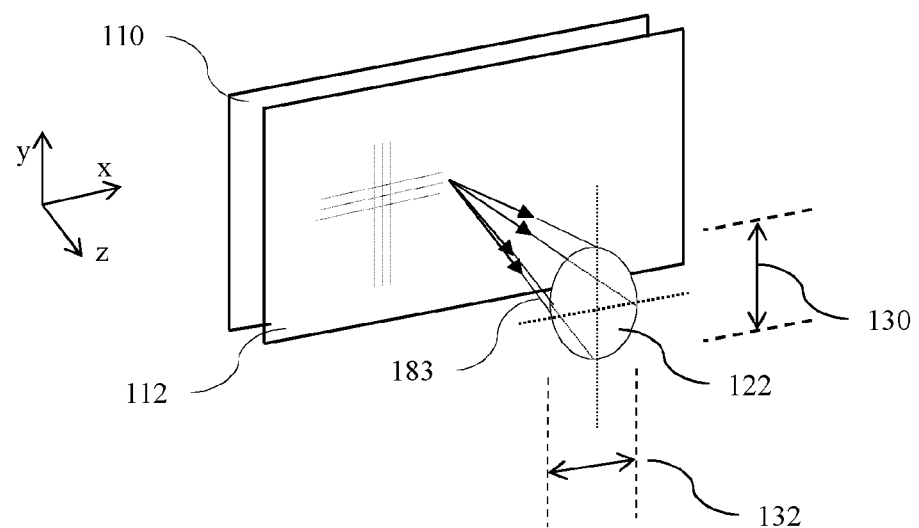
FIG. 2C is a schematic diagram illustrating a perspective front view of the directional light output distribution from the directional display of FIG. 2A, in accordance with the present disclosure.

FIG. 2A is a schematic diagram illustrating a side view of a directional display comprising a directional backlight 110 and a transmissive spatial light modulator 112 and FIG. 2B is a schematic diagram illustrating a perspective side view of the directional display of FIG. 1. FIG. 2C is a schematic diagram illustrating a perspective front view of the directional light output distribution from the directional display of FIG. 2A.

In comparison to the arrangement of FIGS. 1A-B, the catadioptric optical elements 38 are arranged to provide optical power in two dimensions, thus directional light output distribution 122 may be provide with solid angle 183 that is smaller than solid angle 181. Thus the angular width 130, 132 of the directional light output distribution may be reduced in horizontal and vertical directions in comparison to the arrangement of FIG. 1C.

The optical power of the catadioptric optical elements may typically be rotationally symmetric. Alternatively, the optical power may be different in orthogonal directions, for example in the x-axis and y-axis directions, so that the angular sizes 130, 132 may be different.

In comparison to the arrangement comprising elongate catadioptric optical elements 38 of FIGS. 1A-D, the embodiments of FIGS. 2A-C may advantageously provide increased efficiency, improved privacy performance in luminance and viewing angles, reduced stray light and reduced power consumption.

The arrangement of directional light output distributions 120 across the area of the display apparatus will now be described.

Figure 3A:
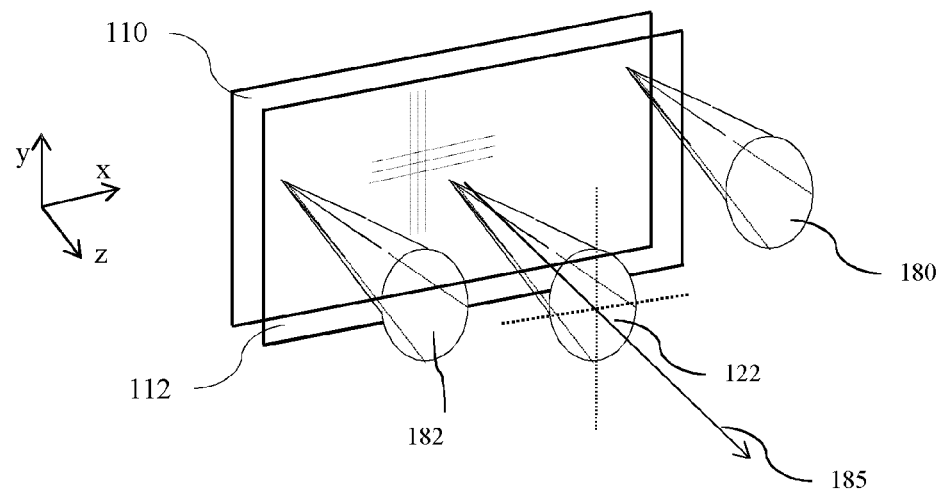
FIG. 3A is a schematic diagram illustrating in perspective front view operation of the directional display of FIG. 1A arranged to provide a narrow directional light output distribution wherein the directional light output distributions are provided to be the same across the area of the display, in accordance with the present disclosure.

FIG. 3A is a schematic diagram illustrating in perspective front view operation of the directional display 110, 112 of FIG. 2A arranged to provide a narrow directional light output distribution wherein the directional light output distributions are provided to be the same across the area of the display. Thus viewing widows 122, 180, 182 may be directed into the same parallel directions 185.

The arrangement of FIG. 3A provides a varying luminance across the area of the display for an observer 125 as each part of the spatial light modulator 112 is observed at a different cone angle.

It may be desirable to provide increased display uniformity for a display user in a nominal viewing location.

Figure 3B:
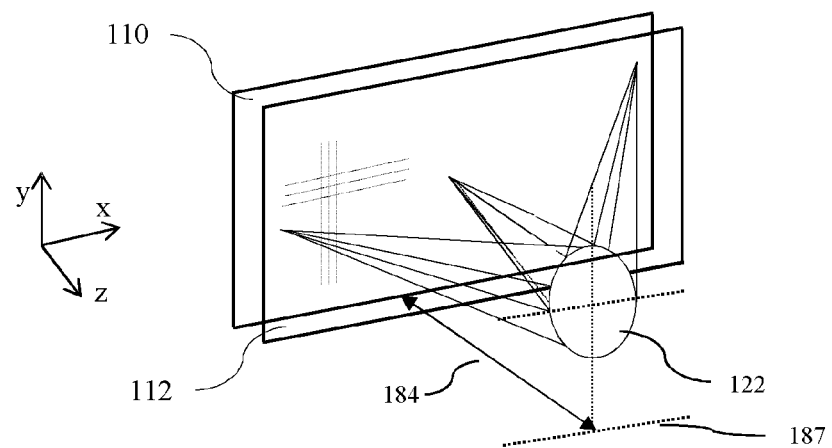
FIG. 3B is a schematic diagram illustrating in perspective front view operation of the directional display of FIG. 1A arranged to provide a narrow directional light output distribution wherein the directional light output distributions are provided to be directed towards a common window location in a window plane, in accordance with the present disclosure.

FIG. 3B is a schematic diagram illustrating in perspective front view operation of a directional display arranged to provide a narrow directional light output distribution wherein the directional light output distributions are provided to be directed towards a common location provided by directional light output distributions 122 in a viewing plane 187. Such an arrangement may for example be achieved by offsetting the alignment of the centre of the micro-LEDs 3 to the centre of the catadioptric optical elements 3 across the area of the backlight illumination apparatus 110.

Advantageously, increased uniformity for the display user 125 may be provided for an observer located at the common location.

The operation of catadioptric optical elements 38 and corresponding micro-LEDs 3 will now be described.

FIG. 4A is a schematic diagram illustrating in perspective view a light source 700 with first area Ain and first solid angle Ωin of light cone 702 for input into an unspecified optical system (not shown); and FIG. 4B is a schematic diagram illustrating in perspective view the output surface 704 of area Aout and cone 703 of solid angle Ωout for output light after light rays from the light source of FIG. 4A has been directed by the optical system. Conservation of brightness, or étendue, means that $$A_{out} * \Omega_{out} <= A_{in} * \Omega_{in} \qquad \text{eqn. 1}$$

FIG. 4C is a schematic diagram illustrating in perspective view a catadioptric optical element 38 with at a first end 707 a micro-LED 3 with an input area Ain and input solid angle Ωin in cone 706. Second end 708 of the catadioptric optical element 38 has area Aout and transmitted light cone 710 has solid angle Ωout. Equation 1 teaches that Aout is thus greater than Ain, thus in at least one dimension the output width of the catadioptric optical element is greater than the input width to provide the reduction in cone solid angle Ωout. Thus the smaller solid angle of cone 710 is achieved by increasing the output area Aout of second end 708 in comparison to the area of the micro-LED 3. The catadioptric optical element may be extended, then the width of the micro-LED 3 may be less than the width of the second end 708.

FIG. 4C further illustrates the optical axis 711 of a rotationally symmetric catadioptric optical element 38. In this embodiment, the optical axis 711 is a line along which there is rotational symmetry and is a line passing through centres of curvature of the refractive surface 42 and outer reflective surface 46 of the catadioptric optical element 38.

In embodiments in which the catadioptric optical element 38 is arranged to operate on-axis, the output luminance may be arranged to be provided in a direction normal to the output surface, for example normal to the transparent support substrate 47. In such embodiments, the optical axis 711 may be the axis of reflective symmetry of the refractive surface 42 and outer reflective surfaces 46a, 46b.

The arrangement and operation of catadioptric optical elements 38 and micro-LED 3 will now be further described.

Figure 5A:
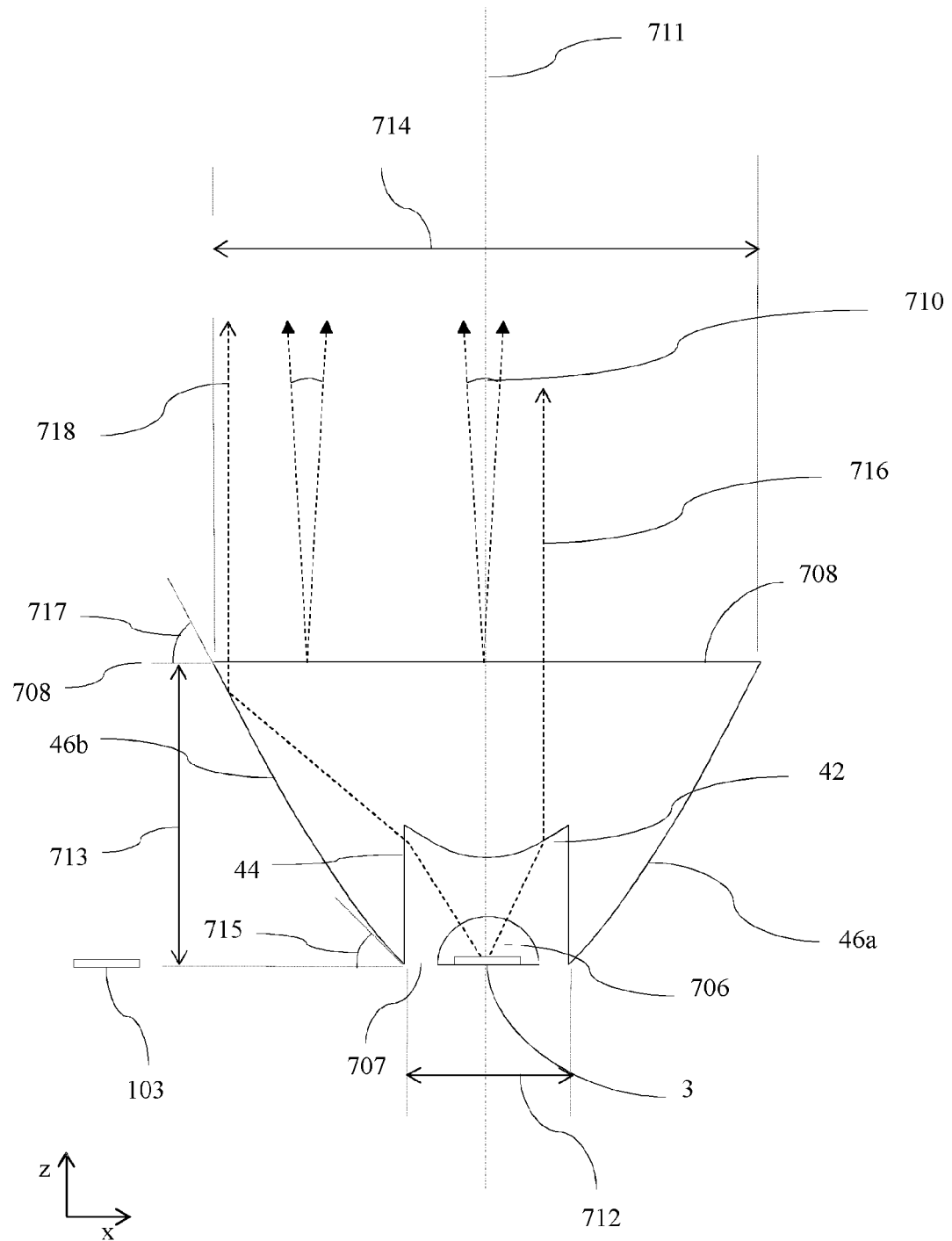
FIG. 5A is a schematic diagram illustrating in side view the input width and output width of a catadioptric optical element in at least one cross sectional plane, in accordance with the present disclosure.

FIG. 5A is a schematic diagram illustrating in side view the input width 712 and output distance 714 of a catadioptric optical element 38 in at least one cross sectional plane through its optical axis 711. Thus the cross sectional plane is the x-z plane and the optical axis 711 is in the cross sectional plane.

Each of the catadioptric optical elements 38 of the plurality of catadioptric optical elements comprises, in at least one cross-sectional plane through its optical axis 711 a first outer surface 46a and a second outer surface 46b facing the first outer surface 46a. The first and second outer surfaces 46a, 46b extend from a first end 707 of the catadioptric optical element 38 to a second end 708 of the catadioptric optical element 38, the second end 708 of the catadioptric optical element 708 facing the first end 707 of the catadioptric optical element.

The distance 712 between the first and second outer surfaces 46a, 46b at the first end of the catadioptric optical element is less than the distance 714 between the first and second outer surfaces 46a, 46b at the second end 708 of the catadioptric optical element 38. At least one transparent inner surface 42, 44 is arranged between the first and second ends 707, 708 and between the first and second outer surfaces 46a, 46b.

End 708 may be provided by an output surface of the catadioptric optical element 38, or may be for example arranged in a layer of a moulded optical component, for example on transparent support substrate 47 of FIG. 2A.

Each of the catadioptric optical elements 38 of the plurality of catadioptric optical elements is aligned in correspondence with a respective one or more of the micro-LEDs 3 of the first plurality of LEDs, each of the LEDs of the first plurality of LEDs being aligned with only a respective one of the optical elements of the first optical system. The alignment in correspondence between a catadioptric optical element 38 of the plurality of catadioptric optical elements and its respective one or more of the micro-LEDs 3 of the first plurality of LEDs comprising the respective one or more of the micro-LEDs 3 of the first plurality of LEDs is by being positioned at the first end 707 of the catadioptric optical element 38 and aligned with the catadioptric optical element 38.

The LEDs 3 may be positioned between the first end 707 of the catadioptric optical element 38 and the at least one transparent inner surface 42, 44 of the catadioptric optical element 38 and aligned with the catadioptric optical element. For example in the cross sectional plane the centre of the micro-LED 3 may be aligned with the optical axis 711 of the catadioptric optical element. In the present disclosure the terminology "at the first end of" the catadioptric optical element includes, for example, the micro-LED being a small amount under the first end 707, in the same plane as the end 707 of the catadioptric optical element 38, or in the vicinity of the end 707, or in the proximity of the end 707 or adjacent the end. In each case this may include aligned with the optical axis of the catadioptric optical element. The above description can be applied to all the embodiments.

A catadioptric optical system uses both reflection and refraction of light. Further, a catadioptric optical system is one where refraction and reflection are combined in an optical system, usually via lenses (dioptrics) and curved mirrors (catoptrics). Catadioptric optical elements are sometimes referred to as RXI optical elements. An RXI optical element produces ray deflections by refraction (R), reflection from metals (X), and total internal reflection (I).

The first and second outer surfaces 46a, 46b each comprise curved surfaces that extend from a first end 707 of the catadioptric optical element to the second end 708 of the catadioptric optical element 38, the second end 708 of the catadioptric optical element facing the first end 707 of the catadioptric optical element 38. Further the transparent inner surface 42, 44 comprises at least one curved surface 42. The exterior angle 715 between the first end 707 and the first outer surface 46a at the first end 707 may be less than the exterior angle 717 between the first end 707 and the first outer surface 46a at the second end 708. Further the exterior angle between the first end 707 and the second outer surface 46b at the first end 707 is less than the exterior angle between the first end 707 and the second outer surface 46b at the second end 708.

Advantageously collimated light may be provided with a directional light output distribution that has a narrow cone angle.

The catadioptric optical element 38 may be arrange to provide substantially collimated output light from the micro-LED 3 for light that is incident on the curved outer surfaces 46a, 46b and the at least one of the transparent inner surface 44 which may have positive optical power. Further at least one of the transparent inner surfaces 44 may have zero optical power. Advantageously surfaces 44 may be conveniently provided during tooling and moulding steps of manufacture. Further, such surfaces may cooperate to provide collimated light for all light rays from micro-LED 3 over a high output solid angle, as will be described below with reference to FIG. 4C in comparison to FIGS. 4A and 4B.

Thus some of the light output illustrated by ray 718 of micro-LEDs 3 of the first plurality of LEDs is transmitted by the at least one transparent inner surface 44 before it is reflected at the first or second outer surfaces 46a 46b and directed into the first directional light output distribution 120; and some of the light output illustrated by ray 716 of micro-LEDs 3 of the first plurality of LEDs is transmitted by the at least one transparent inner surface 42 and directed into the first directional light output distribution 120 without reflection at the first or second outer surfaces 46a, 46b.

At least some of the catadioptric optical elements 38 of the plurality of catadioptric optical elements may be extended in a direction that is normal to the catadioptric optical element cross sectional plane, for example as illustrated in FIG. 1B.

The second end 708 of at least one catadioptric optical element 38 of the plurality of catadioptric optical elements may be arranged on the first side of an optical element support substrate 47 as illustrated in FIG. 1A. The catadioptric optical elements 38 of the plurality of catadioptric optical elements may comprise a material transparent to at least one operating wavelength of at least one element of the plurality of micro-LEDs. The material may be a transparent plastics material.

FIG. 5A further shows that a refractive optical element 706 is provided between the micro-LEDs 3 of the first plurality of LEDs and the at least one transparent inner surface 42, 44. The refractive optical element 706 may a hemispherical lens that is arranged to achieve increased efficiency of light output coupling from the high index materials that are typically used for inorganic micro-LEDs 3. The hemispherical lens 706 increases the effective area Ain of the source 9 comprising the LED and hemispherical lens 706, so the light from the micro-LED 3 is distributed over a larger cone angle than would be provided by the micro-LED 3 alone.

Advantageously, higher efficiency output coupling may be provided.

Returning to the description of FIG. 2A, at least some of the one or more light guides 100 may thus be positioned between respective second ends 707 of neighbouring catadioptric optical elements 38 of the catadioptric optical element array.

In at least one cross sectional plane, the present embodiments provide a reduction in the width of the output directional light output distribution to provide directionality with a directional light output distribution (as described by solid angle Ωout) that is smaller than the input directional light output distribution (as described by solid angle Ωin) by the catadioptric optical element.

The alignment in correspondence between a catadioptric optical element 38 of the plurality of catadioptric optical elements and its respective one or more of the micro-LEDs of the first plurality of LEDs may comprise the respective one or more of the micro-LEDs 3 of the first plurality of LEDs being positioned at the first end 707 of the catadioptric optical element 38 and aligned with the catadioptric optical element 38 or positioned between the first end 707 of the catadioptric optical element and the at least one transparent inner surface 42, 44 of the catadioptric optical element 38 and aligned with the catadioptric optical element 38.

The cross-section from one side to the other side of the micro-LED 3 is aligned within the first end 707 of the catadioptric optical element 38.

It may be desirable to provide an off-axis illumination from the catadioptric optical elements.

Figure 5B:
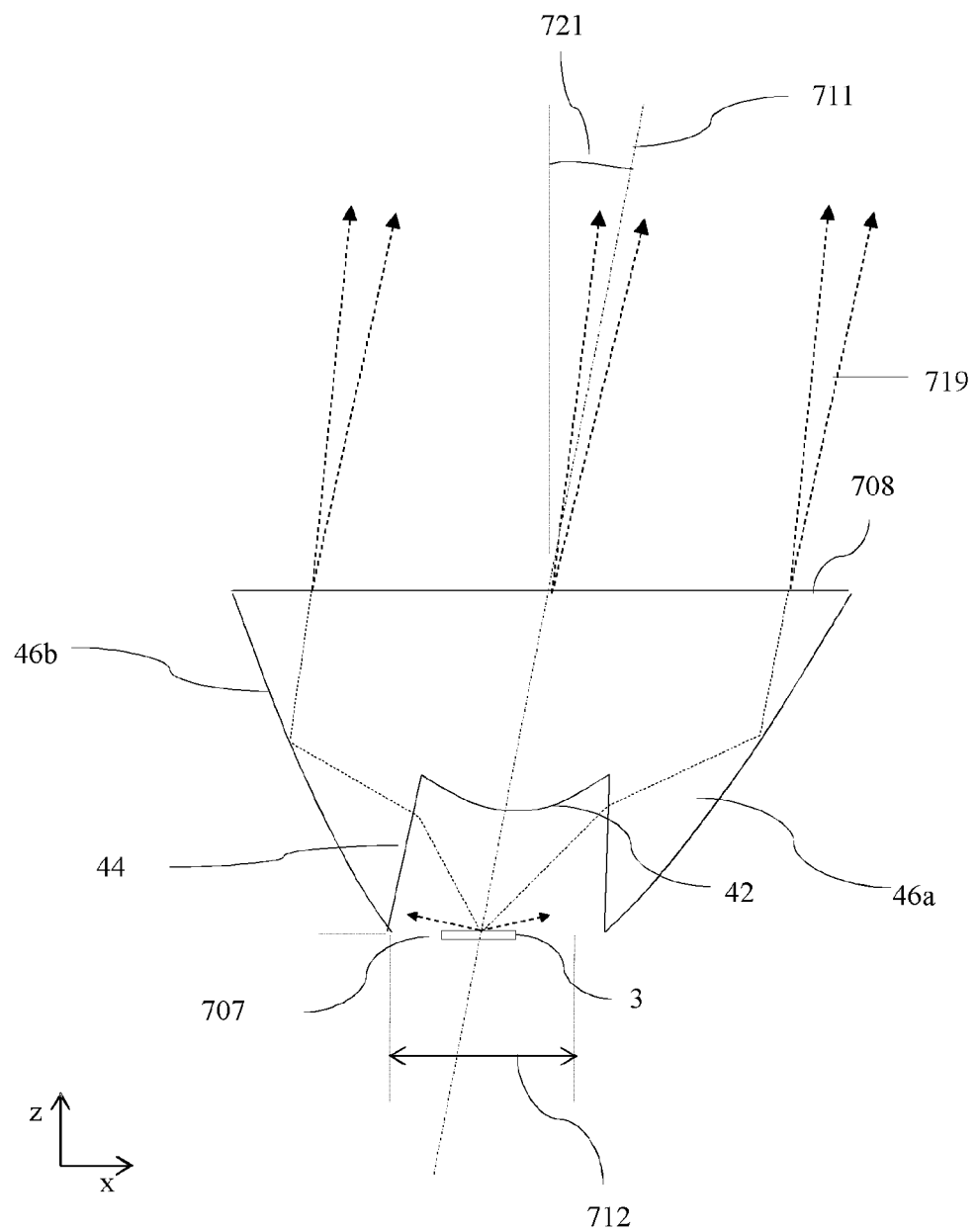
FIG. 5B is a schematic diagram illustrating in side view a catadioptric optical element arranged to provide off-axis illumination, in accordance with the present disclosure.

FIG. 5B is a schematic diagram illustrating in side view a catadioptric optical element arranged to provide off-axis illumination Optical axis 711 may for example be arranged between the centre of the refractive surface 42 and output end of the outer reflective surfaces 46a, 46b. The light cones 719 provided by the micro-LED 3 and catadioptric optical element 38 may be tilted by angle 721 with respect to the normal direction. Advantageously a narrow cone angle may be provided by the illumination apparatus for off-axis directions in a first mode of operation and a wide cone angle may provided in a second mode of operation.

More than one plurality of off-axis catadioptric optical elements may be provided, each plurality comprising different optical axis directions. Addressing of micro-LEDs 3 aligned to each plurality of off-axis catadioptric optical elements may be provided. Advantageously switching between different off-axis directional light output distributions may be achieved. Thus the direction as well as solid angle of the output of the illumination apparatus may be controlled by means of the control circuitry 106.

Figure 5C:
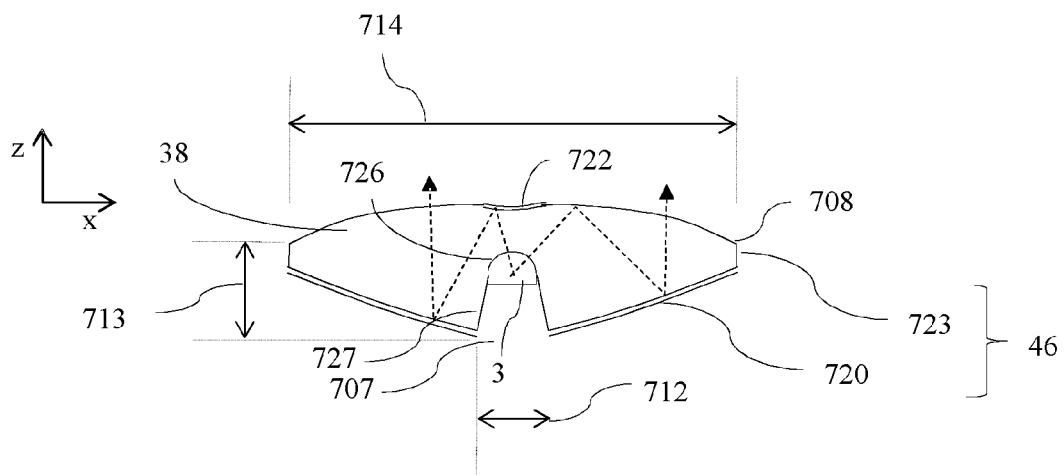
FIGS. 5C-E are schematic diagram illustrating in side views further examples of shapes of catadioptric optical elements, in accordance with the present disclosure.
Figure 5D:
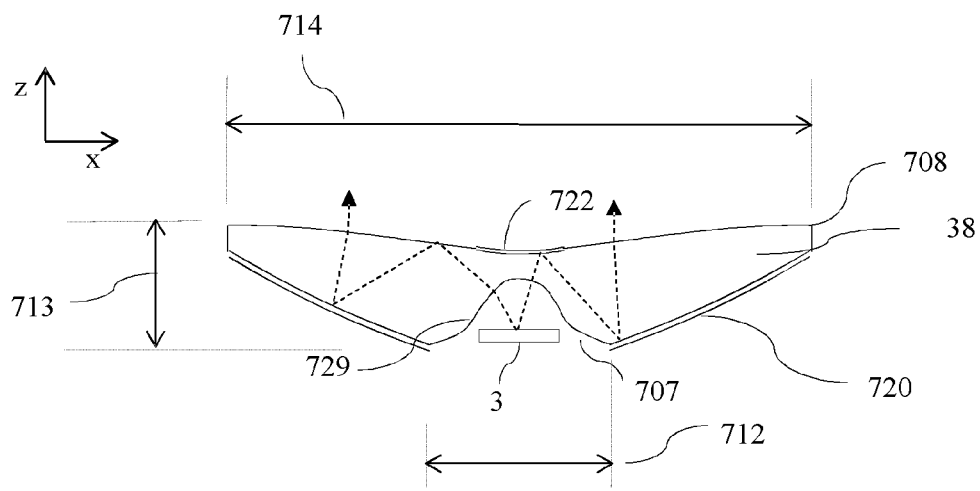
Figure 5E:
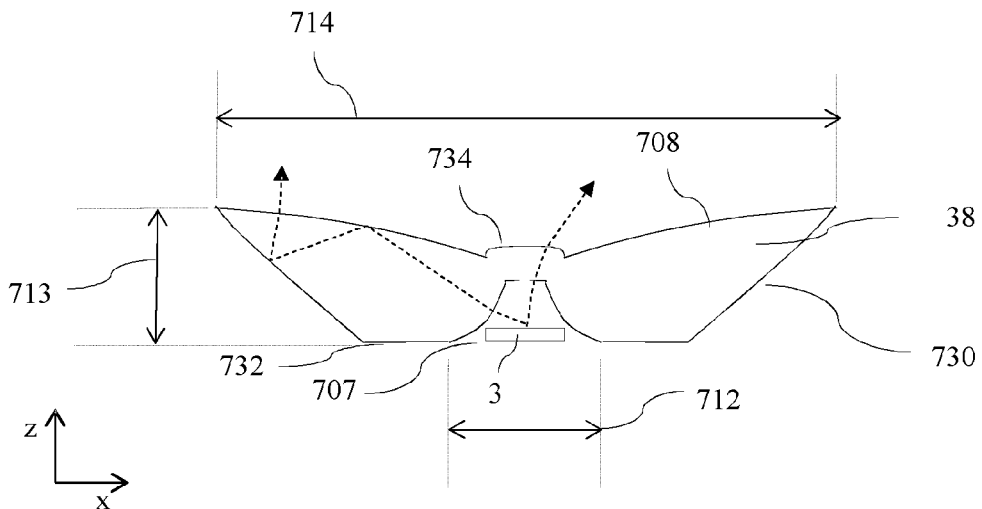

FIGS. 5C-E are schematic diagram illustrating in side views further examples of shapes of catadioptric optical elements.

FIG. 5C illustrates a low thickness catadioptric optical element 38 may be provided with outer surfaces 46 that may comprise metallised outer surface 720 and edge surface 723; transparent inner surfaces 726, 727 that are curved and linear respectively, end 708 that comprises transparent curved surfaces and metallised region 722. Advantageously the thickness 713 may be less than the thickness 713 of the catadioptric optical element 38 of FIG. 5A for example.

FIG. 5D illustrates a further catadioptric optical element 38 wherein transparent inner surface 727 may have a continuous curved shape and be arrange to direct more rays laterally than the tilted walls 727 of FIG. 5C, achieving thickness reduction.

FIG. 5E further provides a thin catadioptric optical element 38, without the use of metallised reflective region 722. Further, outer surface 730 may comprise planar and tilted portions 732, 730 respectively that extends from the input end 707 to the output end 708.

Advantageously narrow directional light output distributions can be achieved in optical elements without mixing between adjacent optical elements, providing low cross talk in display applications.

The control of output illumination by refractive optics, reflective optics and catadioptric optics will now be described.

Figure 6A:
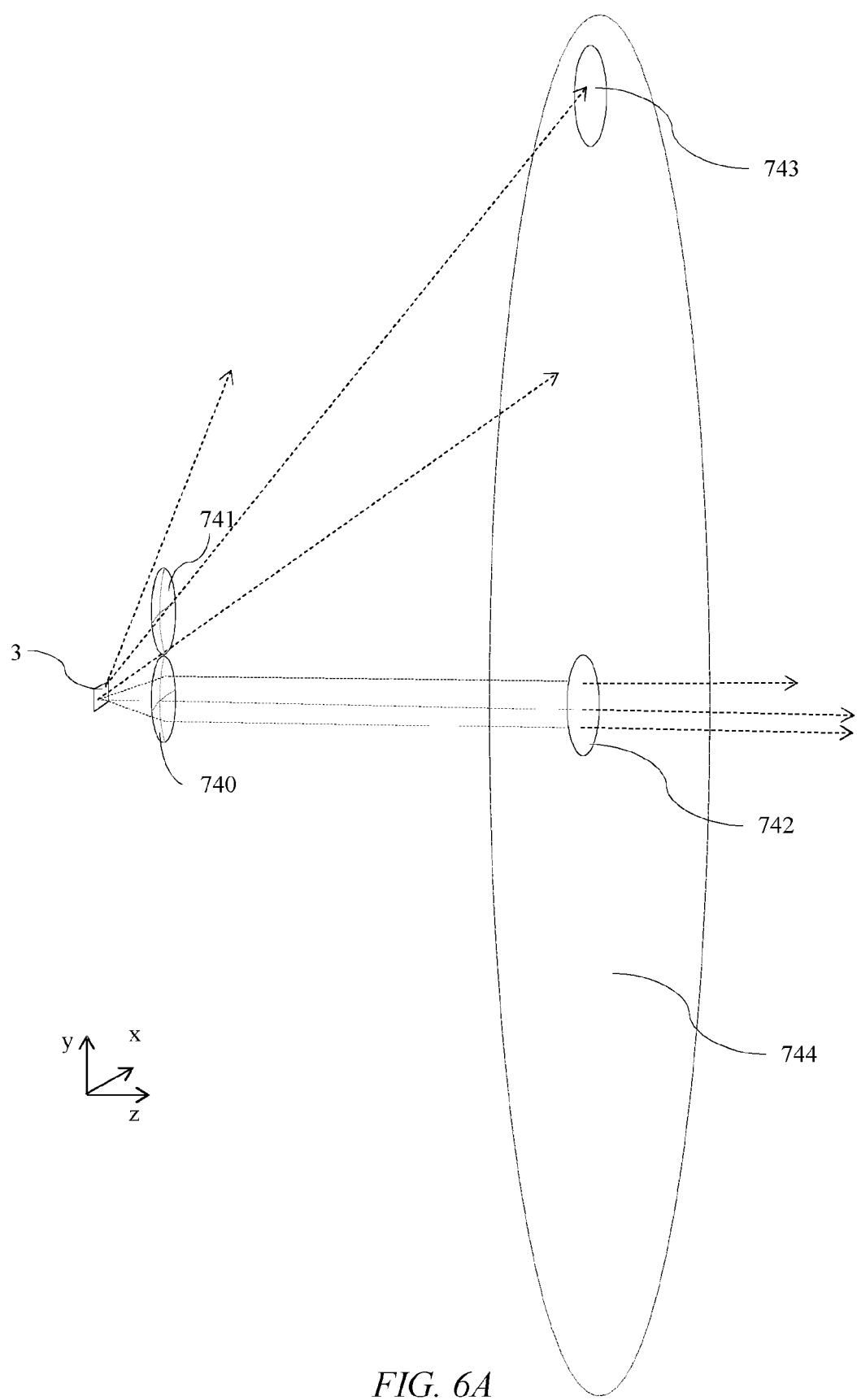
FIG. 6A is a schematic diagram illustrating in perspective view illumination by a refractive optical element providing a background glow and a central spot beam, in accordance with the present disclosure.

FIG. 6A is a schematic diagram illustrating in perspective view illumination by an array of refractive optical elements 740, 741 providing a background glow 744 and central spot beams, 742, 743. Background glow 744 may be provided by light that propagates outside the refractive optical elements 740, and may have a directional light output distribution that is similar to the input light source that may be for example a micro-LED 3. The glow 744 may disadvantageously provide stray light that degrades the quality of illumination, for example increasing background privacy level for unauthorised viewers, and degrading privacy performance. Further additional spot beams 743 with high luminance may undesirably be provided.

Figure 6B:
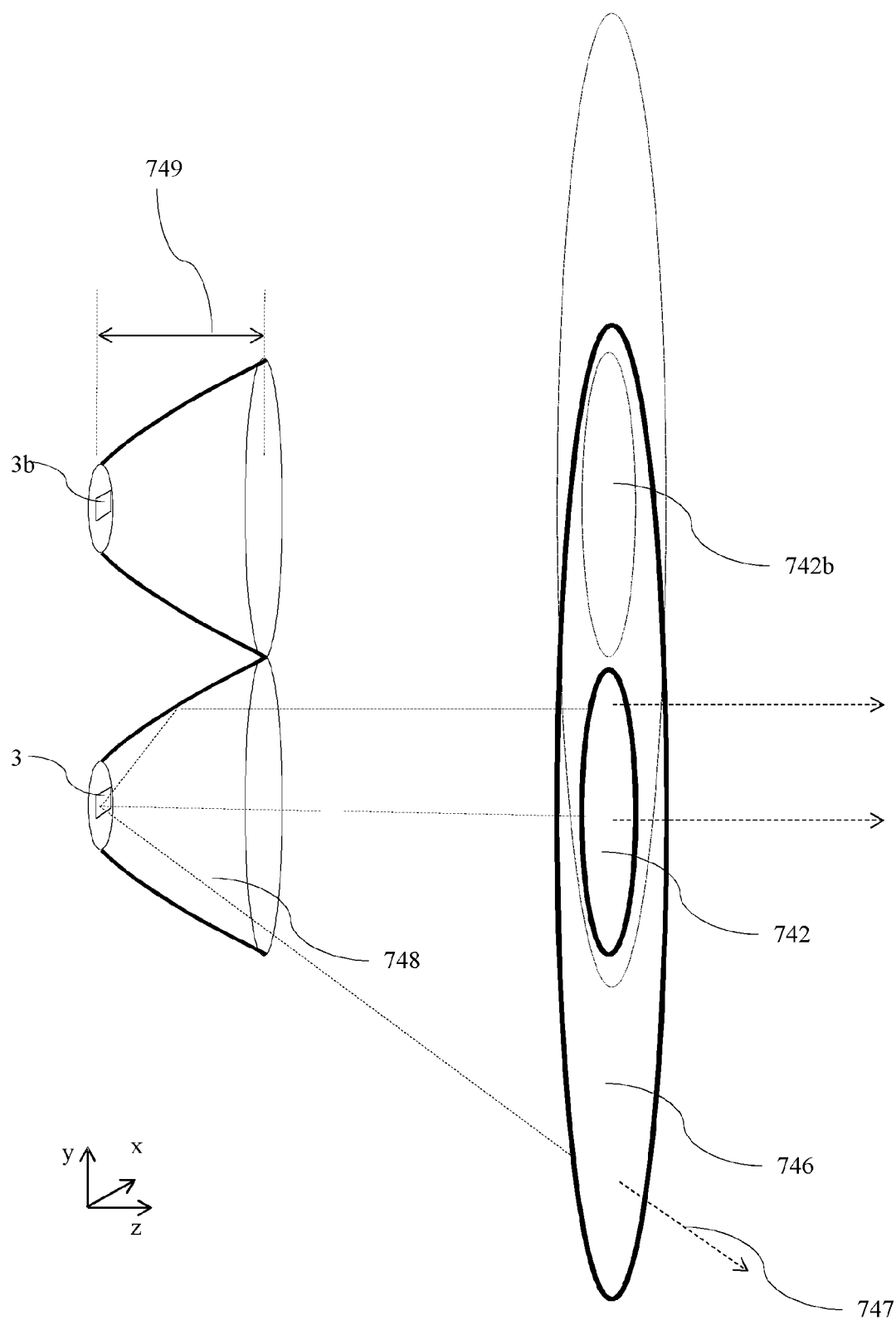
FIG. 6B is a schematic diagram illustrating in perspective view illumination by a reflective optical element providing an outer halo and a central spot beam, in accordance with the present disclosure.

FIG. 6B is a schematic diagram illustrating in perspective view illumination by an array of reflective optical elements providing an outer halo 746 and a central spot beam 742. In comparison to the arrangement of FIG. 6A, the additional spot beam 743 may not be present, however undesirably the halo 746 distributes light over a wider area and degrades background illuminance level, for example reducing privacy performance. The size of the halo 746 may be reduced by increasing the length 749 of the reflective optic, however such increase provides high device thickness.

Figure 6C:
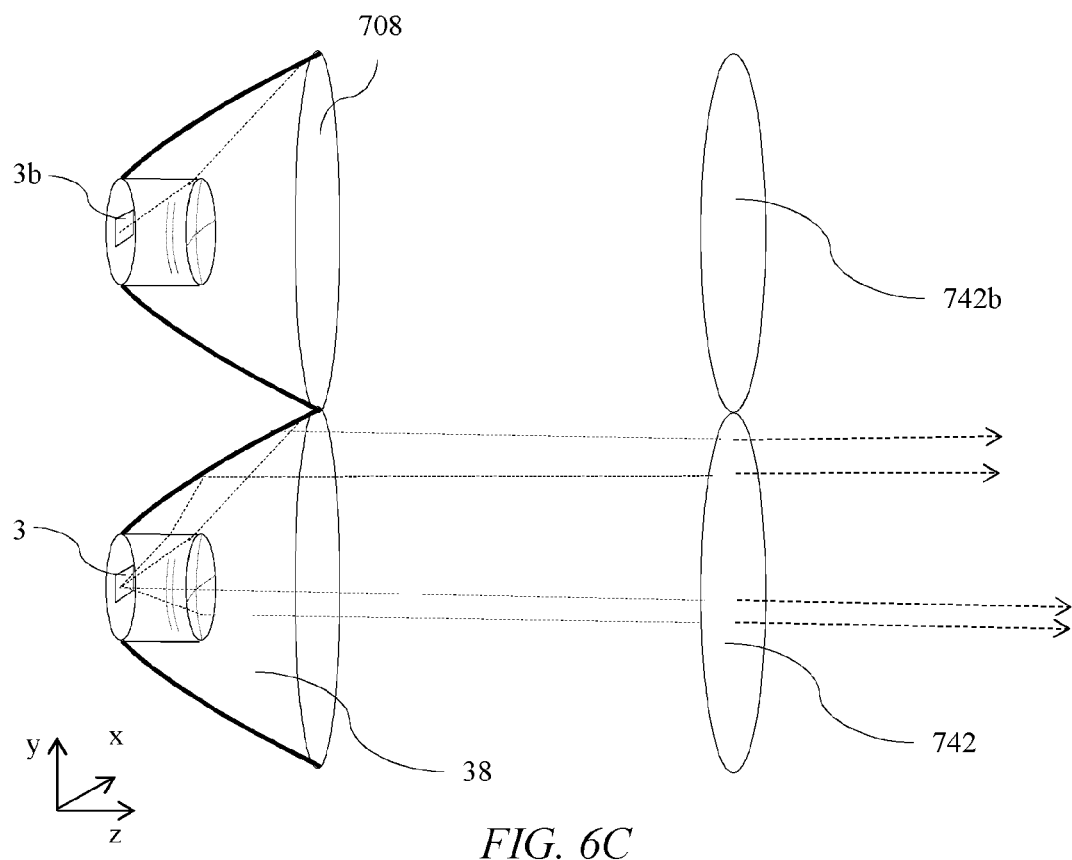
FIG. 6C is a schematic diagram illustrating in perspective view illumination by a catadioptric optical element providing a central spot beam, in accordance with the present disclosure.

FIG. 6C is a schematic diagram illustrating in perspective view illumination by a plurality of catadioptric optical elements providing a central spot beam. In comparison to the arrangements of FIGS. 6A-B, the background glow 744 or halo 746 are not present. Advantageously, low stray light can be provided in a thin package.

The operation of the directional backlight for polarised light will now be described.

Figure 7:
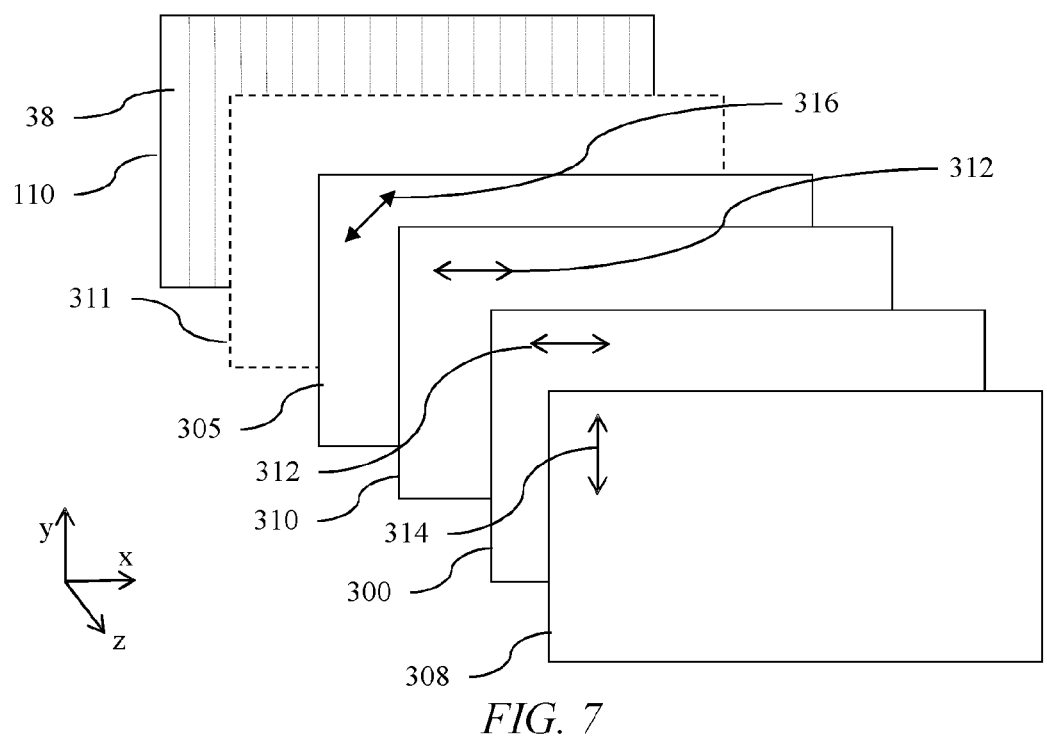
FIG. 7 is a schematic diagram illustrating a perspective front view of the arrangement of polarisation control elements in a directional display, in accordance with the present disclosure.

FIG. 7 is a schematic diagram illustrating a perspective front view of the arrangement of polarisation control elements in a directional display.

Directional backlight 110 may comprise a plurality of catadioptric optical elements 38 with respective output apertures. Input diffuser 311 may be arranged between the directional backlight 110 and a retarder 305 that may have a slow optical axis 316. Reflective member 310 comprising reflective polariser and absorbing polariser 300 may have electric vector transmission directions 312 that are horizontal for example in an illustrative example of an in-plane switching LCD. The output polariser 308 may have electric vector transmission direction 314 that is vertical.

The propagation of polarised light in such an arrangement will now be described.

Figure 8:
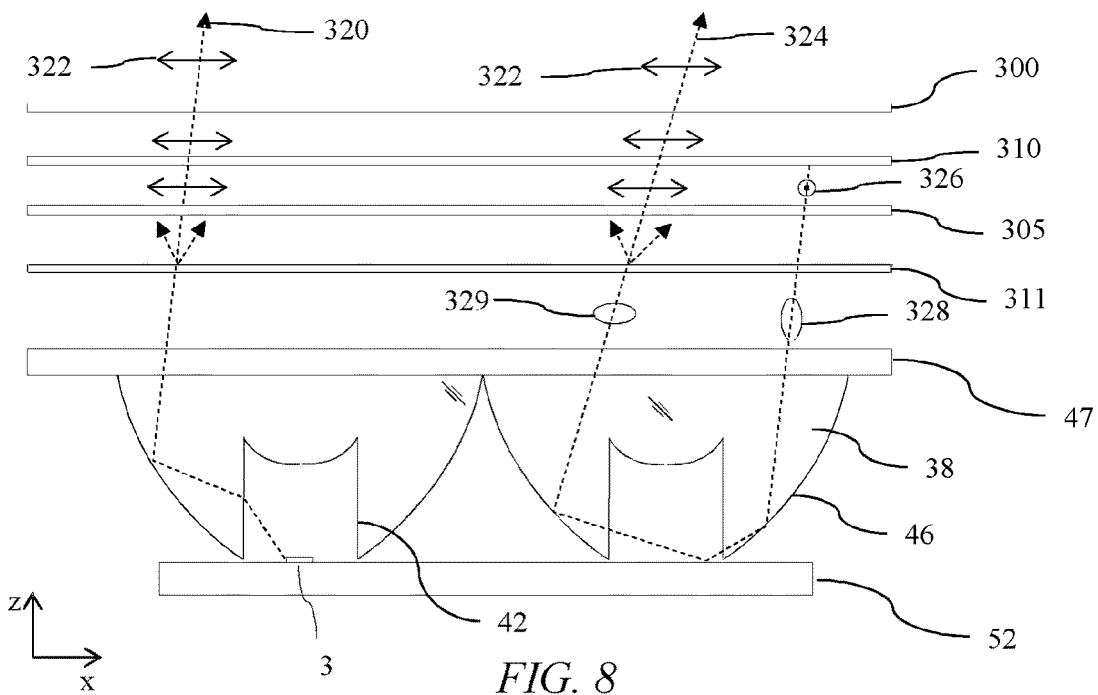
FIG. 8 is a schematic diagram illustrating a side view of the reflection of light from a reflective polariser in a directional backlight, in accordance with the present disclosure.

FIG. 8 is a schematic diagram illustrating a side view of the reflection of light from a reflective polariser in a directional backlight. For illustrative purposes, the output polariser 308, deflecting surfaces 200 and reflecting prism elements 250 are omitted.

In operation, light rays 320 from micro-LED 3 is transmitted through reflective member comprising a reflective polariser 310 and absorbing polariser 300 with a linear polarisation state 322.

As illustrated by ray 324, light rays that are reflected by reflective member comprising a reflective polariser 310 propagate back towards the catadioptric optical elements with polarisation state 326 that is orthogonal to polarisation state 322. Typically the reflective polariser 310 is planar and attached to the LCD, such that the reflective member comprises a planar reflective structure and comprises a reflective polariser 310. Thus retarder layer 305 is arranged between the plurality of catadioptric optical elements and the reflective member.

Retarder 305 has a slow optical axis direction 316 and retardance arranged to modify the polarisation state 326 to state 328 which in general is an elliptical polarisation state. In an illustrative example the retarder 305 is a quarter waveplate with slow axis direction 316 at 45 degrees to the horizontal direction (x-axis) and the polarisation state 326 is a circular polarisation state.

On reflection from the surfaces 46 of the catadioptric optical element 38, and further reflection from reflective layers on or near the catadioptric optical element (as will be described further herein), a modified elliptical polarisation state 329 may be provided. State 329 may be substantially orthogonal to state 328, such that light ray 324 after passing through retarder 305 may be provided with a horizontal polarisation state 322, that is transmitted through the reflective member comprising a reflective polariser 310 and absorbing polariser 300.

Retarder 305 may be a single layer retarder to achieve reduced cost or may be a multilayer retarder to achieve reduced chromatic variations and increased efficiency over a range of viewing angles.

Advantageously the efficiency of the directional display 110, 112 is increased in comparison to arrangements that do not have a reflective rear reflective member comprising a reflective polariser 310.

The spatial uniformity of the output of a catadioptric optical element will now be discussed.

Figure 9:
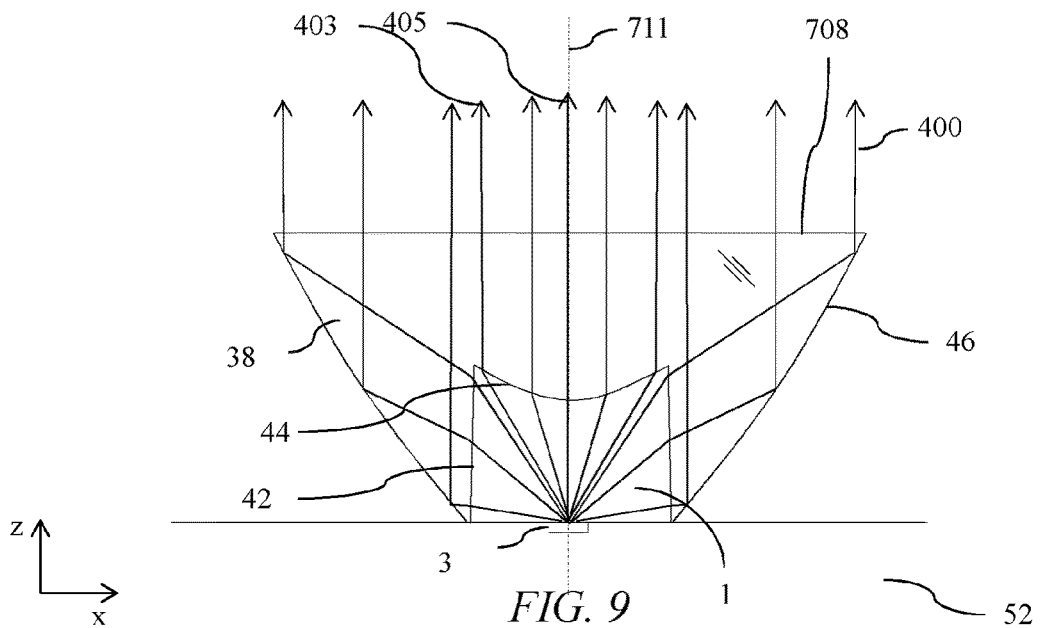
FIG. 9 is a schematic diagram illustrating a side view of a raytrace of light rays from the centre of a micro-LED through a catadioptric optical element, in accordance with the present disclosure.

FIG. 9 is a schematic diagram illustrating a side view of a raytrace of light rays from the centre of a micro-LED 3 through a catadioptric optical element 38 with optical axis 711 that is aligned with the centre of the micro-LED 3 arranged on backplane substrate 52.

In an illustrative embodiment, light rays 405 normal to the micro-LED 3 are emitted into air cavity 1 and directed along the optical axis 711 to the curved refractive surface 44 and transmitted through output end 708 (that may be arranged on transmissive substrate 47, not shown).

Light rays 400, 403, 405 exit the catadioptric optical element 38. Light rays 403 at angles near to the normal direction of the micro-LED 3 are refracted at the refractive surface 44 and output at substantially parallel to rays 405.

Light rays 400 at greater angles to the normal are incident on the side walls 42 and refracted to fall onto the outer surface 46 at which they are reflected by total internal reflection and output substantially parallel to rays 405. The shape of the surface 46 may be arranged to provide such collimation of light from the centre of the micro-LED 3.

The directional light output distribution 120 is determined by the size and location of the micro-LED and the refraction and reflection properties of the catadioptric optical element 38.

Advantageously a small solid angle 181 may be provided by the catadioptric optical element 38 and micro-LED 3. Further low leakage of light in lateral directions may be provided.

Figure 10:
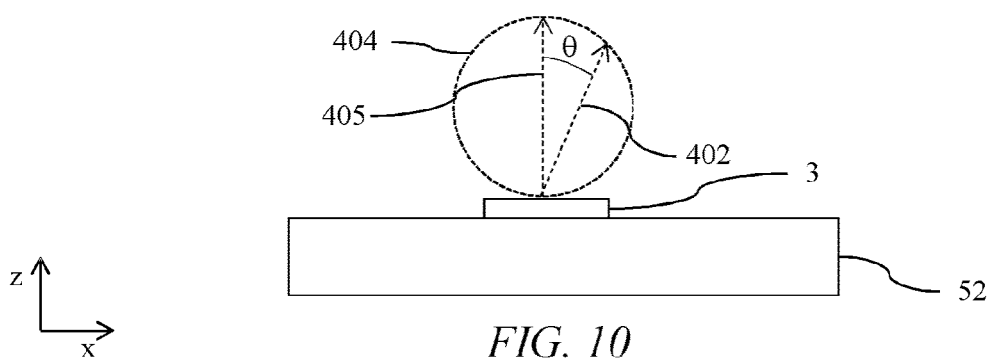
FIG. 10 is a schematic diagram illustrating a side view of the directional light output distribution from a micro-LED, in accordance with the present disclosure.

FIG. 10 is a schematic diagram illustrating a side view of the directional light output distribution from a micro-LED 3 in air. Emission from the upper surface is typically Lambertian; that is the luminance (luminous flux per unit solid angle per unit projected source area) is constant with viewing angle. Thus the luminous intensity (luminous flux per unit solid angle) of ray 402 falls as $\cos \theta$ where $\theta$ is the inclination angle of output ray 402 to ray 405. More generally, the ray luminous intensity distribution with angle can be represented by luminous intensity locus 404 that is a circle for a Lambertian emitter.

The output spatial luminance of the output of the catadioptric optical element of FIG. 9 will now be described.

Figure 11A:
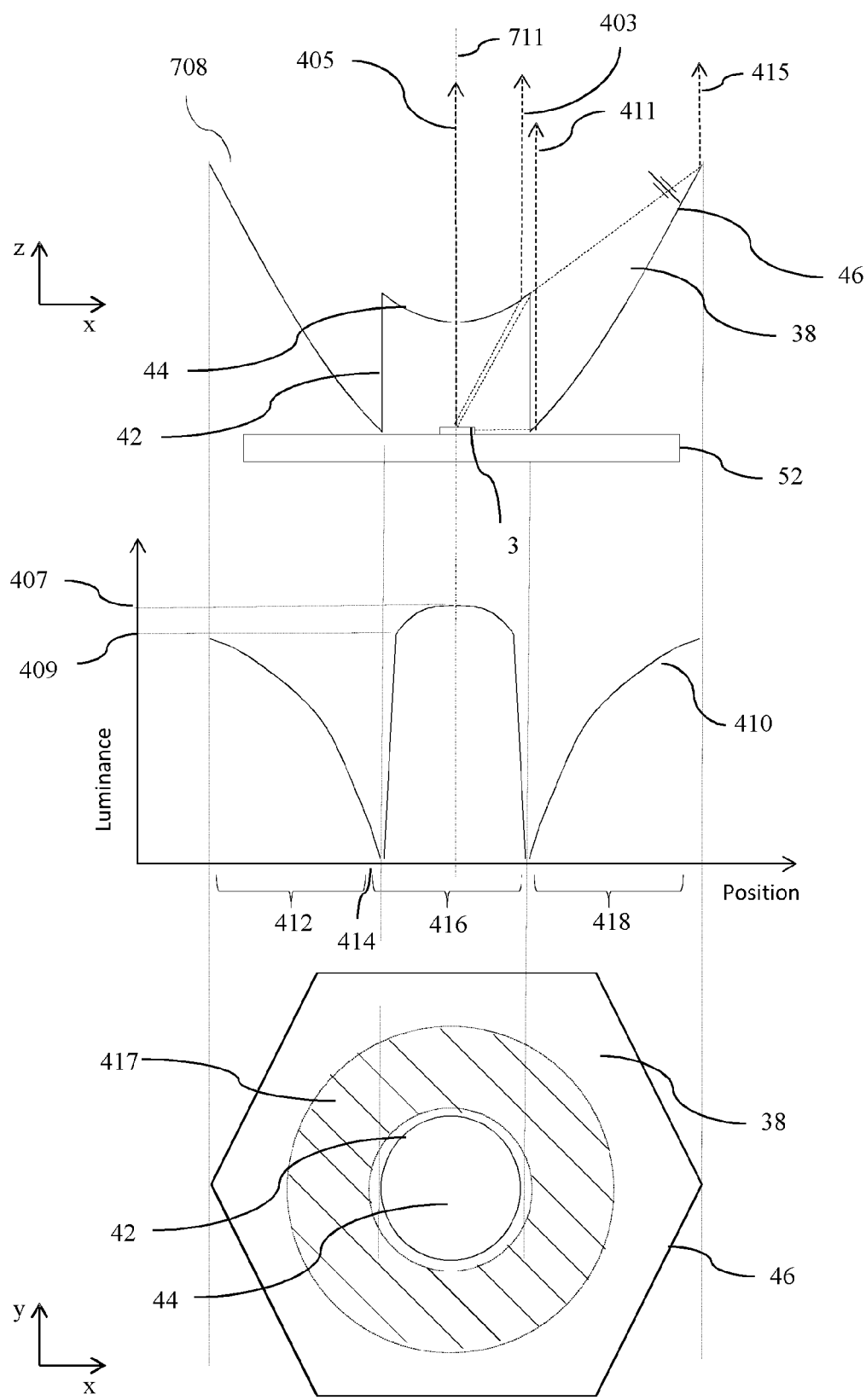
FIG. 11A is a schematic diagram illustrating (top) a side view of light rays from a micro-LED through a catadioptric optical element (middle) a graph of the spatial light output distribution across the output of the catadioptric optical element for on-axis illumination and (bottom) the appearance of the output of one element of a two dimensional catadioptric optical element array, in accordance with the present disclosure.

FIG. 11A is a schematic diagram illustrating (top) a side view of light rays from a LED through a catadioptric optical element (middle) a graph of the spatial light output distribution 410 across the output of the catadioptric optical element for on-axis illumination and (bottom) the appearance of the output of one element of a two dimensional plurality of catadioptric optical elements 38 for an observer in the far field.

Ray 405 is thus emitted with the maximum luminous intensity and a peak luminance 407 is provided for rays 405. Across the refractive surface 44, there is a roll-off of luminance so that at the edges, luminance 407 is provided. Thus the luminance in region 412 is greater than the luminance in region 414 but lower than the luminance in region 416. For on axis illumination, the luminance in region 418 is substantially the same as the luminance in region 412.

By way of comparison, ray 411 is provided from light that is emitted orthogonal to the normal direction and thus the light rays in the normal direction after reflection from the surface 46 have very low luminance. The luminance of rays between 411 and 415 that exit the catadioptric optical element 38 may have a profile 410 so that rays 415 have substantially the same luminance of rays 403.

Profile 410 represents a measure of the spatial uniformity of the output of the catadioptric optical elements for a given viewing angle of an observer 125.

The appearance of the light output is thus schematically illustrated as a bright central region associated with refractive surface 44 and a dark annulus 417 that starts at the wall 42 location and spreads towards the edge of the output surface.

FIG. 11A illustrates the spatial light output distribution 410 across the end 708 of a catadioptric optical element. The directional light output distribution of the output will now be described further.

In the present disclosure the uniformity of spatial light output distribution is provided by the modulation depth of the profile 410—that is the difference between the maximum and minimum luminance across the profile. Thus an increased uniformity has a reduced modulation depth, with reduced luminance difference across the profile.

The uniformity of the spatial light output distribution may be partially diffused by diffusers including diffuser 309. However, as the directional light output distribution is small compared to conventional wide angle illumination, there may be insufficient output angles in the light cone to provide full compensation for the non-uniformities of the backlight 110. The amount of diffusion may be increased by increasing the thickness of gaps in the illumination apparatus. However, such increase in gap thickness may undesirably increase display thickness.

It is a purpose of the present disclosure to illustrate embodiments that provide increased uniformity of directional backlights incorporating pluralities of micro-LEDs 3 and corresponding pluralities of catadioptric optical elements 38.

Figure 11B:
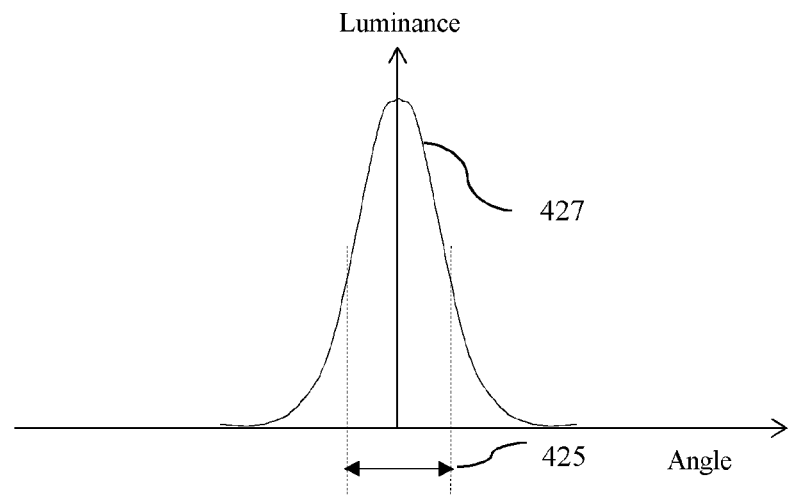
FIG. 11B is a schematic diagram illustrating a graph of a directional light output distribution from a catadioptric optical element and micro-LED, in accordance with the present disclosure.

FIG. 11B is a schematic diagram illustrating a graph of luminance against output angle for the catadioptric optical element 38 and micro-LED 3 of FIG. 11A. Directional light output distribution 427 may have an angular profile with a full width half maximum FWHM width 425. The directional light output distribution 427 may be substantially the same across the width of the end 708 of the catadioptric optical element, or may vary with location depending on aberrations of the respective optical surfaces 44, 42, 46 for a given spatial location. By way of comparison the spatial light output distribution 410 may be provided at a given angle of output, for example on-axis as illustrated by distribution 410 in FIG. 11A.

Thus each of the micro-LEDs 3 of the plurality of micro-LEDs may be aligned with only a respective one of the catadioptric optical elements 38 of the plurality of catadioptric optical elements; the alignment being such that some of the light output from each of the micro-LEDs 3 exits its respective catadioptric optical element 38 with a first light output distribution. The first output light distribution may comprise a spatial light output distribution 410 for a given direction of output and an angular light output distribution 427 for a given location at the output end of the catadioptric optical element 38.

A known luminaire for environmental lighting may comprise a small number (for example less than 10) macroscopic square LEDs that each have a semiconductor chip width of 1 mm and are attached to a lead frame with solder electrodes before packaging in plastic. The packaged LEDs are then provided on a support substrate by a pick-and-place fabrication method.

A rotationally symmetric catadioptric optical element may be provided in alignment with each macroscopic LED. The distance 714 of the second end 708 of the catadioptric optical element may be 20 mm, and the thickness 713 may be 10 mm. An optional hemispherical refractive optical element may be provided on the macroscopic LED.

The directional light output distribution may have a rotationally symmetric full width half maximum (FWHM) 425 of typically 6 degrees.

A known display backlight may use large-area edge-input light-guides and optical films such as BEF from 3M Corporation and rear reflectors. Such backlights may typically have a thickness that is less than 8 mm, and more typically around 3 mm. The directional light output distribution may have a typical rotationally symmetric full width half maximum 425 of 50 degrees.

Illustrative examples will now be described to provide examples of dimensions for illumination and display embodiments of the present disclosure.

By way of comparison, the present embodiments for environmental illumination, display backlighting and direct display may comprise micro-LEDs 3.

The inventors have considered that it might be possible to achieve superior performance for directional lighting systems with arrays of microscopic scale elements as will be described. In this specification such microscopic elements are referred to as micro-LEDs. The inventors have appreciated that high precision array fabrication process methods suitable for the light-emitting element arrays and aligned optical element arrays are required to achieve such microscopic directional lighting and illumination apparatus.

Micro-LEDs 3 may be provided by array extraction methods and may be extracted in parallel from a monolithic wafer as described below. The micro-LEDs 3 of the plurality of micro-LEDs may be from a monolithic wafer arranged in an array with their original monolithic wafer positions and orientations relative to each other preserved; and wherein in at least one direction, for at least one pair of the plurality of micro-LEDs 3 in the at least one direction, for each respective pair there was at least one respective micro-LED 3 in the monolithic wafer that was positioned in the monolithic wafer between the pair of micro-LEDs in the at least one direction and that is not positioned between them in the array of micro-LEDs.

The micro-LEDs 3 of the present embodiments may have a width or diameter of less than 300 microns, preferably less than 200 microns, and more preferably less than 100 microns. As will be described herein large area array extraction methods may be provided, improving placement accuracy, reducing overall placement time, and reducing cost and complexity of fabrication in comparison to pick-and-place methods.

In display applications a FWHM angle 425 of 12 to 24 degrees may be desirable for the directional light output distribution 427 from the display apparatus to provide a comfortable viewing freedom while achieving privacy, power savings or reduced stray light operation.

A micro-LED 3 of width 300 microns and aligned catadioptric optical element 38 may achieve a 12 degrees FWHM width 425 using a distance 714 of 3 mm for example and may have thickness 713 of 1.5 mm. Similarly, a micro-LED of width 100 microns and aligned catadioptric optical element 38 may achieve a 24 degrees FWHM width 425 using a catadioptric optical element distance 714 of 0.5 mm for example and may have a thickness 713 of 0.25 mm.

Thus in display backlighting applications the distance 714 between the first and second outer surfaces 46a, 46b at the second end 708 of the catadioptric optical element may be less than 3 mm, preferably less than 1.5 mm and more preferably less than 0.75 mm. Advantageously display Moiré and mura artefacts may be minimised. The thickness t1, t2, or t3, t4 of substrates 52, 47 will be describe with reference to FIGS. 57A-B below and may for example be between 100 and 500 microns.

Advantageously very thin backlights 110 for illumination of spatial light modulators 112 may be achieved. Further the thickness of the illumination apparatus may be less than the thickness of conventional waveguide type backlights.

In another illustrative embodiment the pixels 303 of a spatial light modulator 112 may be arranged on a pitch of 25 microns×75 microns and the distance 714 may be 0.3 mm, with a micro-LED width or diameter of 60 microns.

Advantageously display Moiré and mura artefacts may be minimised. Further the thickness of the illumination apparatus may be less than the thickness of conventional waveguide type backlights.

In direct display embodiments in which the micro-LEDs are driven with image pixel data, the pitch of the catadioptric optical elements may determine the resolution of the display in at least one direction. The distance 714 between the first and second outer surfaces 46a, 46b at the second end 708 of the catadioptric optical element may be less than 0.3 mm, preferably less than 0.15 mm and more preferably less than 0.1 mm. The micro-LEDs 3 of the present direct display embodiments may have a width or diameter of less than 60 microns, preferably less than 30 microns, and more preferably less than 20 microns.

In environmental illumination applications a FWHM angle 425 of 6 degrees may be desirable for the directional light output distribution 427 for a narrow beam angle. The distance 714 between the first and second outer surfaces 46a, 46b at the second end 708 of the catadioptric optical element may be less than 6 mm.

Figure 12:
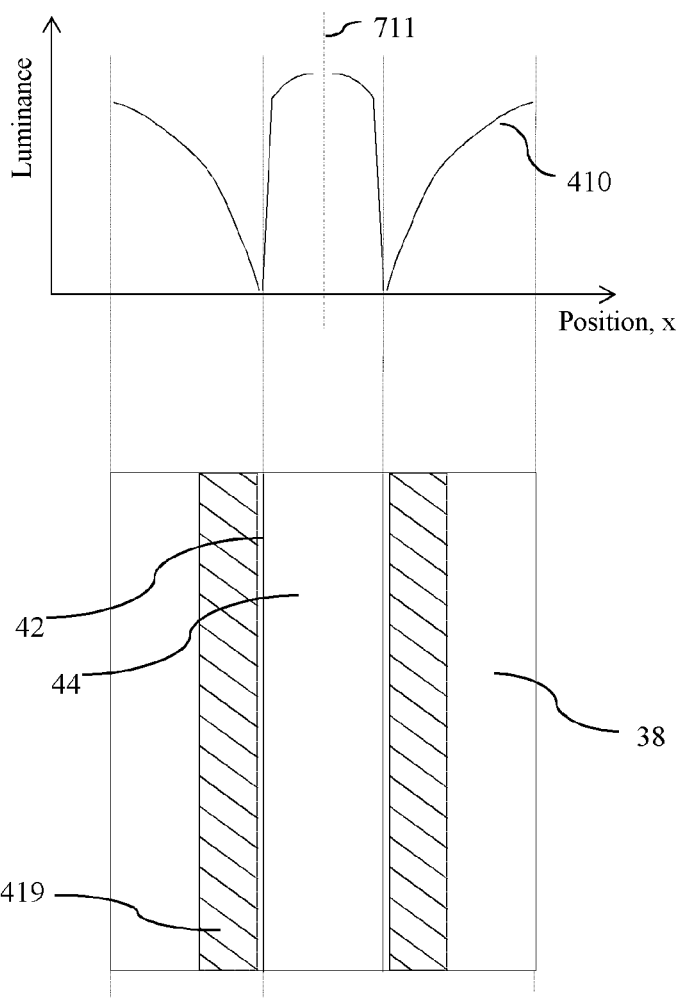
FIG. 12 is a schematic diagram illustrating (top) a graph of the spatial light output distribution across the output of the catadioptric optical element of FIG. 12 and (bottom) the appearance of the output of one element of a one dimensional catadioptric optical element array, in accordance with the present disclosure.

FIG. 12 is a schematic diagram illustrating (top) a graph of the luminance output luminance profile 410 of a catadioptric optical element 38 and (bottom) the appearance of the output of one element of an array of one dimensional catadioptric optical elements 38.

Thus dark stripes 419 may be provided that start at the wall 42 location and spread towards the edge of the output surface of the catadioptric optical element 38.

Figure 13A:
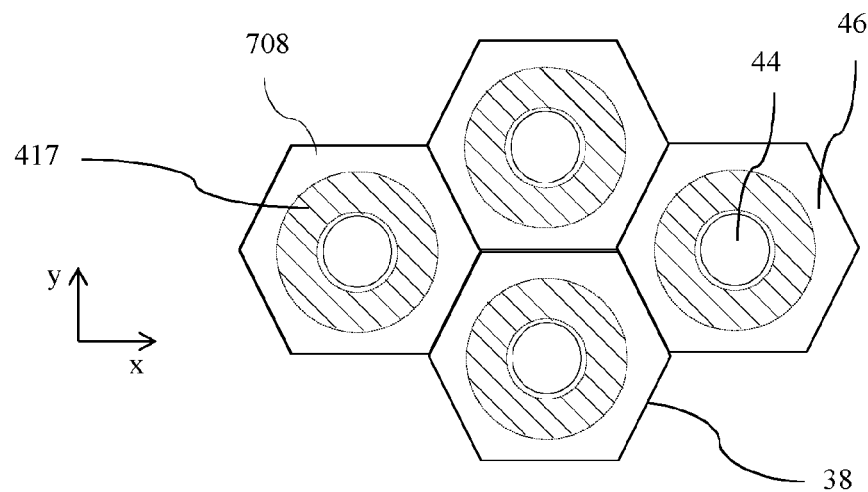
FIG. 13A is a schematic diagram illustrating a top view of the appearance of a two dimensional plurality of catadioptric optical elements, in accordance with the present disclosure.
Figure 13B:
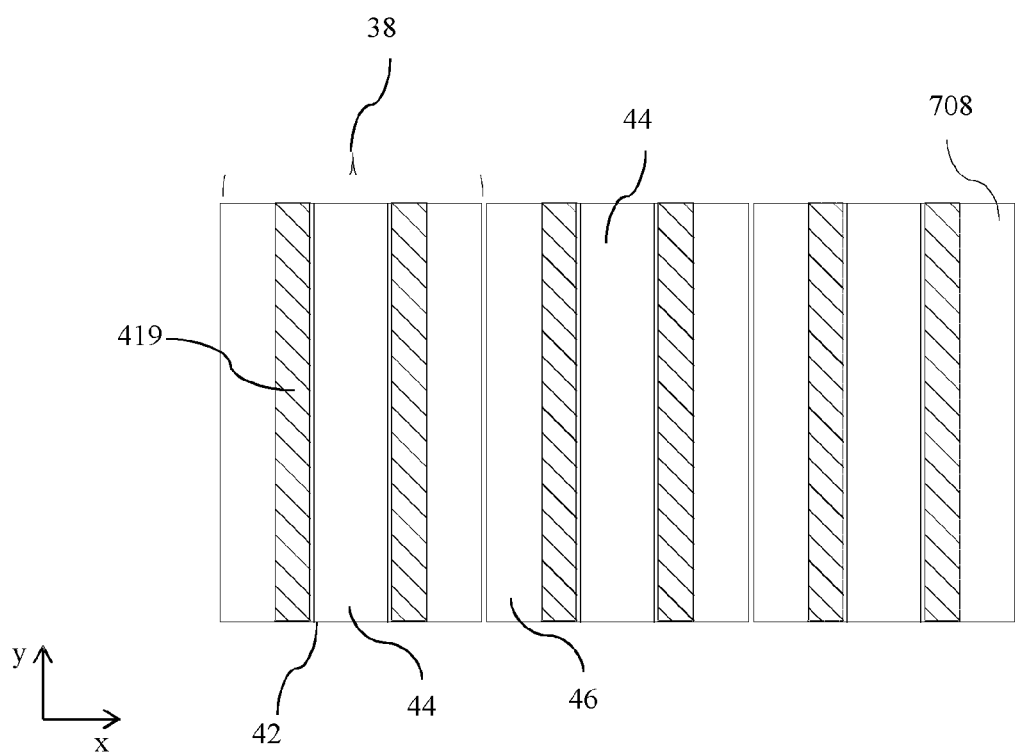
FIG. 13B is a schematic diagram illustrating a top view of the appearance of a one dimensional plurality of catadioptric optical elements, in accordance with the present disclosure.

FIG. 13A is a schematic diagram illustrating a top view of the appearance of a two dimensional plurality of catadioptric optical elements and FIG. 13B is a schematic diagram illustrating a top view of the appearance of a one dimensional plurality of catadioptric optical elements 38.

Such annulus 417 disadvantageously provides a luminance structure that may beat with the pixels 303 of the spatial light modulator 112. Such beating may undesirably provide visible luminance structure, Moiré and mura defects in images.

Figure 14A:
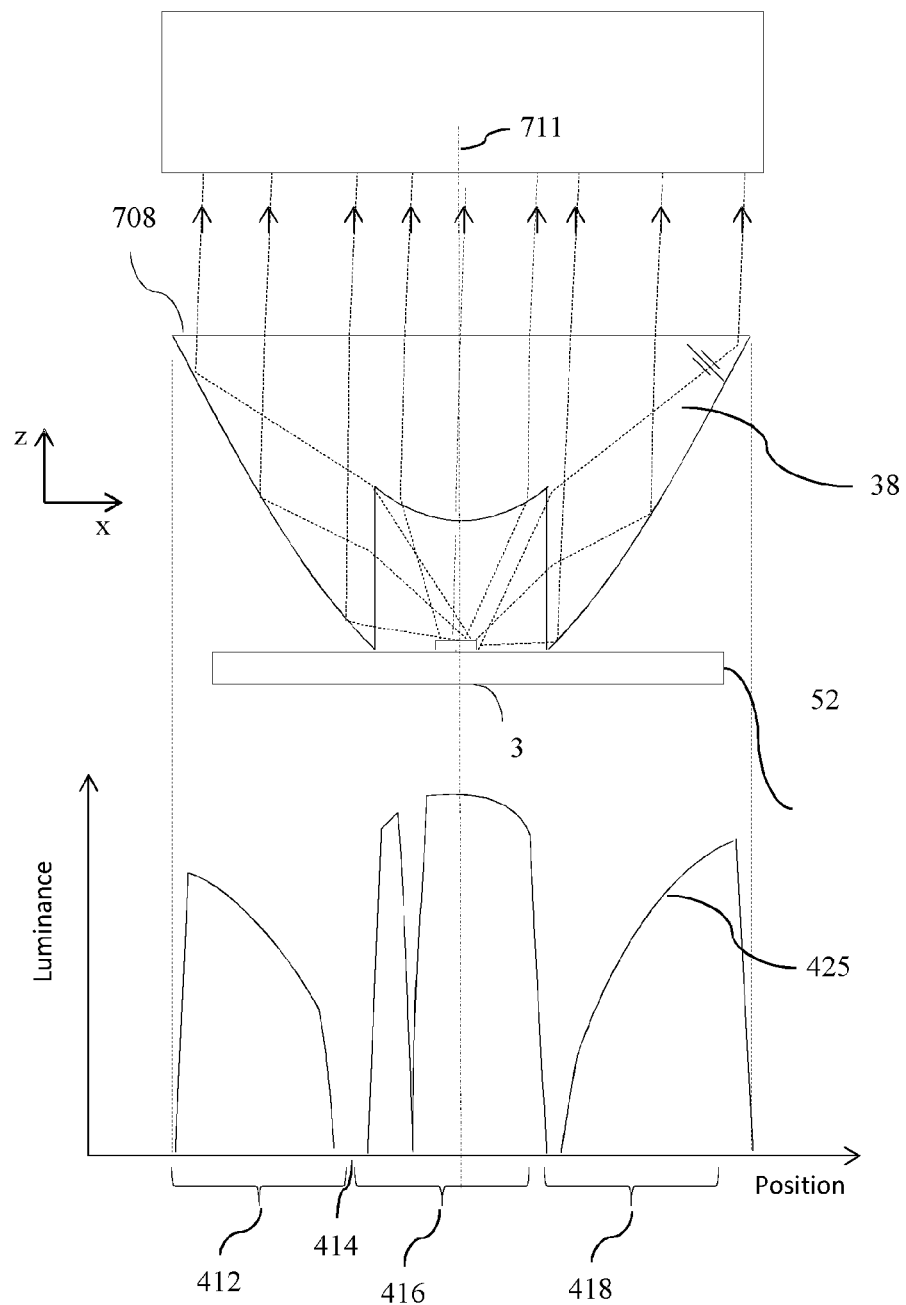
FIG. 14A is a schematic diagram illustrating (top) a side view of light rays from a micro-LED through a catadioptric optical element (bottom) a graph of the spatial light output distribution across the output of the catadioptric optical element for off-axis illumination, in accordance with the present disclosure.

FIG. 14A is a schematic diagram illustrating (top) a side view of light rays from a LED through a catadioptric optical element (bottom) a graph of the spatial light output distribution across the output of the catadioptric optical element 38 for off-axis illumination at a viewing angle of 2.5 degrees. Thus the profile 425 of the spatial light output distribution is of similar appearance to the profile 410 for on-axis illumination, providing a central annulus that may become asymmetric with increasing viewing angle. The similarity of structure with varying viewing angles means that angular diffusers such as diffuser 311 may not provide correction of spatial uniformity as will be described below.

Figure 14B:
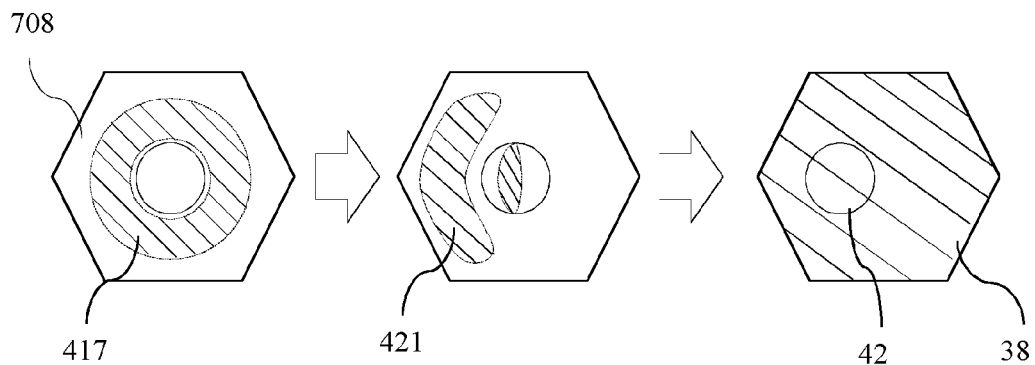
FIG. 14B is a schematic diagram illustrating a top view of the change in appearance of the output of a two dimensional plurality of catadioptric optical elements with viewing angle, in accordance with the present disclosure.

FIG. 14B is a schematic diagram illustrating a top view of the change in appearance of the output of a two dimensional catadioptric optical element 38 with viewing angle. At such angles, non-uniform asymmetric darker regions 421 may be provided.

It would be desirable to provide an increased spatial uniformity of a directional backlight 110 for normal output directions, and also for off-axis illumination positions corresponding to the lateral roll-off of the directional light output distribution 120.

Figure 15A:
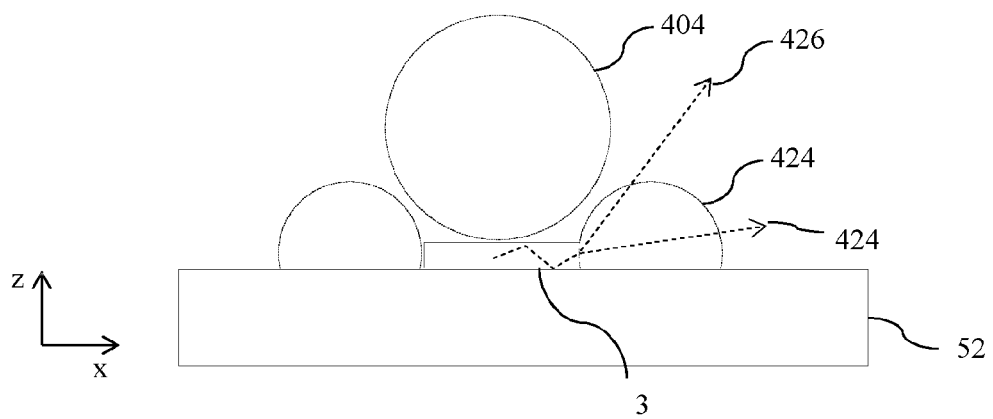
FIG. 15A is a schematic diagram illustrating a side view of the directional light output distribution from a micro-LED further comprising increased output from edges of the micro-LED, in accordance with the present disclosure.

FIG. 15A is a schematic diagram illustrating a side view of the directional light output distribution from a LED such as an LED further comprising increased output from edges of the LED. Luminous intensity locus 404 may be provided for light emitted from the upper surface of the micro-LED 3 as described in FIG. 10.

Micro-LEDs 3 comprising high refractive index materials such as gallium nitride, and particularly microLEDs with dimensions that may be less than 100 microns may provide part of the optical output from the edge of the LED. Such light may have a luminous intensity locus 424, with light reflection from substrate 52 contributing to the output. Thus the luminous intensity of light rays 424 may be increased in comparison to the luminous intensity of rays 411 in FIG. 11A.

Figure 15B:
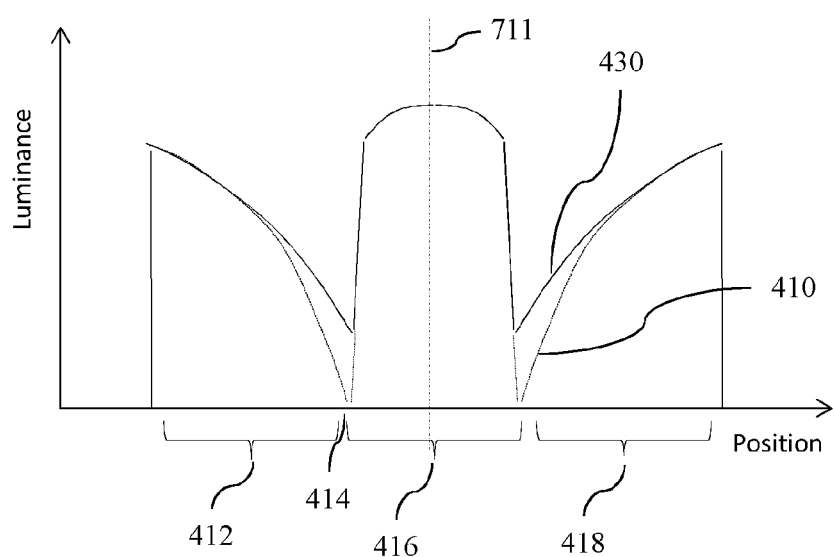
FIG. 15B is a schematic graph of the spatial light output distribution across the output of a catadioptric optical element for on-axis illumination comprising a micro-LED with the output directional light output distribution as illustrated in FIG. 15A, in accordance with the present disclosure.

FIG. 15B is a schematic graph of the spatial light output distribution across the output of a catadioptric optical element for on-axis illumination comprising a LED with the output directional light output distribution as illustrated in FIG. 15A. Thus profile 430 may be provided by additional light rays 424.

Advantageously the spatial uniformity of the output of the catadioptric optical element 38 is improved. Moiré and visibility of optical structure of the backlight may be improved.

As illustrate in FIG. 15B, the highest luminance of output is for light that is output in substantially a normal direction from the micro-LED 3.

It would be desirable to reduce light emission in the normal direction, to achieve increased lateral spatial uniformity for light that is incident on the refractive surface 44. Such an apparatus will now be described.

Figure 16A:
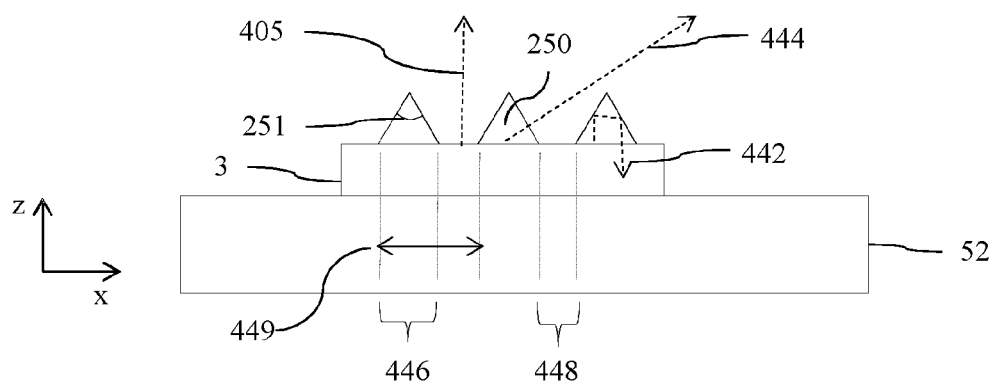
FIG. 16A is a schematic diagram illustrating a side view of a micro-LED further comprising internally reflecting prisms, in accordance with the present disclosure.

FIG. 16A is a schematic diagram illustrating a side view of a micro-LED 3 further comprising reflective members comprising internally reflecting prism elements 250. Micro-LED 3 may be provided with prism elements 250 arranged on its top surface. Prism elements 250 may for example comprise a moulded polymer material such as a silicone material for example; or may be formed directly in the surface of the LED. Thus at least one transparent prism 250 is provided between at least one micro-LED of the plurality of micro-LEDs and the transparent inner surface 42, 44 of the catadioptric optical elements 38.

High luminous intensity light rays 405 emitted in the normal direction in gap regions 448 between prism elements 250 may be directed towards the refractive surface 44 with substantially Lambertian directional light output distribution.

High luminous intensity light rays 442 that are in the region 446 under the prism element 250 may be reflected by internal reflection back into the micro-LED 3 where they may be scattered or may be reflected by reflector arranged on backplane substrate (not shown). The internal angles 251 of the prism elements may be arranged to reflect by internal reflection light with desirable cone angles to increase the luminous intensity of recirculated light rays 444 that are incident on the walls 42.

The spacing 449 of the prism elements 250 may be arranged to provide a balance between Lambertian and non-Lambertian output angular characteristics of the micro-LED 3.

Figure 16B:
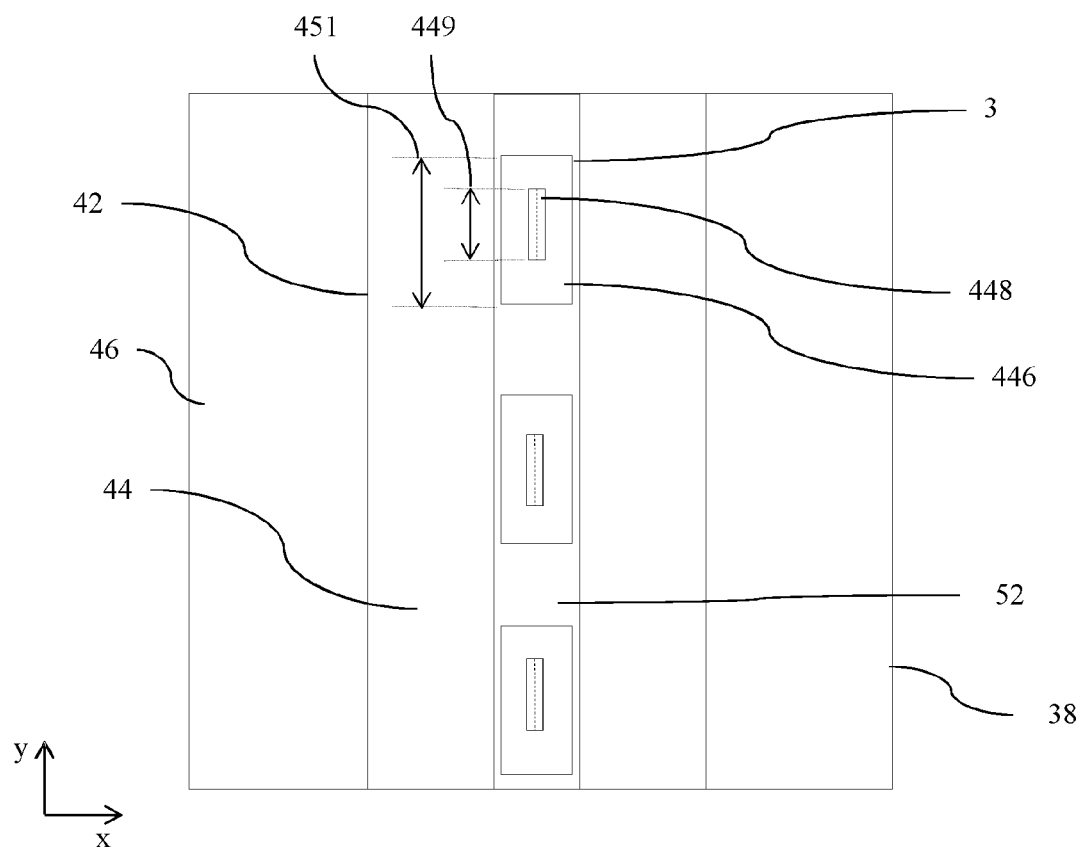
FIG. 16B is a schematic diagram illustrating in top view the arrangement of a plurality of micro-LEDs, each comprising internally reflecting prisms to a one dimensional catadioptric optical element, in accordance with the present disclosure.

FIG. 16B is a schematic diagram illustrating in top view an arrangement of a plurality of micro-LEDs 3, each comprising internally reflecting prism elements 250 and aligned to a one dimensional catadioptric optical element 38. The prism elements 250 may be extended in a direction parallel to the elongate catadioptric optical elements 38. The prism elements 250 may have size 449 in comparison to the height 451 of the micro-LED that is arranged to achieve desired control of luminous intensity locus 450.

Figure 16C:
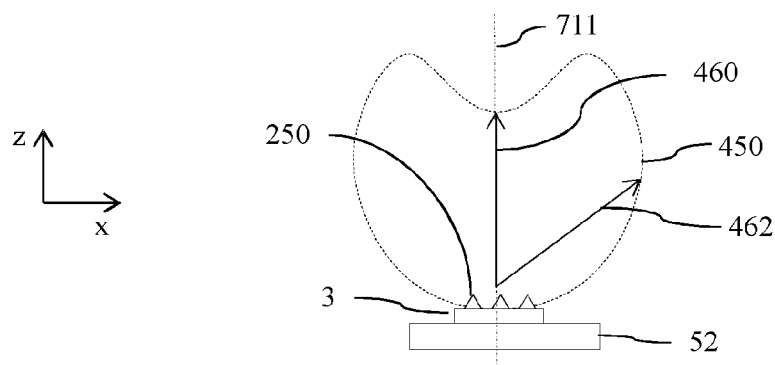
FIG. 16C is a schematic graph illustrating the directional light output distribution of light from the arrangement of FIG. 16A, in accordance with the present disclosure.

FIG. 16C is a schematic graph illustrating a directional light output distribution of light from the arrangement of FIG. 16A. Thus luminous intensity locus 450 may be provided such that light rays 460 have reduced luminous intensity when integrated across the area of the micro-LED 3 in comparison to the output of FIG. 10. By way of example the luminous intensity of rays 460 may be similar to the luminous intensity of rays 462 at an angle of 45 degrees to the normal.

Figure 16D:
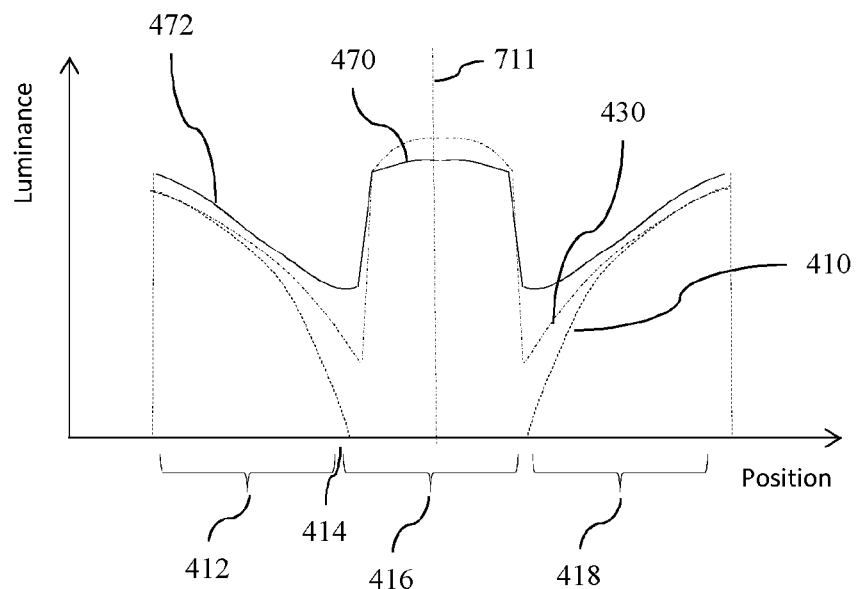
FIG. 16D is a schematic graph of the spatial light output distribution across the output of a catadioptric optical element for on-axis illumination comprising a micro-LED with the output directional light output distribution as illustrated in FIG. 16C, in accordance with the present disclosure.

FIG. 16D is a schematic graph of the spatial light output distribution profile 470 across the output of a catadioptric optical element 38 for on-axis illumination comprising a micro-LED 3 with the output directional light output distribution as illustrated in FIG. 16C.

Profile 470 has reduced luminance in the region of the refractive surface 44 near the optical axis 711. The luminance may further be increased in the regions 412 associated with reflections from the side surfaces 46. In comparison to the profiles 410, 430 described elsewhere herein, the luminance in the region 414 near the side walls 42 is further increased.

Advantageously lateral uniformity of the output of the catadioptric optical elements 38 is increased. Moiré and mura in display backlights is reduced and improved display uniformity obtained.

Figure 16E:
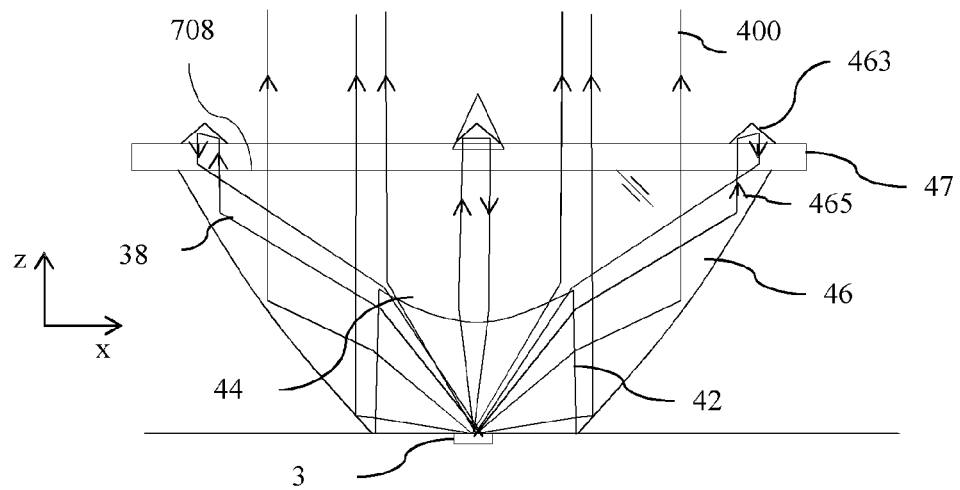
FIG. 16E is a schematic diagram illustrating a side view of reflections from reflective prism optical elements arranged on an output surface of a catadioptric optical element, in accordance with the present disclosure.
Figure 16F:
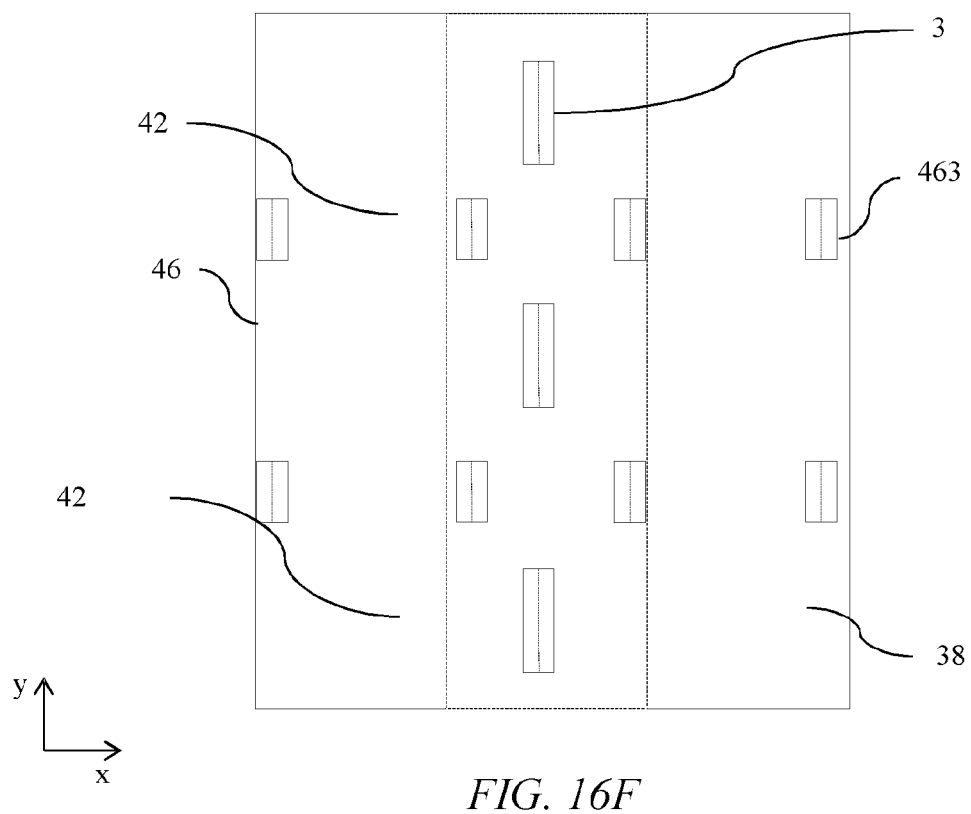
FIG. 16F is a schematic diagram illustrating a top view of an arrangement of reflective prism optical elements arranged on an output surface of a catadioptric optical element, in accordance with the present disclosure.

FIG. 16E is a schematic diagram illustrating a side view of reflections from reflective members comprising prism optical elements 463 arranged on an output surface of a catadioptric optical element 38 and FIG. 16F is a schematic diagram illustrating a top view of an arrangement of reflective members comprising reflective prism optical elements 463 arranged on transparent substrate 47 or alternatively arranged on the second surface 708 of the catadioptric optical element 38. Thus the reflective member comprises at least one prism microstructure 463. The at least one prism microstructure is arranged to reflect light by means of total internal reflection.

Optical elements 463 may be arranged to reflect incident light rays 465 that are substantially on-axis from the catadioptric optical element 38 and micro-LED 3. Light returning to the region of the micro-LED 3 may be recycled by scattering or reflection.

As illustrated in FIG. 16F the reflective member comprising prism optical elements 463 may be spatially arranged to provide control of uniformity across the lateral width of the catadioptric optical element 38 when integrated in the vertical direction, which may be achieved by an asymmetric diffuser 311 with greater diffusion in the orthogonal direction in comparison to the lateral direction.

Advantageously the output spatial uniformity may be modified and unused light recycled. The scale of the reflective prism optical elements 463 may be larger than for elements 250 that are arranged directly on the micro-LEDs 3 as illustrated above.

It would be desirable to further improve the spatial uniformity across the regions of the output of the catadioptric that are illuminated by reflections from the surfaces 46 of the catadioptric optical elements.

The propagation of light rays that are reflected by reflective member comprising a reflective polariser 310 to the catadioptric optical elements 38 will now be discussed.

Figure 17A:
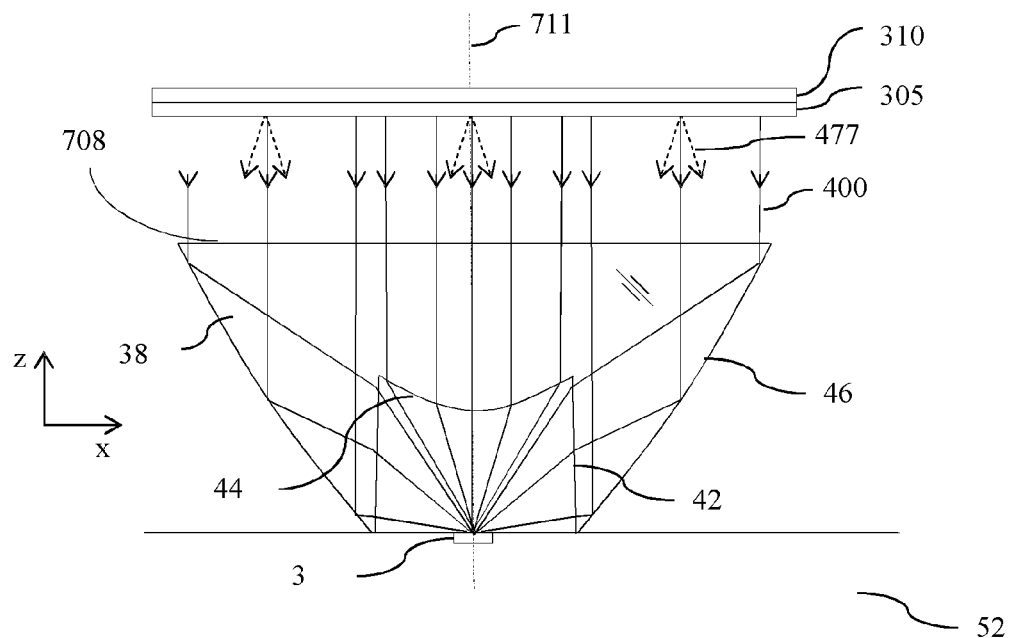
FIG. 17A is a schematic diagram illustrating a side view of an on-axis raytrace of light rays after reflection by a reflective polariser, in accordance with the present disclosure.

FIG. 17A is a schematic diagram illustrating a side view of an on-axis raytrace of light rays after reflection by a reflective polariser. As illustrated in FIG. 9, on-axis rays may be directed back to the centre of the micro-LED 3. Such light rays may be reflected or scattered to provide recirculation of reflected light, increasing display efficiency.

Thus the illumination apparatus may comprise one or more reflective members such as reflective polariser 310. The one or more reflective members may be arranged relative to the first light output distribution such as spatial light output distribution 410 in FIG. 11A and directional light output distribution 427 in FIG. 11B such that some of the light rays 415 that exit the respective catadioptric optical element 38 are reflected by the one or more reflective members such as reflective polariser 310 back into the catadioptric optical element 38.

Further light rays 477 may be provided by scatter and diffusion, for example from rear diffuser 311 (not shown), increasing the angles of light reflected back towards the backplane 52.

Figure 17B:
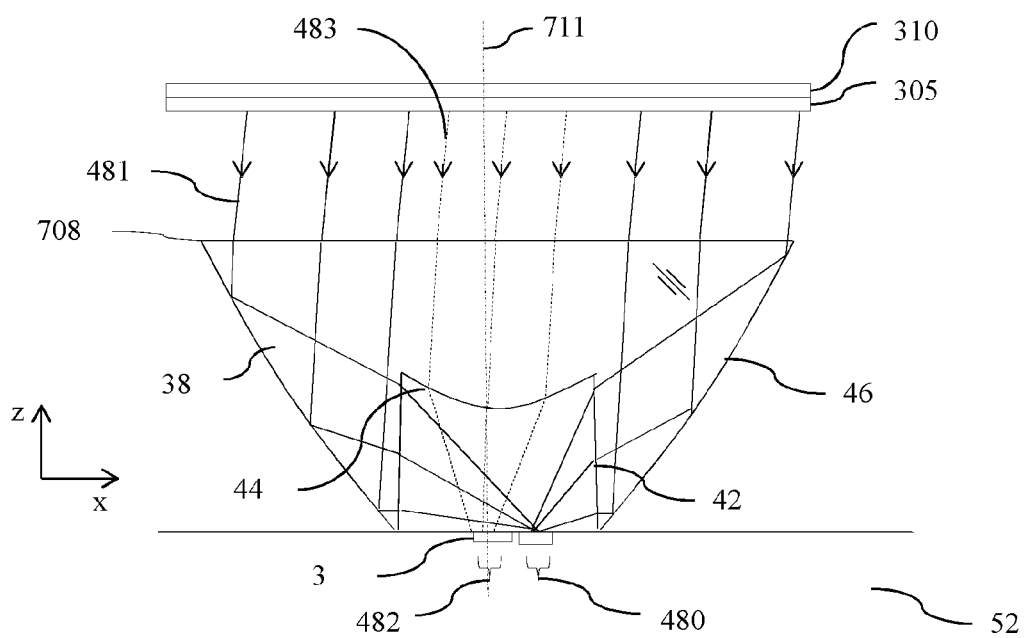
FIG. 17B is a schematic diagram illustrating a side view of an off-axis raytrace of light rays from an off-axis direction after reflection by a reflective polariser towards the plane of a micro-LED, in accordance with the present disclosure.

FIG. 17B is a schematic diagram illustrating a side view of an off-axis raytrace of light rays from an off-axis direction after reflection by a reflective polariser towards the plane of a LED. Light rays 483 that are incident on the refractive surface 44 are imaged to a region 482 near to the micro-LED 3, whereas light rays 481 that are incident on surface 46 are imaged to a different region comprising light recycle systems that are planar mirrors 480.

Light ray propagation for light rays 481 that are incident in light recycle systems comprising planar mirrors 480 will now be discussed.

Figure 18:
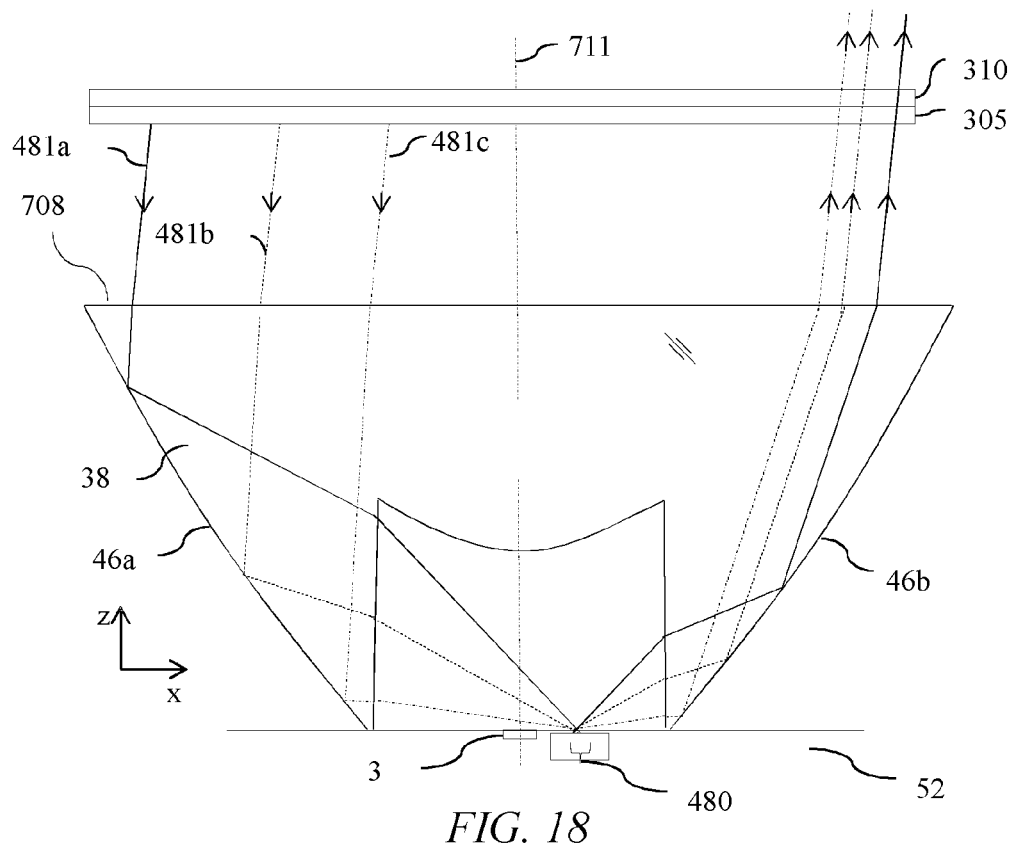
FIG. 18 is a schematic diagram illustrating a side view of a raytrace of light rays from an off-axis direction after reflection by a reflective polariser towards the plane of a micro-LED and reflection from a planar reflective surface, in accordance with the present disclosure.

FIG. 18 is a schematic diagram illustrating a side view of a raytrace of light rays 481a, 481b, 481c from an off-axis direction after reflection by a reflective member comprising a reflective polariser 310 and first surface 46a towards the plane of a micro-LED 3 to light recycle systems comprising planar mirrors 480. After reflection from a planar reflective surface arranged on backplane 52, rays 481a, 481b, 481c may be reflected by second surface 46b and directed into a similar viewing direction as the input direction.

As described with reference to FIGS. 7 and 8, such light rays may be usefully recycled by manipulation of polarisation state, and contribute to backlight output.

Thus light ray bundle 481a, 481b, 481c may have a different output location and luminance in comparison to the corresponding input location and luminance. Such change may provide increased spatial uniformity. However, note that the higher luminance ray 481a (being the outer ray) is also directed to the outer side of the surface 46b so that full correction of spatial uniformity in region 418 of FIG. 16D is not achieved.

It would be desirable to provide increased uniformity from recycled light rays 481.

Figure 19:
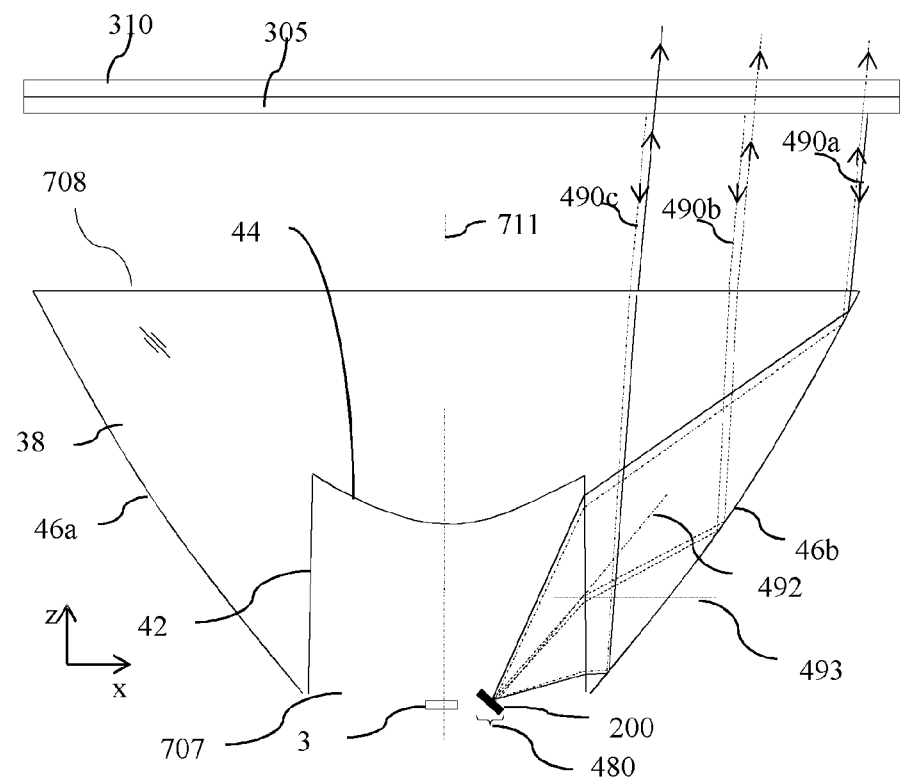
FIG. 19 is a schematic diagram illustrating a side view of a raytrace of light rays from an off-axis direction after reflection by a reflective polariser towards the plane of a micro-LED and reflection from a near side light deflecting surface, in accordance with the present disclosure.

FIG. 19 is a schematic diagram illustrating a side view of a raytrace of light rays 490a, 490b, 490c from an off-axis direction after reflection by a reflective member comprising a reflective polariser 310 towards the first end 707 of a catadioptric optical element 38 with micro-LED 3 and reflection from a light recycle system comprising a near side light deflecting surface 200. Surface 200 may have a normal direction 492 that is directed towards the mid point height 493 of the wall 42.

Light rays 490a that may have higher luminous intensity are incident on the side wall near to the refractive surface 44, and reflected by surface onto the side wall near the substrate 52, thus providing increased luminance in the region 414 of the luminance profile 410 that has low luminance. Similarly, light rays with low luminous intensity 490c are reflected to regions of the luminance profile 410 that has high luminance.

The spatial uniformity may be increased by the reflective member and light recycle system as will be described further below. The arrangement of light deflecting surfaces 200 with micro-LEDs 3 and a catadioptric optical element 38 will now be described.

Figure 20A:
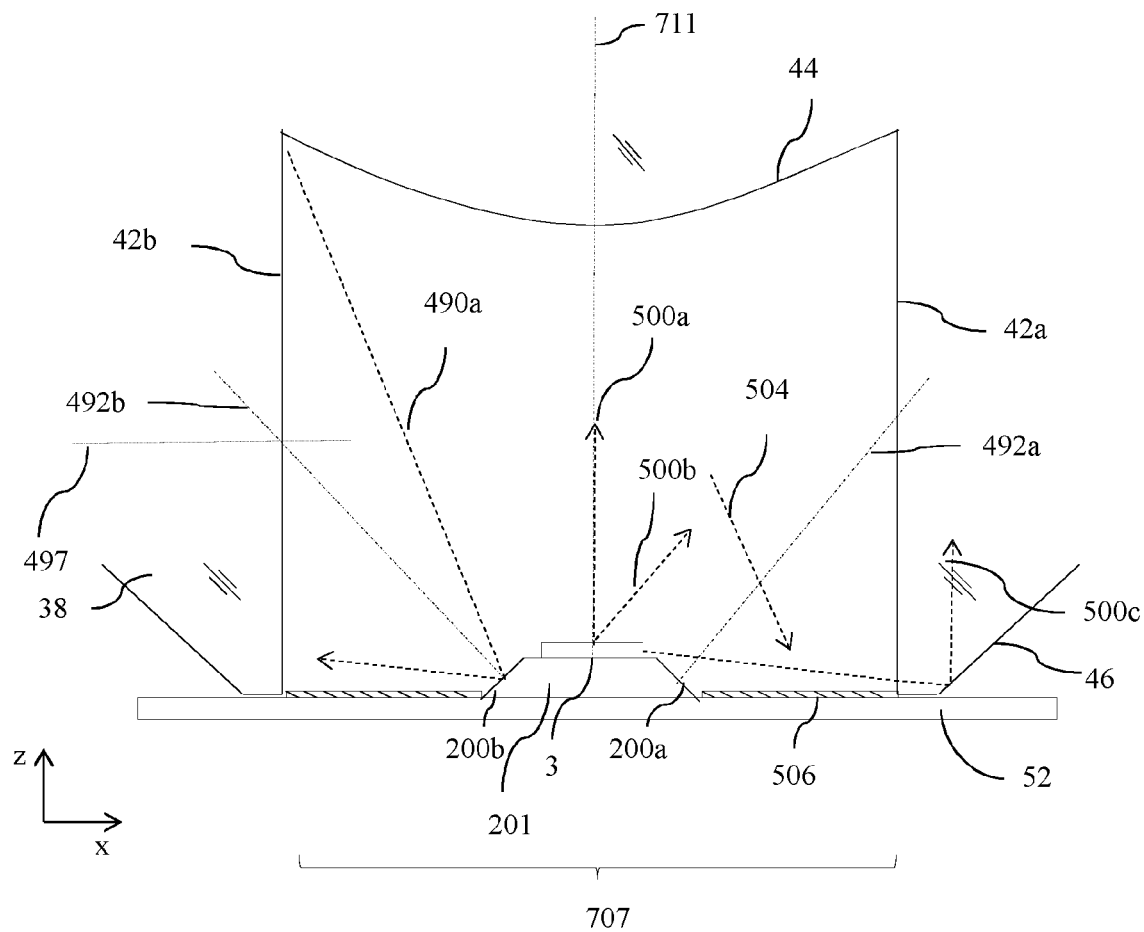
FIG. 20A is a schematic diagram illustrating in side view a detail of the arrangement of micro-LED and near side light deflecting surfaces of FIG. 19, in accordance with the present disclosure.
Figure 20B:
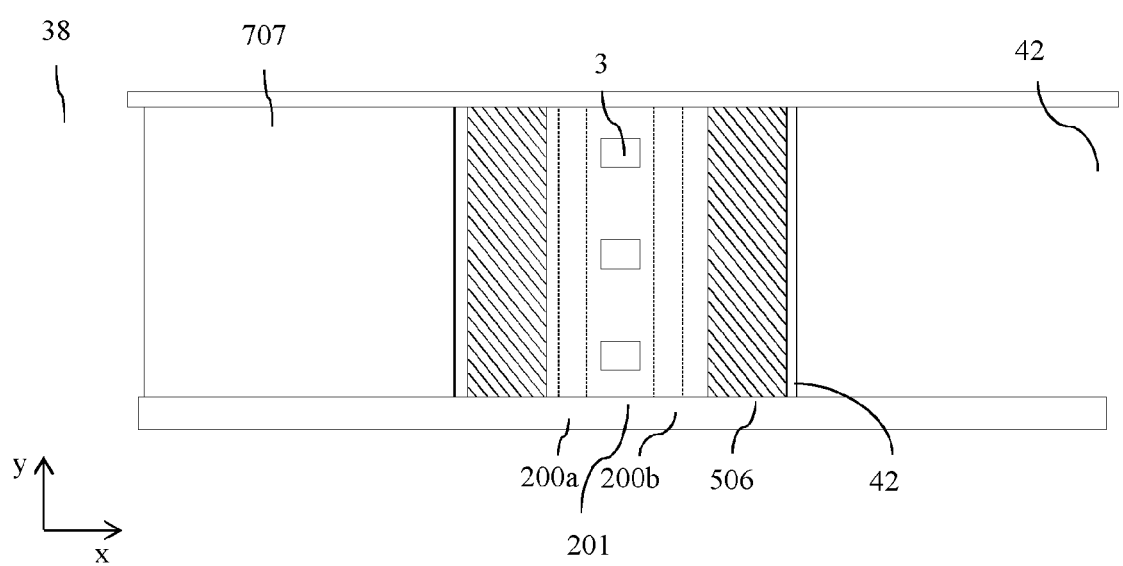
FIG. 20B is a schematic diagram illustrating in top view an arrangement of micro-LED, light deflecting surfaces, light absorbing surfaces and catadioptric optical element, in accordance with the present disclosure.

FIG. 20A is a schematic diagram illustrating in side view a detail of the arrangement of LED and light recycle systems comprising near side light deflecting surfaces 200; FIG. 20B is a schematic diagram illustrating in top view an arrangement of micro-LED 3, near side light deflecting surfaces 200, light recycle systems comprising light absorbing elements 506 and catadioptric optical element 38.

Each light recycle system may comprise at least a first part comprising reflective surface 200a and a second part comprising reflective surface 200b, the first part having a different reflection characteristic compared to the second part. Each of the light recycle systems of the plurality of light recycle systems are aligned in correspondence with a respective catadioptric optical element 38 of the plurality of catadioptric optical elements. Thus the alignment of the light recycle systems and reflective members are arranged to provide illumination in cooperation with the location of the micro-LEDs 3 and catadioptric optical elements 38, the respective locations of each part determining the spatial and angular profiles of the light output distributions.

Thus the first part of the light recycle system provides a different direction of reflection compared to the second part of the light recycle system. The different direction of reflection is provided by the first part of the light recycle system being of a different shape compared to the second part of the light recycle system. In the present embodiment, the different shapes are provided by different tilt angles of the reflective surfaces 200a, 200b with respect to the normal surface direction of the micro-LED 3. The different direction of reflection is provided by the first part of the light recycle system facing a direction (towards wall 42a) that is different compared to a direction faced (towards wall 42b) by the second part of the light recycle system.

Each of the light recycle systems are arranged relative to the catadioptric optical element 38 and the one or more reflective members such as reflective polariser 310. The reflective member may be arranged with a reflective surface with a surface normal that is parallel to the surface normal direction, or optical axis 711 of the catadioptric optical elements. Alternatively, the reflective members may have surfaces that are inclined to the optical axis 711.

The light recycle systems further reflect some of said light 490a, 490b, 490c that has been reflected back into its respective catadioptric optical element 38 to provide recycled light that exits its respective catadioptric optical element 38. The light recycle systems thus comprises at least one tilted reflective surface 200a that is inclined with respect to the optical axis 711 of the catadioptric optical elements 38 of the plurality of catadioptric optical elements. The light recycle systems are arranged in proximity to a micro-LED that is aligned with the respective catadioptric optical element 38. The normals 492a, 492b of the tilted reflective surfaces 200a, 200b are arranged to intersect an inner side wall of the catadioptric optical element 38.

Micro-LED 3 may be arranged on platform 201 that may be formed by moulding a structure on the surface of the backplane substrate 52 for example.

Light rays 500a, 500b, 500c may be provided by the micro-LED 3 and directed to the refractive surface 44 or side walls 42 of the catadioptric optical element. Light rays 490a may be reflected by reflective deflecting surfaces 200.

In a further embodiment, the first part of the light recycle system may further comprise absorbing a plurality of absorbing element 506 that has a different reflectivity compared to the second part 200 of the light recycle system. The second part of the light recycle system may thus comprise a light absorbing material. Light absorbing elements 506 may comprise an absorbing surface, such as a black coated surface. Light absorbing elements 506 may be arranged on the substrate 52 to provide a well defined source width, advantageously achieving a limitation to the maximum angular range of directional light output light distributions as will be illustrated with respect to profile 431 of FIG. 22C.

Advantageously luminance uniformity may be increased, and Moiré and mura may be reduced for illumination of a transmissive spatial light modulator 112.

It would be desirable to further improve the output uniformity by collecting light that is reflected from side 46a in addition to light that is reflected by side 46b.

Figure 21A:
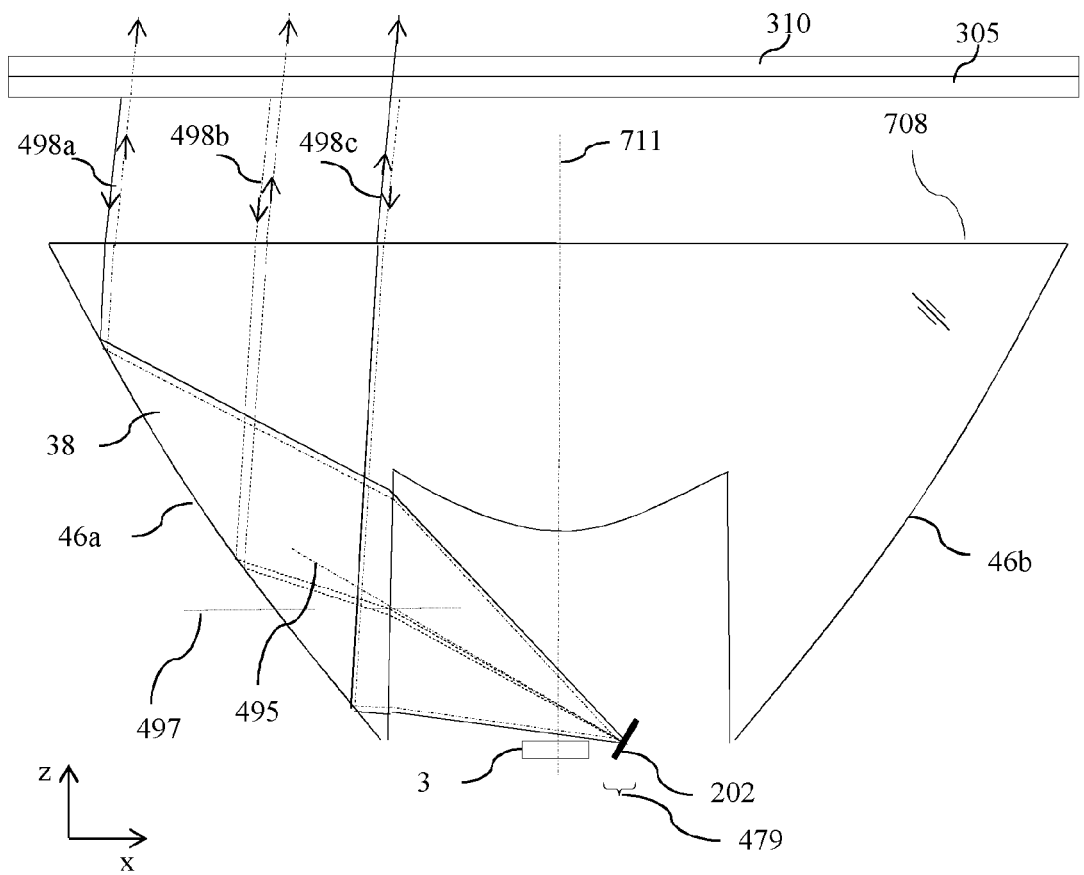
FIG. 21A is a schematic diagram illustrating a side view of a raytrace of light rays from an off-axis direction after reflection by a reflective polariser towards the plane of a micro-LED and reflection from a far side light deflecting surface, in accordance with the present disclosure.

FIG. 21A is a schematic diagram illustrating a side view of a raytrace of light rays from an off-axis direction after reflection by a reflective polariser towards the plane of a LED and reflection from a far side light deflecting surface 202. Light rays from an angle of 2.5 degrees that are reflected from side 46a are imaged to a region 479. Far side reflective light deflecting surface 202 may be arranged in region 202 with normal direction 495 that is directed to the half height 497 of the wall 42. Thus light rays 498a, 498b, 498c may be arranged to provide increased spatial uniformity across the lateral distance 714 of the catadioptric optical element 38, as will be described below.

The intersection of the normal 495 of the tilted reflective surfaces 202 and inner side wall 42 of the catadioptric optical element 38 may be in the central one third region of the extent of the side wall 42 and may bisect the inner side wall 42 of the catadioptric optical element 38.

It would be desirable to provide both near side light deflecting surfaces 200 and far side light deflecting surfaces 202 to achieve improved uniformity for light reflected from both surfaces 46a and 46b.

Figure 21B:
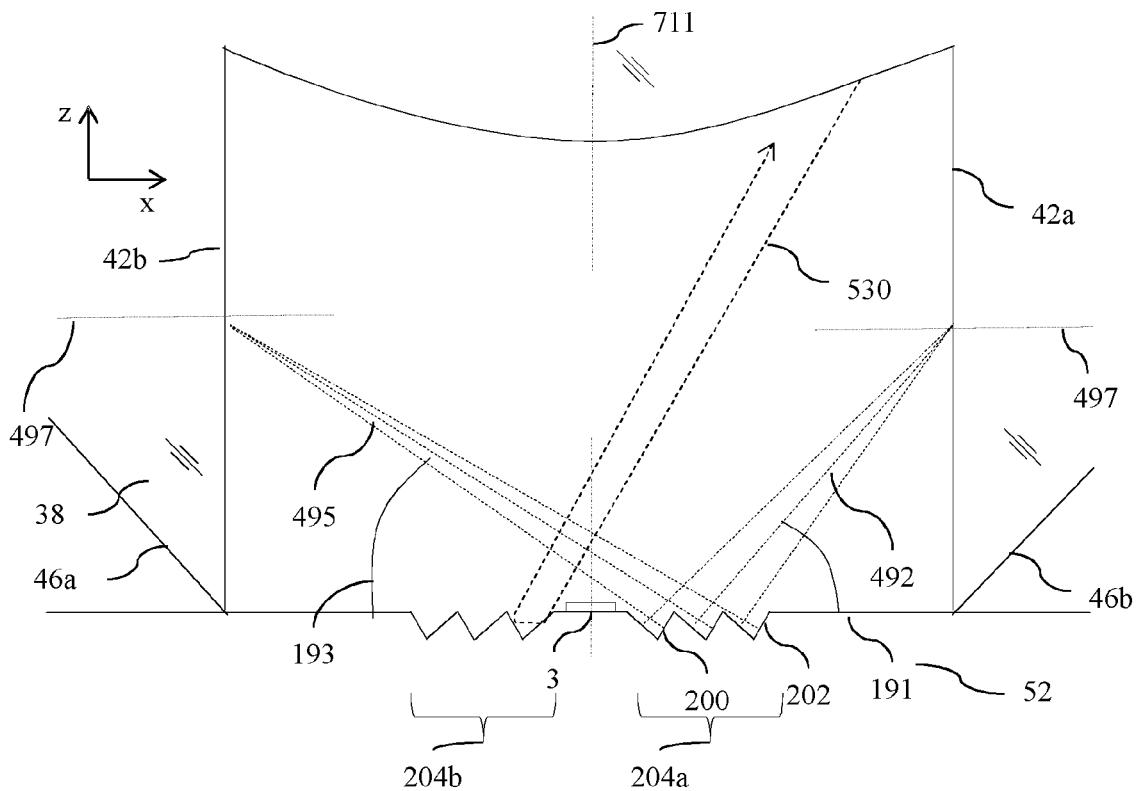
FIG. 21B is a schematic diagram illustrating in side view a detail of the arrangement of micro-LED and near and far side light deflecting surfaces, in accordance with the present disclosure.

FIG. 21B is a schematic diagram illustrating in side view a detail of the arrangement of micro-LED 3 and light recycle systems comprising near and far side light deflecting surfaces 200, 202. Thus region 204 may be provided with a structure that provides an array of interleaved surfaces 200, 202 with alternating surface normals 492, 495 that are directed towards the centre height of respective side walls 42a, 42b. In elongate catadioptric optical elements 3 walls 42a, 42b are separate surfaces, whereas in rotationally symmetric catadioptric optical elements, walls 42a, 42b are cross sectional representations of the same surface 42.

Thus at least two tilted reflective surfaces 200, 202 may have different tilt angles 191, 193 with surface normals 492, 495 that are directed towards respective facing side walls 42a, 42b. The light recycle system comprises a plurality of tilted reflective surfaces 200, 202 arranged in an array 204a. The at least two tilted surfaces 200, 202 are interleaved. At least two of the tilted reflective surfaces 204a, 204b may have different normal directions 492, 495 that are opposing and disposed on either side of the optical axis 711 of the catadioptric optical element 38.

Further light rays 530 from refractive surface 44 may be reflected by the reflective surfaces 200, 202 to provide increased efficiency for head on illumination. Such efficiency increase can be further compensated by means of reflective prism elements 250 as described elsewhere herein.

Advantageously lateral luminance uniformity is increased for both near side and far side rays 490, 498.

Figure 21C:
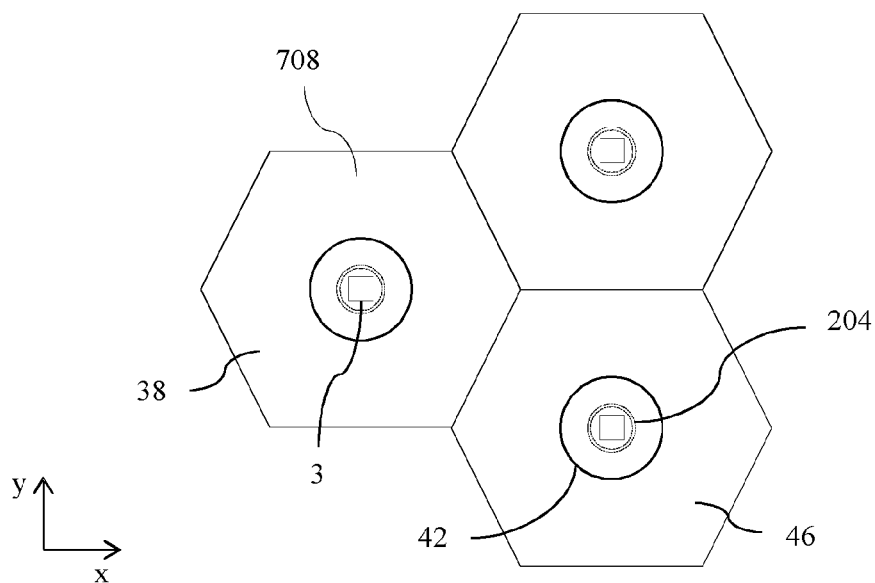
FIG. 21C is a schematic diagram illustrating in top view a two dimensional plurality of catadioptric optical elements aligned with a plurality of micro-LEDs and an array of the light deflecting surfaces of FIG. 21B, in accordance with the present disclosure.

FIG. 21C is a schematic diagram illustrating in top view a two dimensional plurality of catadioptric optical elements aligned with a plurality of micro-LEDs 3 and light recycle systems in region 204 comprising an array of alternating light deflecting surfaces 200, 202. Thus the surfaces 200, 202 may be annular in embodiments comprising two dimensional catadioptric optical elements 38. In embodiments comprising one dimensional catadioptric optical elements 38, the surfaces 200, 202 may be linear.

It would be desirable to increase the luminance of recycled light that is provided for increasing spatial uniformity.

Figure 21D:
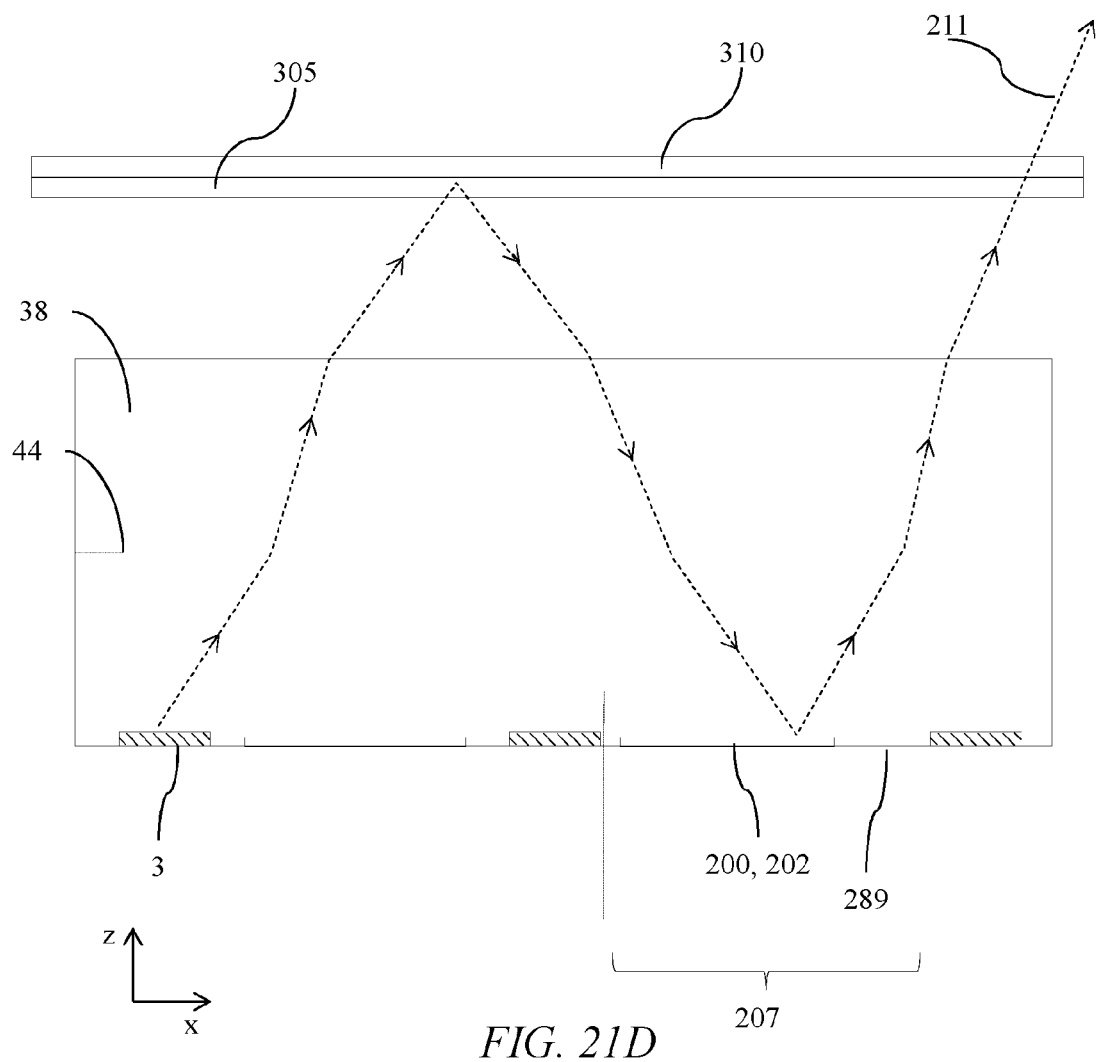
FIG. 21D is a schematic diagram illustrating in side view light incidence onto an array of light deflecting surfaces with an elongate catadioptric optical element; in accordance with the present disclosure.
Figure 21E:
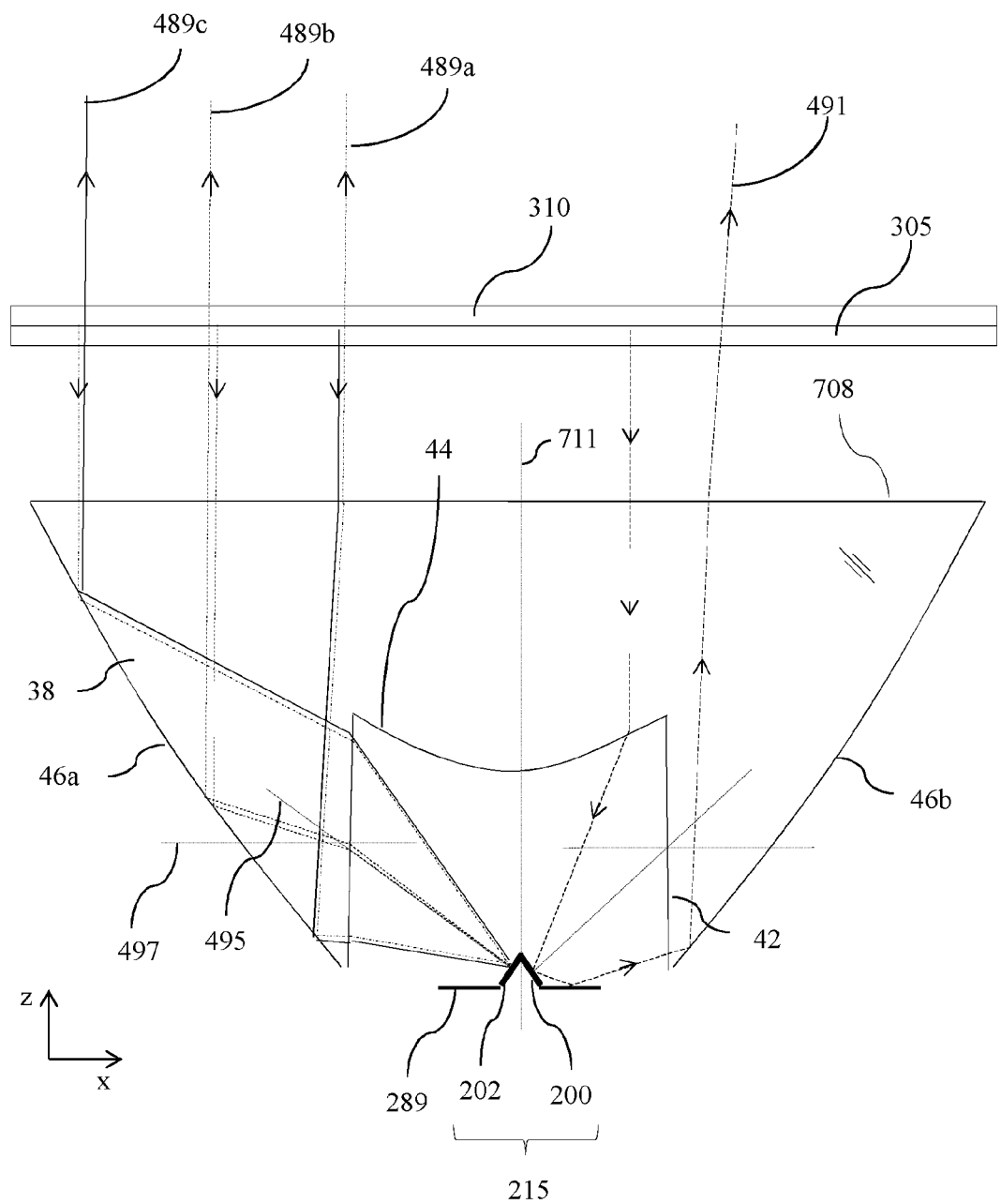
FIG. 21E is a schematic diagram illustrating a side view of a raytrace of light rays from an off-axis direction after reflection by a reflective polariser towards the plane of a micro-LED and reflection from a far side light deflecting surface with an elongate catadioptric optical element, in accordance with the present disclosure.
Figure 21F:
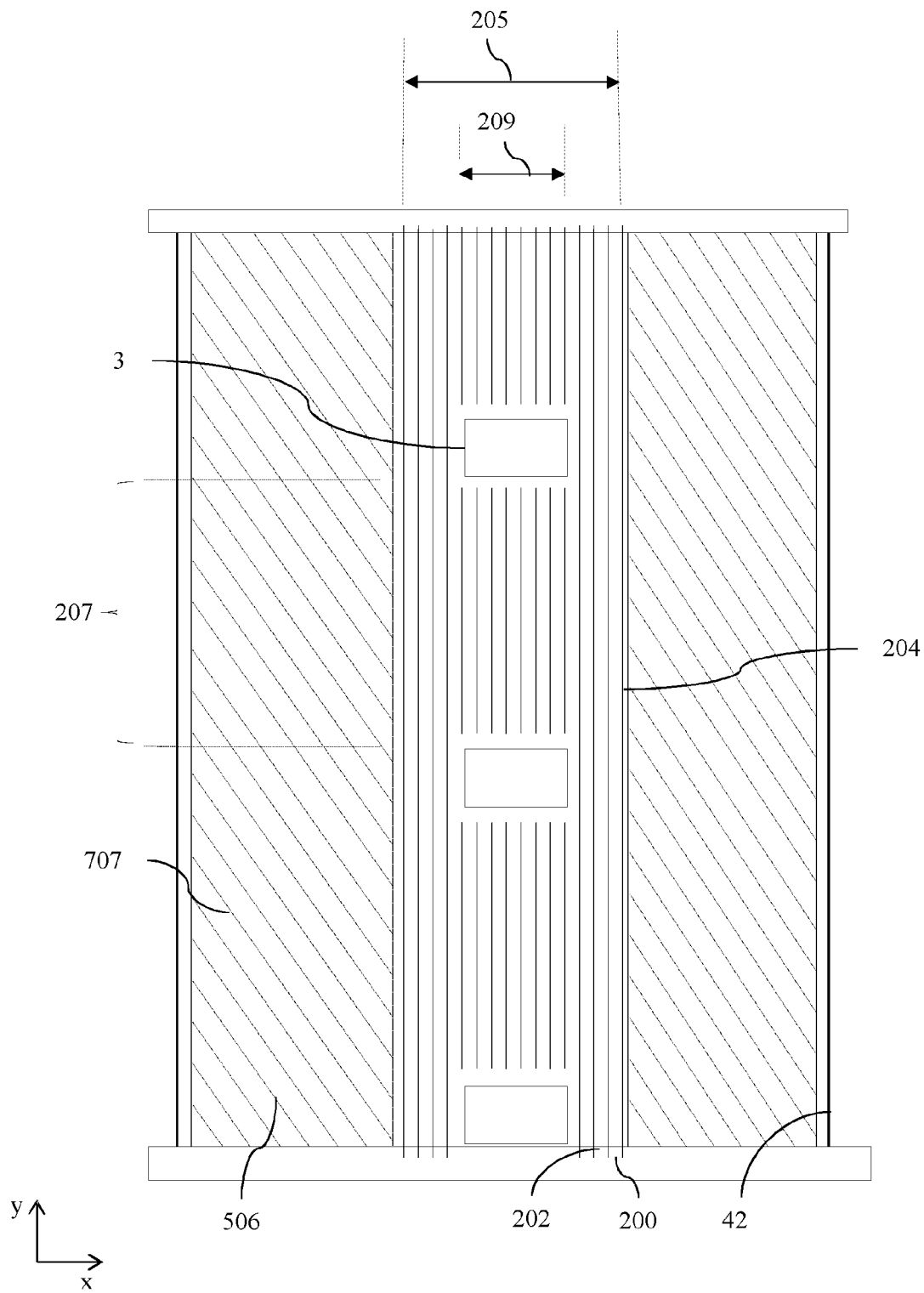
FIGS. 21F-G are schematic diagrams illustrating in top views further arrangements of light deflecting surfaces for a plurality of elongate catadioptric optical elements, in accordance with the present disclosure.
Figure 21G:
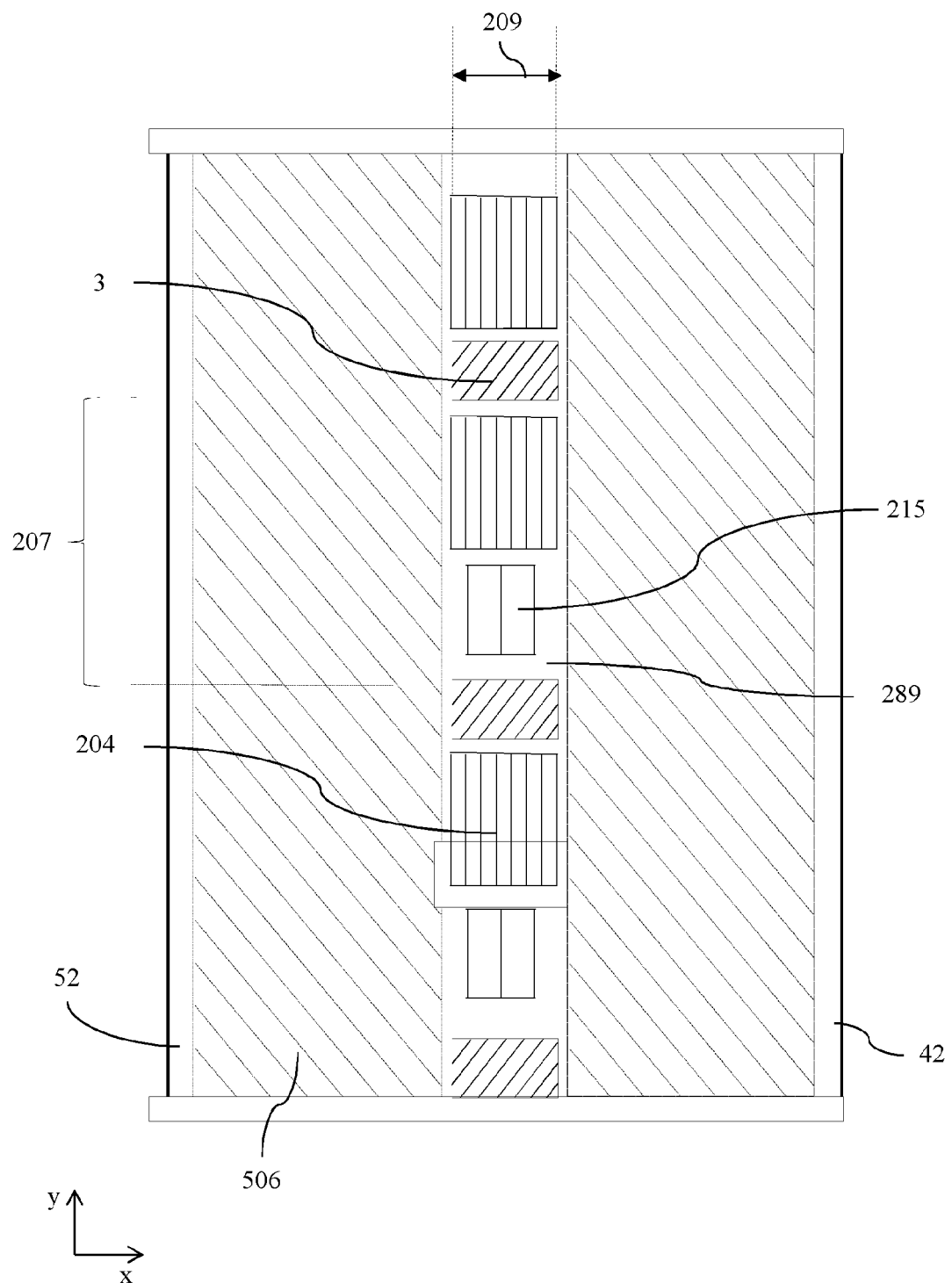

FIG. 21D is a schematic diagram illustrating in side view light ray 211 incidence onto light recycle systems comprising an array of light deflecting surfaces 200, 202. FIG. 21E is a schematic diagram illustrating a side view of a raytrace of light rays from an off-axis direction after reflection by a reflective member comprising a reflective polariser 310 towards the plane of a micro-LED and reflection from light recycle systems comprising a light deflecting surfaces 200, 202 with an elongate catadioptric optical element 38. FIGS. 21F-G are schematic diagrams illustrating in top views further arrangements of light recycle systems comprising light deflecting surfaces 200, 202 in regions 204 and light absorbing elements 506 for one of a plurality of elongate catadioptric optical elements 38.

Thus the catadioptric optical elements 38 of the plurality of catadioptric optical elements are elongate in a first direction (y-axis); at least some of the micro-LEDs 3 of the plurality of micro-LEDs are separated by gaps in the first direction; and the light recycle systems comprising at least two tilted surfaces 200, 202 are arranged in the gaps.

FIG. 21D illustrates that light rays 211 that are not normal to the micro-LED in the x-z plane may be recycled by incidence in region 207 between the micro-LEDs 3. Recycled light rays 211 may thus be incident onto light deflection surfaces 200, 202 or planar mirrors 289 that are arranged between the micro-LEDs 3 of the plurality of micro-LEDs.

FIG. 21E illustrates that some rays may be directed towards a location near to the optical axis 711 of an elongate catadioptric optical element 38. For example light ray 491 that passes through refractive surface 44 may be recycled by incidence on light deflecting surface 200 and planar mirror surface 289. Further, on-axis light rays 489a, 489b, 489c are further recycled to on-axis locations by light deflecting surface 202, further improving spatial light output distribution as described elsewhere herein.

FIG. 21F illustrates that the input end 707 may be bounded in the lateral direction (x-axis in this example) by walls 42 of a catadioptric optical element 38 and may comprise micro-LEDs 3 and plurality of light deflecting surfaces 200, 202. The at least two tilted surfaces 200, 202 are arranged in region 204 that is proximate to and around at least some of the micro-LEDs 3 of the plurality of micro-LEDs 3.

The region 204 may have a width 205 that is wider than the LEDs 3, and may be arranged in region 207 to extend between the micro-LEDs 3 in the direction in which the catadioptric optical elements 38 are elongate. Advantageously the amount of light that is recycled may be increased, improving efficiency and uniformity of spatial light output distribution.

The width 205 further determines the directional light output distribution of the light that has been recycled, that is the wider the width 205, the wider the solid angle 181 of the directional light output distribution 120 that is provided by the recycled light.

It would be desirable to provide a solid angle 181 for recycle light that is similar in size to the solid angle 181 of the light rays that are output from the display device without recycling.

In FIG. 21G the width 209 of the recycling optical elements is illustrated to be substantially the same as the width of the micro-LEDs 3. Thus the directional light output distribution provided directly (without recirculation) by the micro-LEDs 3 and by the recycled light after reflection from the region 204 may be substantially the same. Light recycle systems may further comprise planar mirrors 289 and reflective surfaces 200, 202 in region 215 that are arranged to receive light ray 491 that is directed towards central region 209 that has a similar width to the width 209 of the micro-LED 3.

Advantageously the solid angle 181 of the combined directional light output distribution can be reduced in comparison to the arrangement of FIG. 21F. Privacy and stray light performance can be enhanced, and spatial light output distribution optimised to reduce image artefacts, with increased spatial uniformity.

The lateral luminance uniformity of the arrangements of FIG. 21B-G will now be described.

Figure 22A:
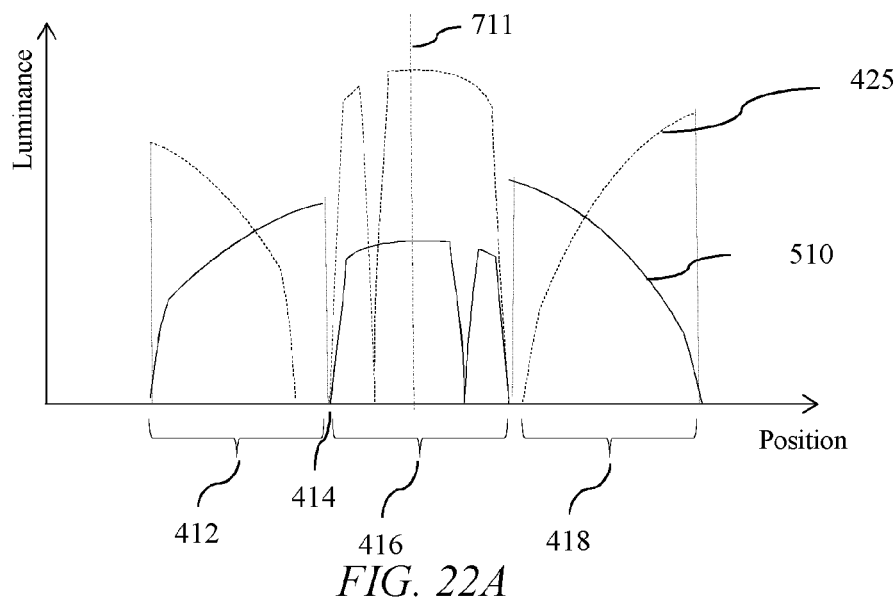
FIGS. 22A-B are schematic graphs of output luminance against position across a catadioptric optical element 38 for on-axis viewing, in accordance with the present disclosure.
Figure 22B:
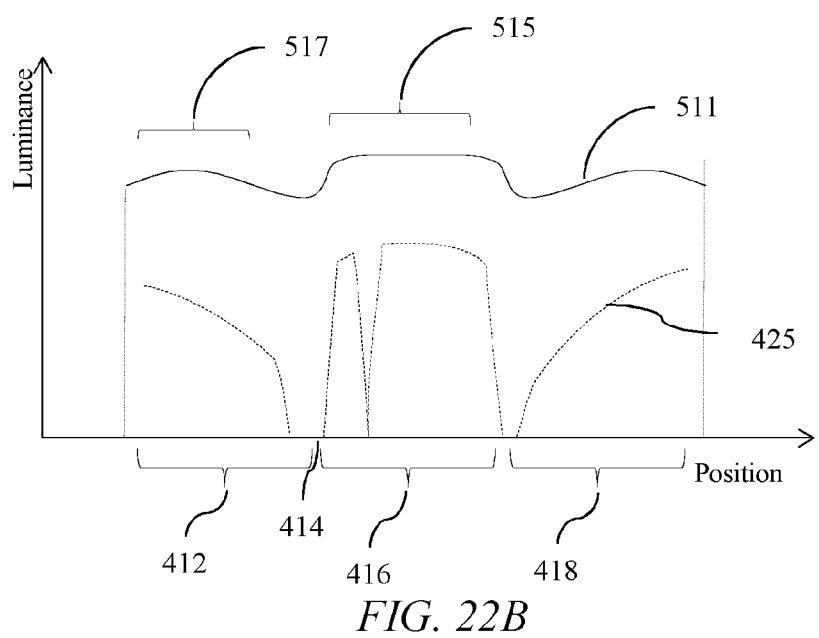

FIGS. 22A-B are schematic graphs of output luminance against position across a catadioptric optical element 38 for a small off-axis viewing location, for example 2.5 degrees. FIG. 22A illustrates that luminance profile 425 as described with reference to FIG. 14A may be modified by recirculated light that is incident on near and far side light deflection features 200, 202, to achieve recirculated light profile 510 with regions 412, 418 and 416.

Thus the light recycle systems provide a second light output distribution with profile 510, thereby providing a combined light output distribution 511 comprising in combination the first light output distribution 425, and the second light output distribution 510, the combined light output distribution 511 having increased spatial uniformity compared to the spatial uniformity of the first light output distribution alone.

Figure 22C:
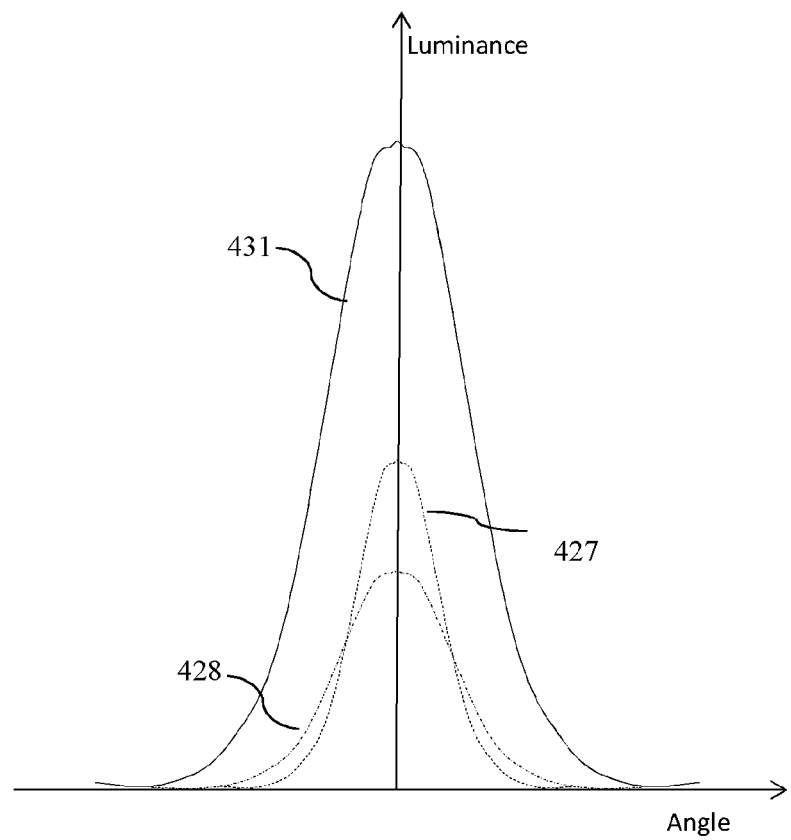
FIG. 22C is a schematic graphs of output luminance against output angle for light that exits the illumination apparatus, in accordance with the present disclosure.

FIG. 22C is a schematic graph of output luminance against output angle for light that exits the illumination apparatus. The directional light output distribution 427 of the first light output distribution may be modified by the directional light output distribution 428 of the second light output distribution, thereby providing a combined light output distribution with directional light output distribution 431. The directional light output distribution 431 distribution may advantageously have higher luminance and higher angular uniformity.

To provide increased symmetry of illumination across the output aperture, the reflective polariser further provides a horizontal flip in the light that is incident back onto the catadioptric optical element 38. Further diffuser elements achieve improved uniformity by mixing of angular characteristics for the recirculated light. Modification of the gap between the diffuser and the output aperture of the catadioptric optical elements 38 may further provide spatial mixing of the output profile for a given angle.

In combination a profile 511 as shown in FIG. 22B may be achieved. Advantageously lateral uniformity may be improved in comparison with the unmodified output luminance structure.

In other words an illumination apparatus, may comprise a plurality of micro-LEDs 3, the plurality of micro-LEDs 3 being arranged in a micro-LED array; a plurality of catadioptric optical elements 38 arranged in a catadioptric optical element array, wherein each of the catadioptric optical elements 38 of the plurality of catadioptric optical elements comprises, in at least one cross-sectional plane through its optical axis 711: a first outer surface 46a and a second outer surface 46b facing the first outer surface 46a; wherein the first and second outer surfaces 46a, 46b extend from a first end 707 of the catadioptric optical element 38 to a second end 708 of the catadioptric optical element 38, the second end 708 of the catadioptric optical element 38 facing the first end 707 of the catadioptric optical element; wherein the distance 714 between the first and second outer surfaces 46a, 46b at the first end 707 of the catadioptric optical element 38 is less than the distance 712 between the first and second outer surfaces 46a, 46b at the second end 708 of the catadioptric optical element 38; and at least one transparent inner surface 42, 44 arranged between the first and second ends 707, 708 and between the first and second outer surfaces 461, 46b; wherein each of the catadioptric optical elements 38 of the plurality of catadioptric optical elements is aligned in correspondence with a respective one or more of the micro-LEDs 3 of the plurality of micro-LEDs, each of the micro-LEDs 3 of the plurality of micro-LEDs being aligned with only a respective one of the catadioptric optical elements 38 of the plurality of catadioptric optical elements; the alignment being such that some of the light output 716 from each of the micro-LEDs exits the second end 708 of its respective catadioptric optical element 38 with a first light output distribution 410, 427; one or more reflective members such as reflective polariser 310, the one or more reflective members arranged relative to the first light output distribution 410, 427 such that some of the light 716 that exits the second end of the respective catadioptric optical element 38 is reflected by the one or more reflective members back into the catadioptric optical element 38; and a plurality of light recycle systems that may comprise at least one of items 200, 202, 506, 289, the plurality of light recycle systems being arranged in an array, wherein each of the light recycle systems of the plurality of light recycle systems is aligned in correspondence with a respective micro-LED 3 of the plurality of micro-LEDs, each of the light recycle systems being arranged relative to the first end 707 of the catadioptric optical element 38 and the one or more reflective members such as to further reflect some of said light that has been reflected back into its respective catadioptric optical element 38 to provide recycled light that exits the second end 708 of its respective catadioptric optical element 38 with a second light output distribution 510, 428, thereby providing a combined light output distribution 511, 431 comprising in combination the first light output distribution 410, 427 and the second light output distribution 510, 428, the combined light output distribution 511 having increased spatial uniformity compared to the spatial uniformity of the first light output distribution alone 410.

In other words an illumination apparatus may comprise a plurality of micro-LEDs 3, the plurality of micro-LEDs being arranged in a micro-LED array; a plurality of catadioptric optical elements 38 arranged in a catadioptric optical element array, wherein each of the catadioptric optical elements 38 of the plurality of catadioptric optical elements is aligned in correspondence with a respective one or more of the micro-LEDs 3 of the plurality of micro-LEDs, each of the micro-LEDs 3 of the plurality of micro-LEDs being aligned with only a respective one of the catadioptric optical elements 38 of the plurality of catadioptric optical elements; and a plurality of light recycle systems that may comprise at least one of items 200, 202, 506, 289, the plurality of light recycle systems, being arranged in an array, wherein each of the light recycle systems of the plurality of light recycle systems is aligned in correspondence with a respective micro-LED 3 of the plurality of micro-LEDs; wherein each light recycle system comprises at least a first part and a second part such as 200a, 200b, the first part having a different reflection characteristic compared to the second part.

Figure 22D:
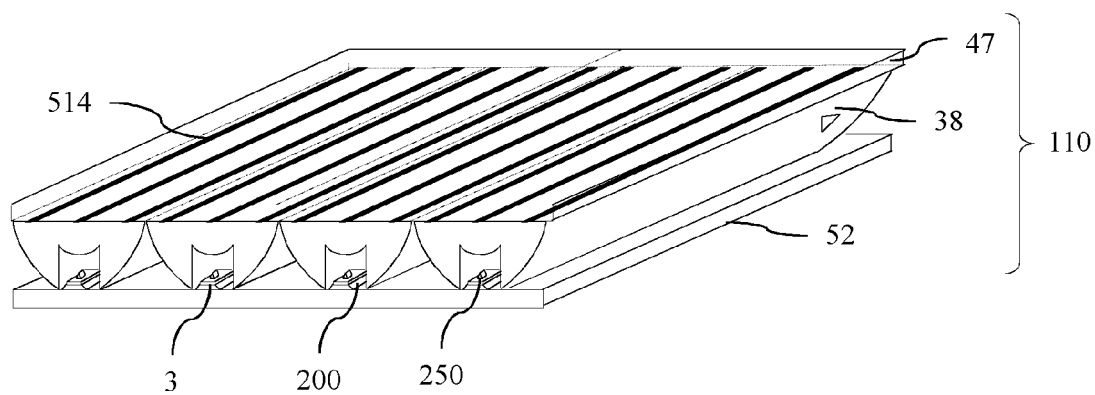
FIG. 22D is a schematic diagram illustrating in perspective side view a directional backlight comprising further patterned reflective structures, in accordance with the present disclosure.
Figure 22E:
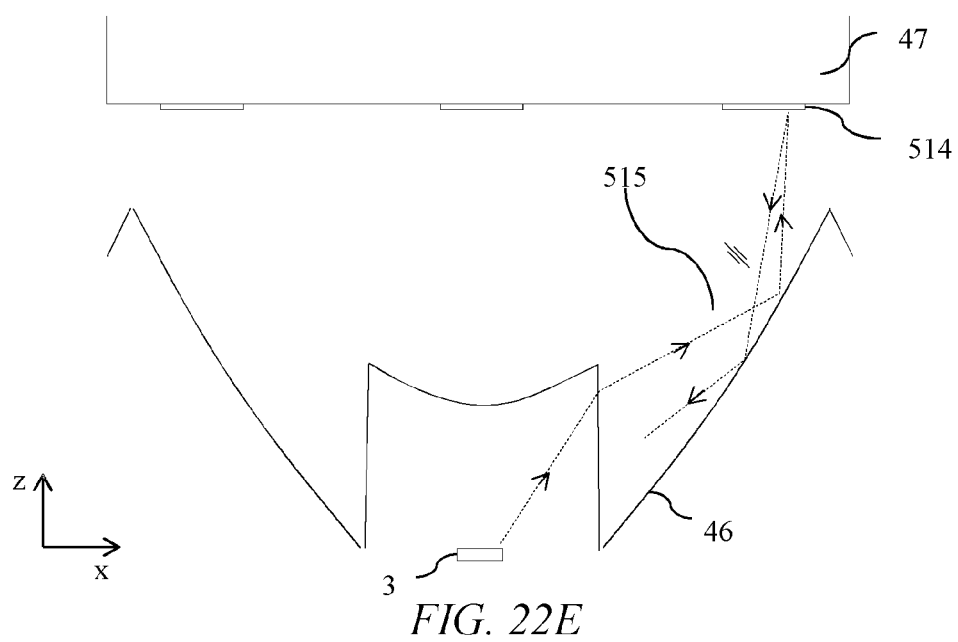
FIG. 22E is a schematic diagram illustrating in side view a directional backlight comprising further patterned reflective structures, in accordance with the present disclosure.

FIG. 22D is a schematic diagram illustrating in perspective side view a directional backlight comprising further reflective members comprising patterned reflectors 514 that are reflective and may be arranged in a patterned reflective layer and FIG. 22E is a schematic diagram illustrating in side view part of a directional backlight comprising reflective members comprising patterned reflectors 514 that may be for example metallised layers formed on the transparent substrate 47.

The reflectors 514 may be arranged to provide reflection of light in regions 515, 517 of profile 512 in FIG. 22B that have increased luminance. Residual non-uniformities in profile 512 may be reduced. The reflectors 514 may alternatively be absorbing structures that are arranged to reduce the luminance of spatial regions with increased luminance output.

Advantageously a backlight 110 with increased spatial uniformity may be provided.

It may be desirable to provide a switchable directional illumination apparatus or switchable directional display apparatus comprising a plurality of micro-LEDs 603 arranged on the transparent substrate 47 arranged to provide a wide directional light output distribution in cooperation with diffusers 311 on the spatial light modulator 112.

Figure 23A:
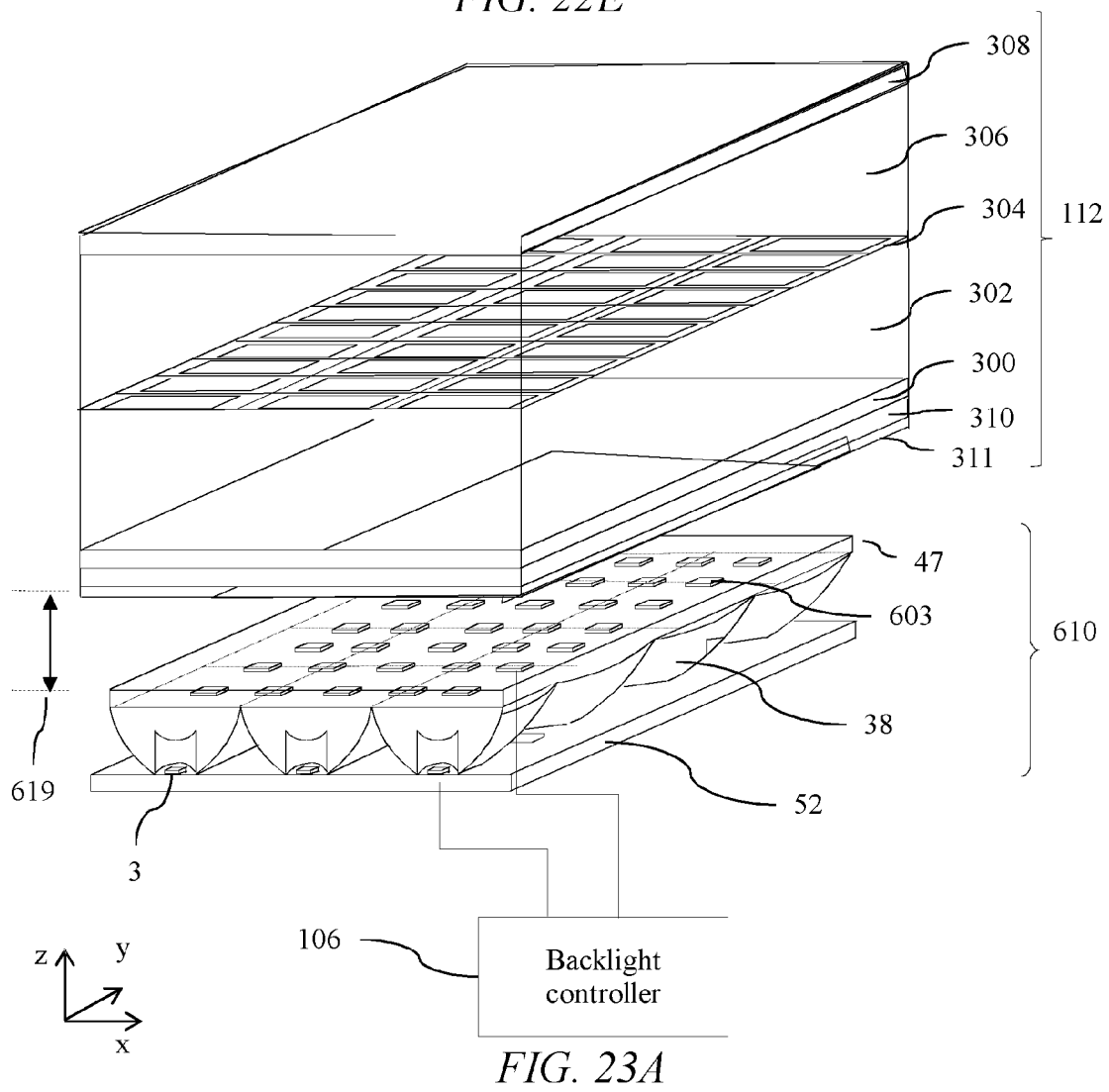
FIG. 23A is a schematic diagram illustrating in side perspective view a switchable directional display apparatus comprising a backlight with a two dimensional plurality of catadioptric optical elements and a first array of aligned micro-LEDs on a backplane substrate 52, further comprising a second array of aligned micro-LEDs on a second substrate arranged to illuminate a transmissive LCD, in accordance with the present disclosure.

FIG. 23A is a schematic diagram illustrating in side perspective view a switchable directional display apparatus comprising a backlight 610 with a two dimensional plurality of catadioptric optical elements 38 and a plurality of micro-LEDs 3 on a backplane substrate 52 and aligned to the catadioptric optical elements 38, further comprising a second plurality of micro-LEDs 603 on a second substrate arranged to illuminate a transmissive spatial light modulator 112. The micro-LEDs 603 may be arranged in similar locations to those provided by reflectors 514 in FIGS. 22C-D to achieve increased spatial uniformity of output. Spatial light modulator 112 may comprise a reflective member comprising a reflective polariser 310.

In operation in a narrow angle mode as described elsewhere herein, micro-LEDs 3 of the first array may be illuminated. In operation in a wide angle mode, the second plurality of micro-LEDs 603 may be illuminated, and optionally the micro-LEDs 3 of the first array. Light rays from the micro-LEDs 603 may be substantially directed away from the catadioptric optical elements, and thus wide angle illumination may be unmodified by the catadioptric optical elements 38.

The packing density of the micro-LEDs 603 may be arranged to provide uniform illumination of the spatial light modulator 112 after diffusion by diffuser elements 311 arranged on the spatial light modulator and separated by gap 619.

Figure 23B:
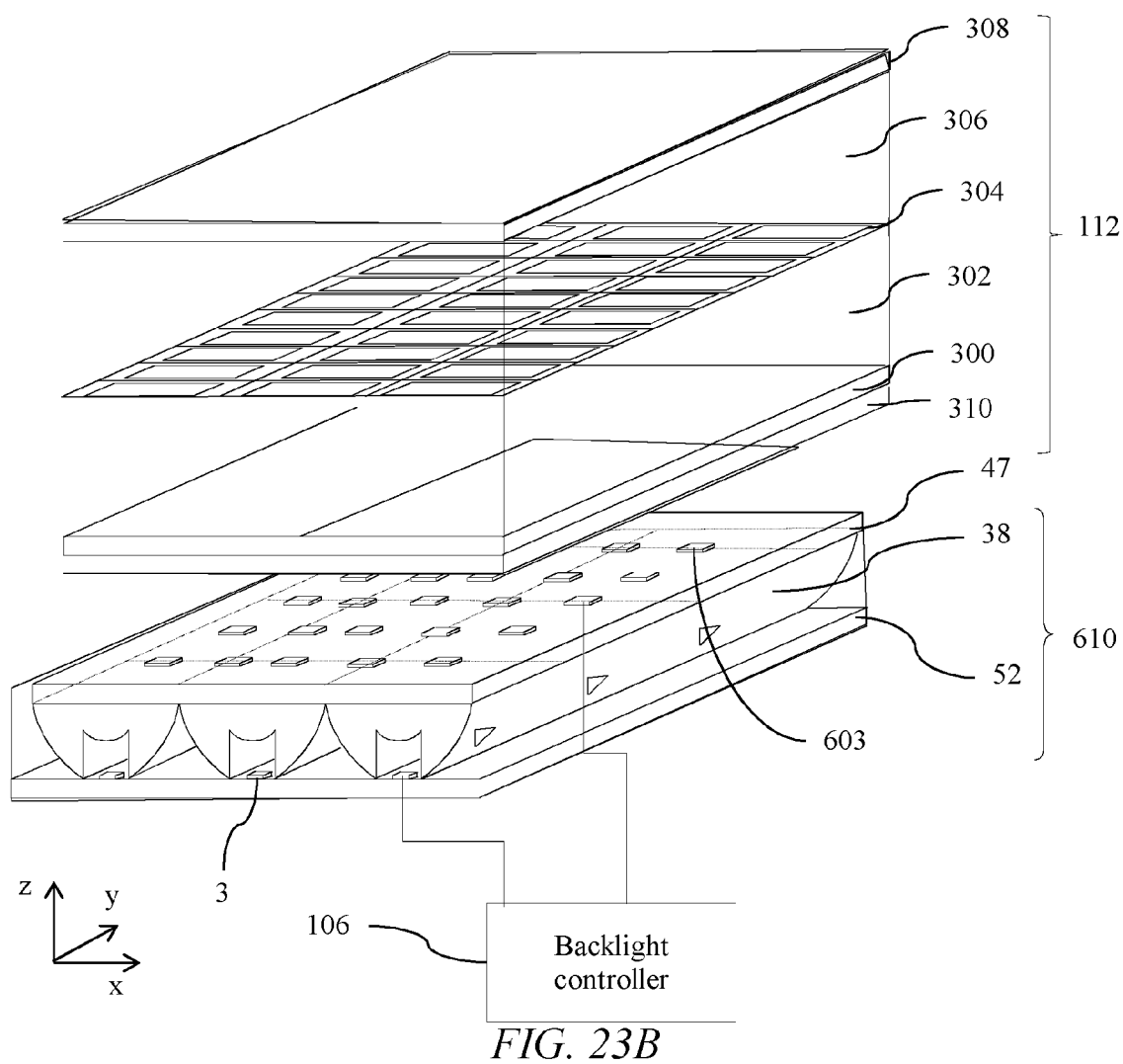
FIG. 23B is a schematic diagram illustrating in side perspective view a switchable directional display apparatus comprising a backlight with a one dimensional plurality of catadioptric optical elements and a first array of aligned micro-LEDs on a backplane substrate 52, further comprising a second array of aligned micro-LEDs on a second substrate arranged to illuminate a transmissive LCD, in accordance with the present disclosure.

FIG. 23B is a schematic diagram illustrating in side perspective view a switchable directional display apparatus comprising a backlight with a one dimensional plurality of catadioptric optical elements 38 and a first array of aligned micro-LEDs 3 on a backplane substrate 52, further comprising a plurality of micro-LEDs 603 on a second substrate arranged to illuminate a transmissive LCD spatial light modulator 112.

Advantageously a narrow directional light output distribution 181 may be achieved in the lateral direction while providing wide directional light output distribution 122 in the orthogonal direction as described elsewhere herein.

The arrangement of the micro-LEDs 603 in directional backlight 610 will now be described.

Figure 24A:
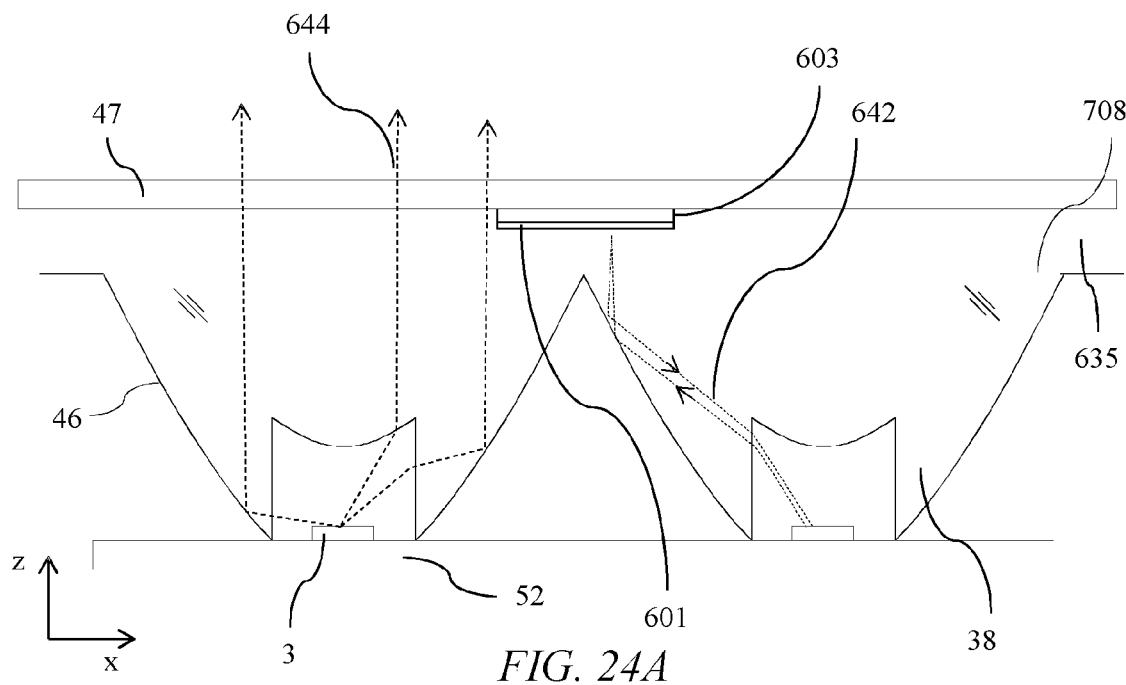
FIG. 24A is a schematic diagram illustrating in side view light propagation from the plurality of micro-LEDs and aligned catadioptric optical elements of FIG. 23B, in accordance with the present disclosure.

FIG. 24A is a schematic diagram illustrating in side view light propagation from the plurality of micro-LEDs 3 and aligned catadioptric optical elements 38 of FIG. 51 wherein the second plurality of micro-LEDs 603 arranged between the transparent substrate 47 and the backplane substrate 52.

The area of the micro-LEDs 603 may be small in comparison to the area of the output of the catadioptric optical elements 38, reducing light loss. Light rays 642 that are incident on the rear of the LEDs may be reflected by means of light recycle systems comprising reflecting layers 601 arranged on the lower side of the micro-LEDs 603. Light rays 644 that are incident on the layers 601 may be recycled as rays 642 at the micro-LEDs 3 or in areas around the micro-LEDs 3.

Advantageously the losses from absorption at the micro-LEDs 603 for light from the micro-LEDs 3 may be reduced. Further the micro-LEDs 603 may be protected by the material of base layer 635 and transparent substrate 47.

In one method to form the apparatus of FIG. 24A, micro-LEDs 603 may be formed on substrate 47 and subsequently catadioptric optical elements 38 moulded onto the substrate 47, embedding the micro-LEDs 603. Base layer 635 may be arranged to provide embedding of the LEDs when provided near adjacent cusps of the sides 46.

Figure 24B:
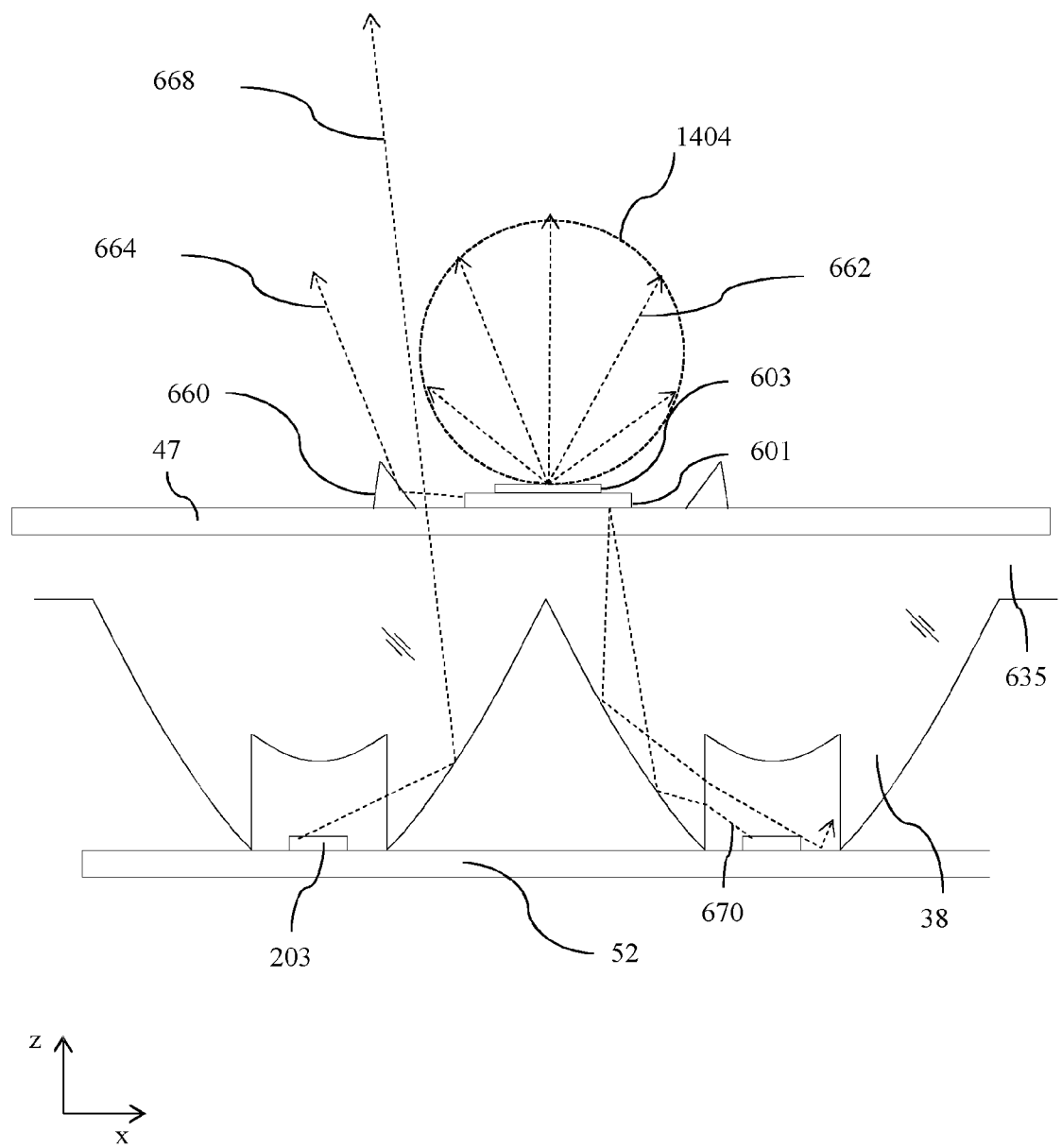
FIG. 24B is a schematic diagram illustrating in side view light propagation from the second plurality of micro-LEDs arranged on the second substrate wherein the second substrate is between the second plurality of micro-LEDs and the backplane substrate 52, in accordance with the present disclosure.

FIG. 24B is a schematic diagram illustrating in side view light propagation from the second plurality of LEDs arranged on the transparent substrate 47 wherein the transparent substrate 47 is between the micro-LEDs of the second plurality of micro-LEDs and the backplane substrate 52. Thus the patterned reflector 514 is arranged between the catadioptric optical elements 38 and LEDs of a second plurality of LEDs.

In comparison to the arrangement of FIG. 24A, emission from the pixel micro-LEDs 603 is directly into air and a full emission cone 1404 may be provided to the observer in wide angle mode, achieving directional light output distribution of directional light output distribution 120 122. The light cone 1404 may be modified by side emission from the pixel micro-LED 603, which may be redirected by means of reflective turning optical elements 660. Further light rays 670 may be recycled by means of reflection light recycle system comprising reflective layer 601.

Advantageously a switchable directional direct display may be provided with high efficiency, low pixel cross talk, and low thickness.

The arrangement of FIG. 24B and other embodiments described herein may further be applied to environmental lighting, with no spatial light modulator 112. It may be desirable to improve the visual appearance of environmental luminaires in order to reduce the 'bug eye' appearance. The spatial light output distribution uniformity enhancements of the present embodiments may thus be applied to such applications, achieving improved cosmetic appearance.

Desirable locations for micro-LEDs 603 will now be described.

Figure 25A:
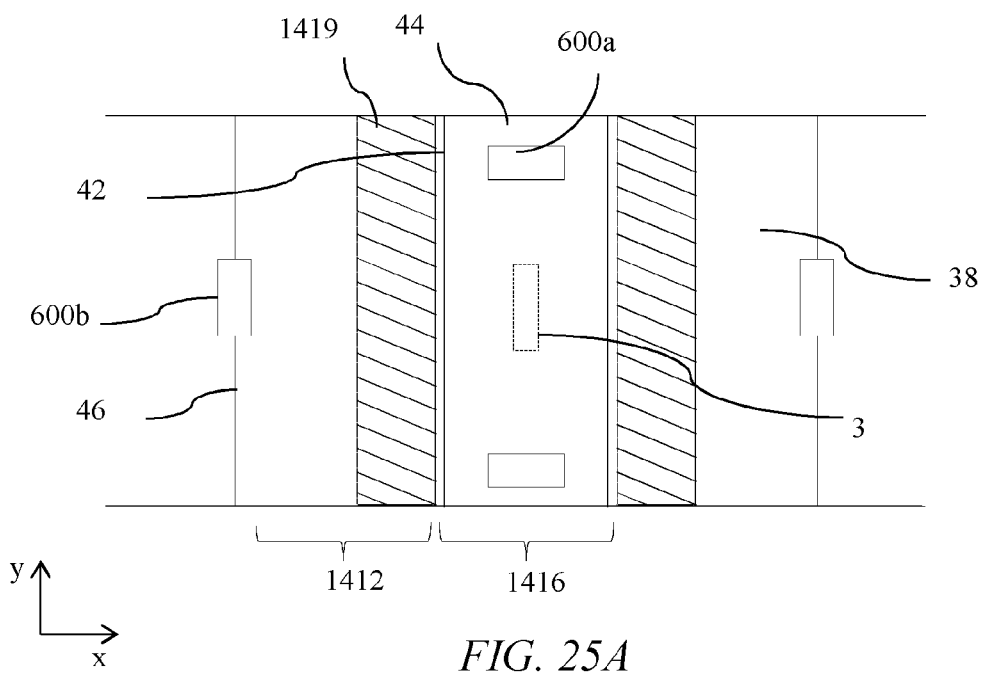
FIG. 25A is a schematic diagram illustrating in top view an arrangement of micro-LEDs aligned with a catadioptric optic element, in accordance with the present disclosure.

FIG. 25A is a schematic diagram illustrating in top view an arrangement of micro-LEDs 3, 600 aligned with a catadioptric optic element 38. Micro-LEDs 603 may be arranged to reduce light transmission in high luminance regions of the catadioptric optical element 38.

Thus micro-LEDs 603a may be arranged in the central region 1416 associated with a position above the refractive surface 44 of the catadioptric optical element 38. Further micro-LEDs 603b may be arranged in outer regions 1412 of the catadioptric optical element 38.

Advantageously the luminance uniformity of the backlight 610 may be improved. Moiré and mura effects for display illumination may be reduced.

It may be desirable to provide increased uniformity for cusp regions 540 that are provided during the fabrication of arrays of catadioptric optical elements 38.

Figure 25B:
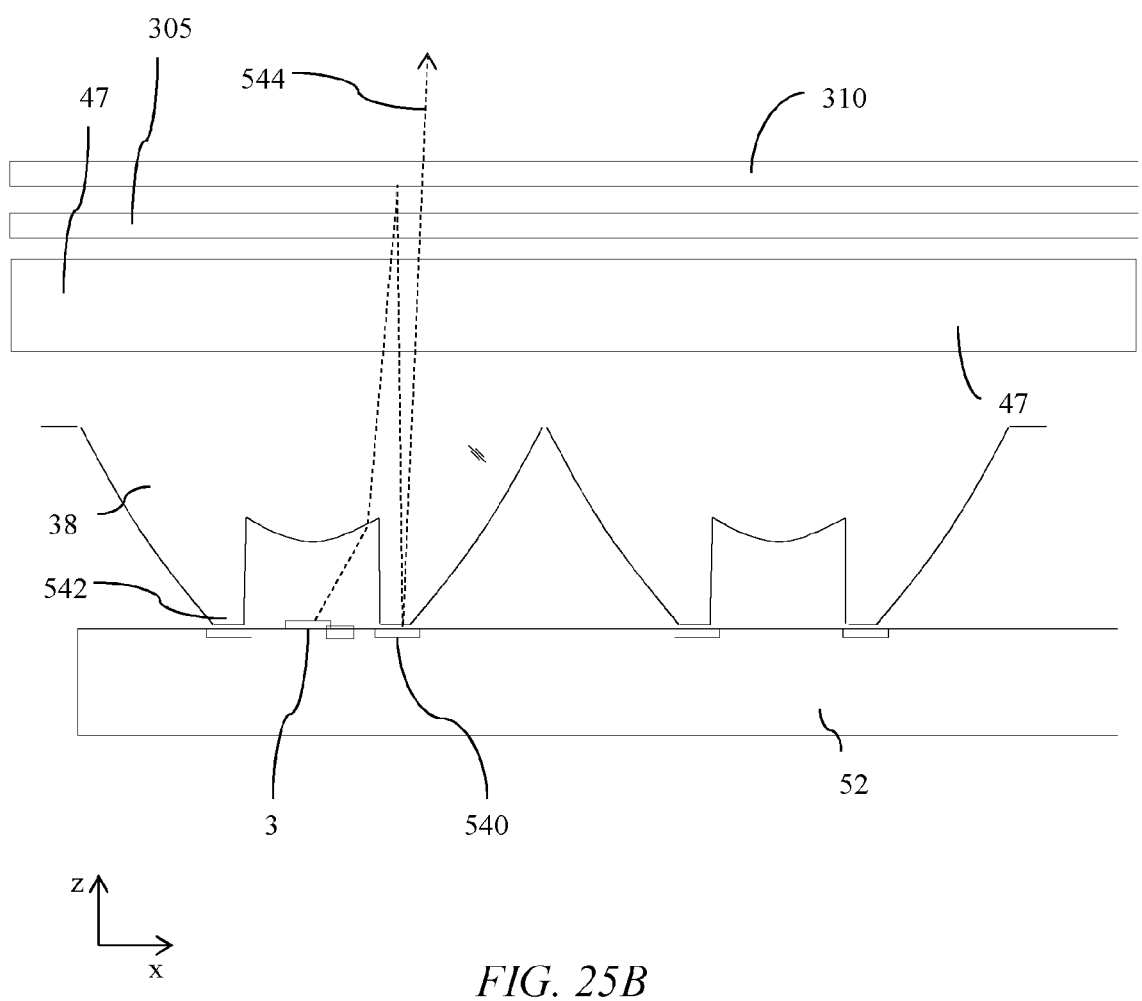
FIG. 25B is a schematic diagram illustrating in side view a raytrace in a catadioptric optical element comprising filling the surface between the side walls and outer reflective surfaces by means of polarisation recirculation, in accordance with the present disclosure.

FIG. 25B is a schematic diagram illustrating in side view a raytrace in a catadioptric optical element comprising filling the cusp 542 between the side walls 42 and reflective side surfaces 46 by means of polarisation recirculation. In fabrication catadioptric optical elements may form a cusp 542 with finite width between the side surfaces 46 and walls 42. Light recycle systems may comprise reflective element 540 that may be provided on the substrate 52 to achieve recirculation of directional light rays 544.

Advantageously lateral uniformity for catadioptric optical elements 38 comprising cusp regions may be increased. Display Moiré and mura may be reduced.

It would be desirable to provide correction of further non-uniformities.

Figure 26:
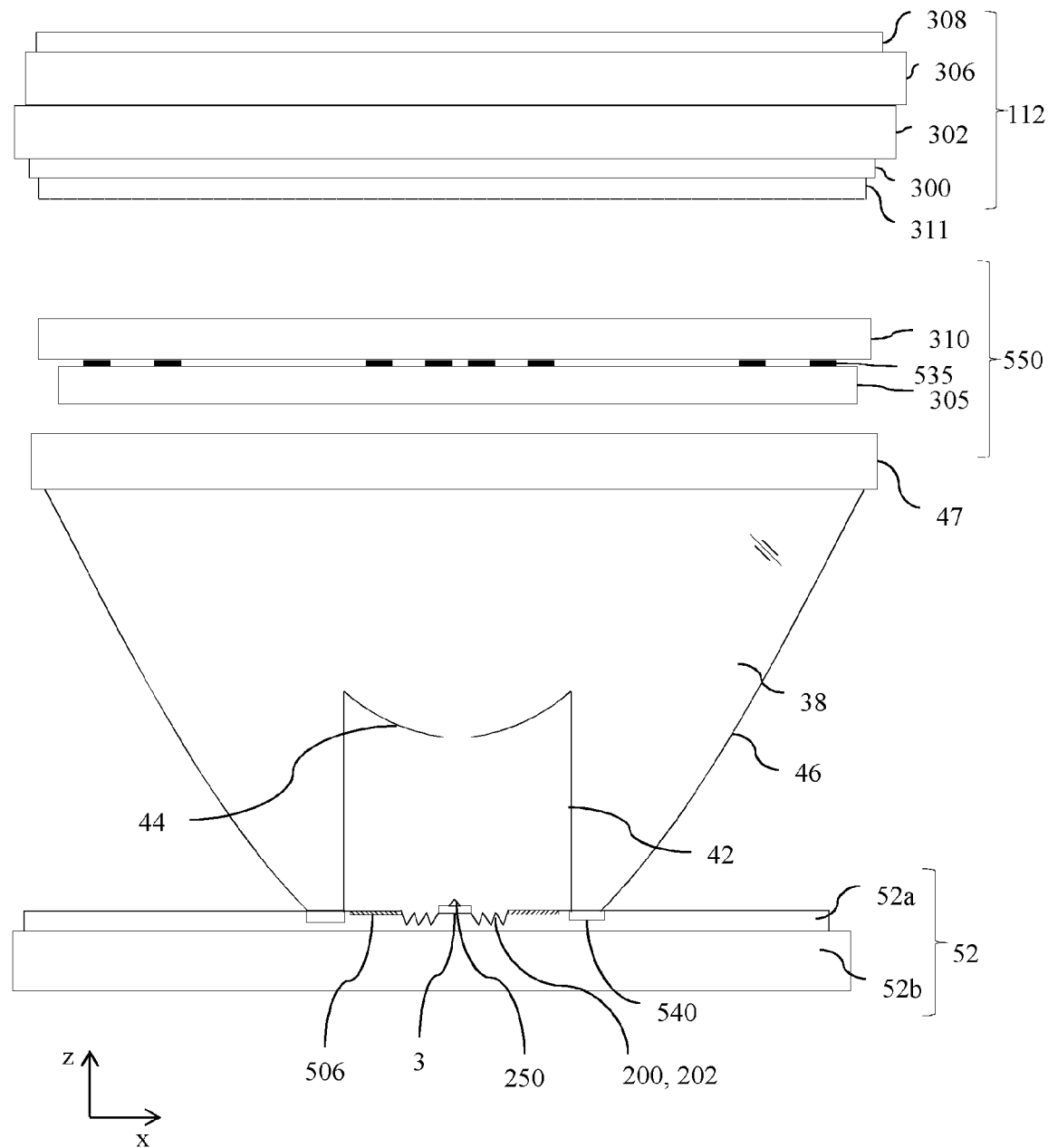
FIG. 26 is a schematic diagram illustrating in side view a compact backlight arrangement to achieve increased display luminance uniformity, in accordance with the present disclosure.

FIG. 26 is a schematic diagram illustrating in side view a compact backlight arrangement to achieve increased display spatial uniformity.

Backplane substrate may comprise micro-LED 3, and light recycle systems comprising optionally prism elements 250, light deflecting surfaces 200, 202, absorbing elements 506 and reflective elements 540.

Substrate 52a may comprise optical and electrode layers 52a and support substrate 52b. Catadioptric optical element 38 may be optionally formed on transparent substrate 47 and aligned with micro-LED 3.

Optical layer 550 may comprise a reflective member comprising a reflective polariser 310, retarder 35 and a reflective member comprising a patterned reflective layer 535 comprising an array of reflective regions that are arranged to provide increased spatial uniformity of the output light distribution. Optical layer 550 may further be formed on the transparent substrate 47 and may be located so that the transparent substrate 47 is between the layer 550 and the substrate 52 or the layer 550 is between the substrates 47, 52.

Advantageously the patterned reflective layer 535 may provide correction of residual display lateral luminance non-uniformities, increasing spatial uniformity.

It would be desirable to reduce the thickness and increase the efficiency of a display device in comparison to the backlight arrangements described elsewhere herein.

Figure 27A:
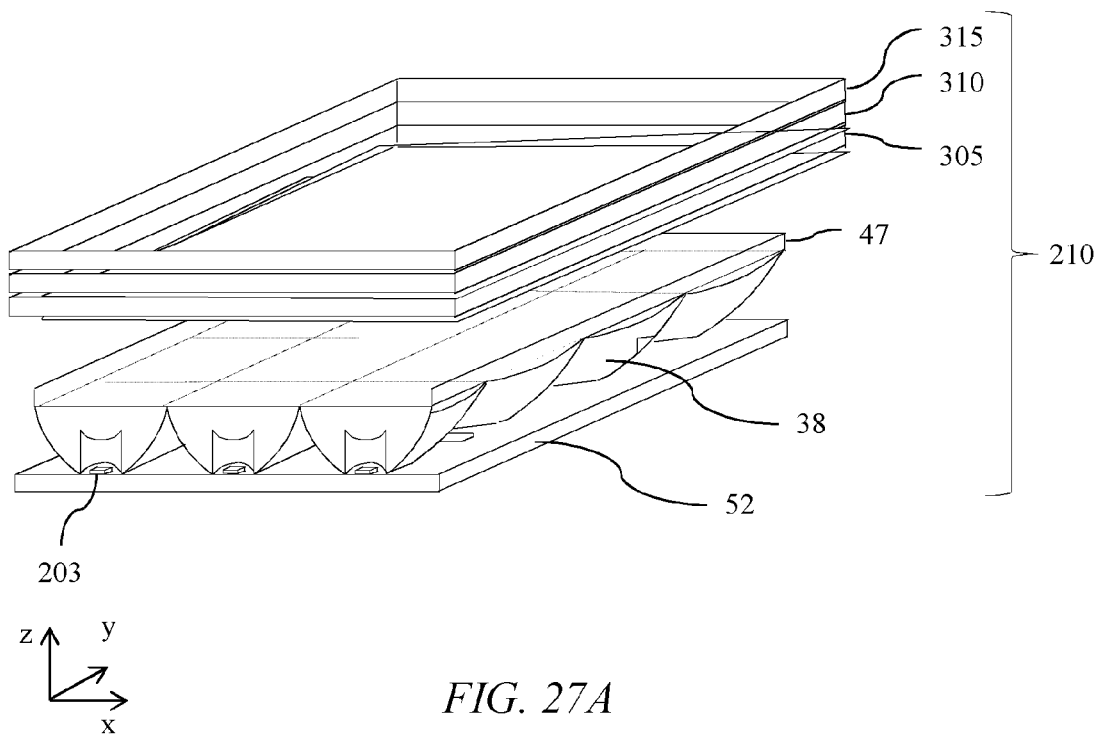
FIG. 27A is a schematic diagram illustrating a perspective side view of a directional display comprising a two dimensional plurality of micro-LEDs that is respectively aligned with a two dimensional array of catadioptric optical elements arranged to form a directional display to achieve a two dimensional directional light output distribution for an observer, in accordance with the present disclosure.

FIG. 27A is a schematic diagram illustrating a perspective side view of a directional direct display 210 comprising a two dimensional array of pixel micro-LEDs 203 that is respectively aligned with a two dimensional array of catadioptric optical elements 38 arranged to provide a two dimensional directional light output distribution 120 for an observer 125, in a similar manner to that illustrated in FIG. 1A.

Figure 27B:
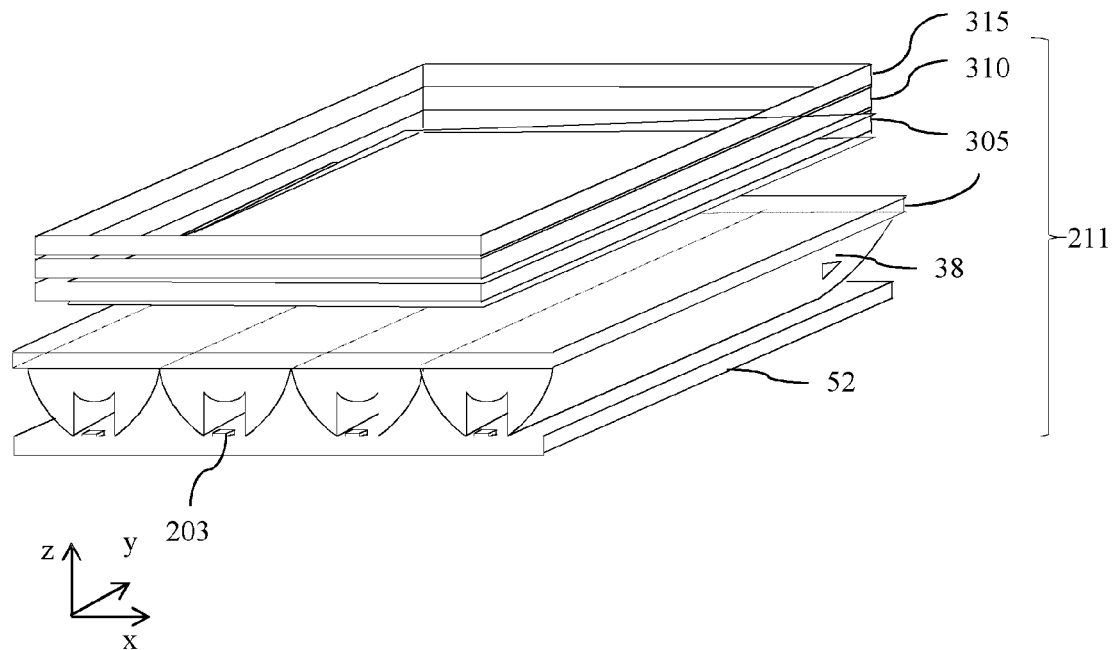
FIG. 27B is a schematic diagram illustrating a perspective side view of a directional display comprising a two dimensional plurality of micro-LEDs that is respectively aligned with a one dimensional array of catadioptric optical elements arranged to form a directional display to achieve a one dimensional directional light output distribution for an observer, in accordance with the present disclosure.

FIG. 27B is a schematic diagram illustrating a perspective side view of a directional direct display 211 comprising a two dimensional array of pixel micro-LEDs 203 that is respectively aligned with a one dimensional array of elongate catadioptric optical elements 38 arranged to provide a one dimensional directional light output distribution 181 for an observer 129, in a similar manner to that illustrated in FIG. 1A.

Figure 27C:
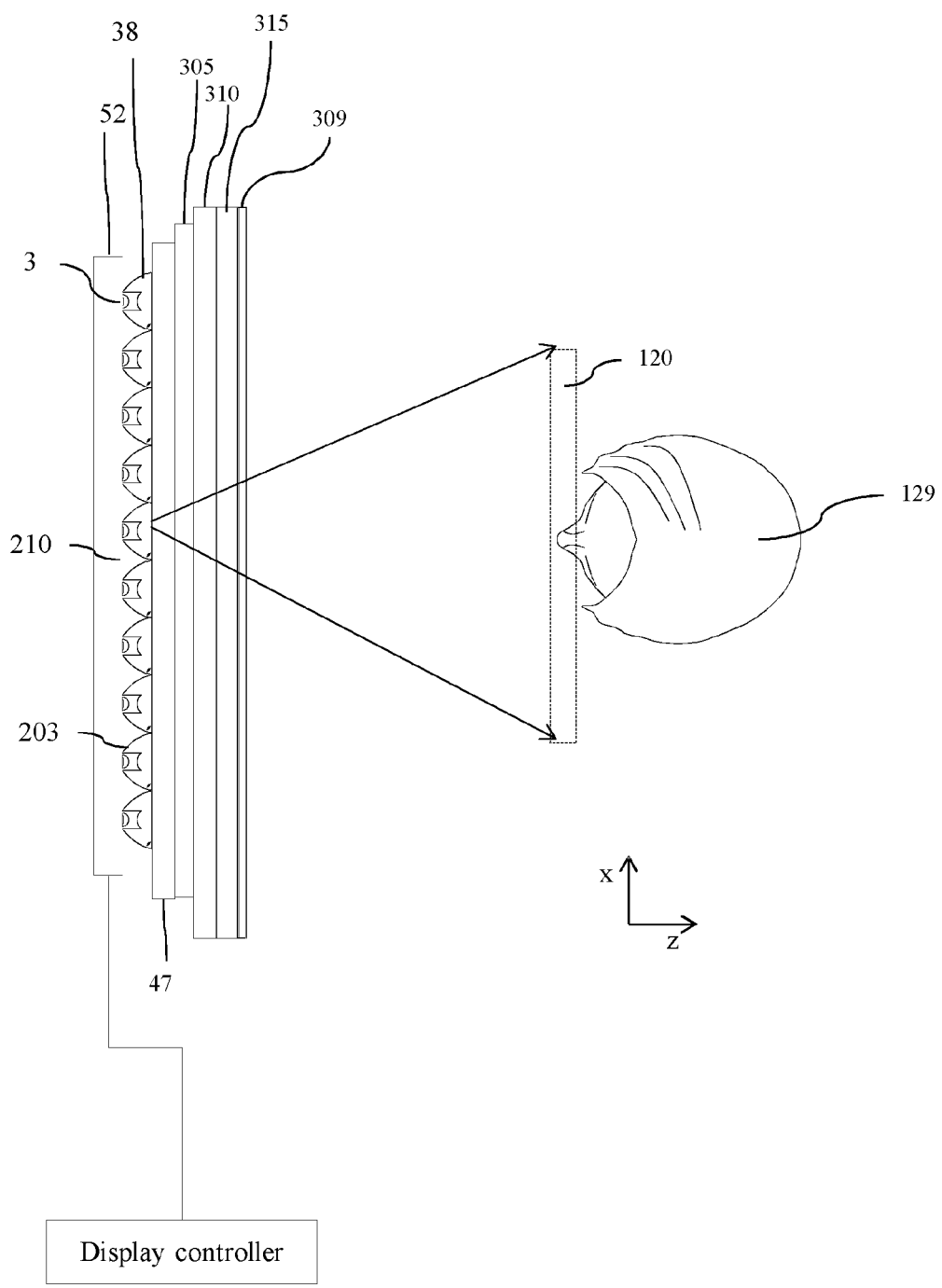
FIG. 27C is a schematic diagram illustrating a top view of the directional displays of FIGS. 26, 27A and 27B, in accordance with the present disclosure.

FIG. 27C is a schematic diagram illustrating a top view of the directional displays of FIG. 26 and FIGS. 27A-B.

The embodiments of FIG. 27A-B differ from the backlight 110 embodiment of FIG. 1A in that the micro-LEDs 3 that typically provide white light and are addressed with backlight data (that output of uniform luminous flux), are replaced by pixel micro-LEDs 203 that typically provide red, green or blue output and are addressed with pixel image data to provide the illuminated image. Thus no separate spatial light modulator 112 is provided. The arrangements of FIGS. 27A-B may have higher resolution in comparison to the backlight arrangement of FIG. 1A.

Advantageously display thickness is reduced in comparison to the display 110, 112 of FIG. 1A. Further, absorption losses in the spatial light modulator 112 are eliminated, increasing display efficiency.

In operation, external ambient light that is incident on the front surface of the display may be reflected by optical components and reflective layers in the display device, following optical paths similar to those described with regards to recycled light paths elsewhere herein. Such reflected light may degrade display contrast. It would be desirable to reduce or eliminate the appearance of such frontal reflections.

Absorbing polariser 315, aligned reflective member comprising a reflective polariser 310 and retarder 305 are provided to achieve reduced frontal reflections. Further diffuser elements 309 may be arranged between the substrate 47 and observer 129.

In operation, ambient polarised light that is transmitted through the absorbing polariser 315 is transmitted through the reflective member comprising a reflective polariser 310 and may have a modified polarisation state provided by retarder 305. The light is recycled in the light recycle systems comprising reflective optical elements including catadioptric optical elements 38, light deflecting surfaces 200, 202 and planar mirrors 289, as well as being absorbed by absorbing elements 506 as shown elsewhere herein. Such recycled light has its polarisation state appropriately rotated through 90 degrees and scattered or absorbed within the optical system. Advantageously, visibility of ambient frontal reflections may be reduced and contrast increased. Further the spatial light output distribution uniformity may be increased across each catadioptric optical element 38 of the plurality of catadioptric optical elements.

Methods for forming illumination apparatus comprising arrays of micro-LEDs 3, 203 in alignment with arrays of catadioptric optical elements 38 will now be described. Further a method to form an illumination apparatus is disclosed in WO2010038025, incorporated herein by reference. Methods to process arrays of microLEDs are further disclosed in WO2012052722, incorporated herein by reference.

FIGS. 28A-I are schematic diagrams illustrating in side views a method to form an illumination apparatus 110 comprising a plurality of micro-LEDs 3 and a plurality of catadioptric optical elements 38. Similar methods may be provided to form directional direct display apparatus 210, 211.

The plurality of micro-LEDs 3 may comprise inorganic micro-LEDs to achieve high luminous flux. The plurality of micro-LEDs 3 may further comprise a wavelength converting layer to provide white or coloured light. The wavelength converting layer may comprise a phosphor material or a quantum dot material. The micro-LEDs 3 of the plurality of micro-LEDs may be from a monolithic wafer arranged in an array with their original monolithic wafer positions s1 and orientations relative to each other preserved; and wherein in at least one direction, for at least one pair of the plurality of micro-LEDs in the at least one direction, for each respective pair there was at least one respective micro-LED in the monolithic wafer that was positioned in the monolithic wafer between the pair of micro-LEDs in the at least one direction and that is not positioned between them in the array of micro-LEDs.

Figure 28A:
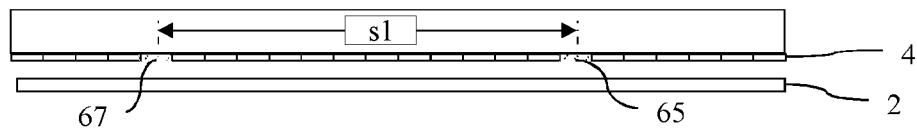
FIGS. 28A-I are schematic diagrams illustrating in side views a method to form an illumination apparatus comprising a plurality of micro-LEDs and a plurality of catadioptric optical elements, in accordance with the present disclosure.

As illustrated in FIG. 28A, a monolithic light-emitting element wafer 2 may be provided. In an illustrative embodiment the monolithic wafer 2 may comprise a gallium nitride layer and may be formed on a sapphire substrate. For the purposes of the present specification, the term monolithic refers to consisting of one piece; solid or unbroken.

In a first step at least one mask 4 is used to illuminate the monolithic light-emitting element wafer 2, with spacing s1 between first and second regions 65, 67.

Figure 28B:
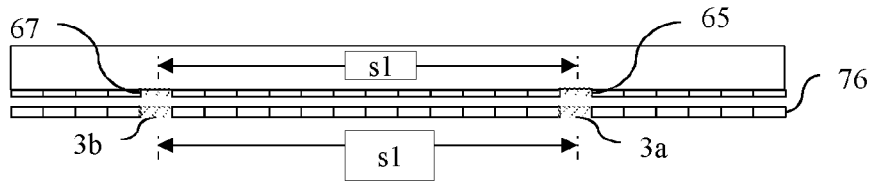

As illustrated in FIG. 28B in a second processing step, an array of light-emitting elements 3a, 3b is formed in the monolithic wafer 2. Each element has a position and orientation defined by the mask 4. The mask is composed of an array of regions 65, 67, each region defining the structure of at least one layer of an LED chip. Regions 65, 67 represent locations of first and second LED chips 3a, 3b and have separation s1 as shown. During exposure through the mask onto the wafer 2, elements 3a, 3b are formed at the positions defined by regions 65, 67 of the mask 4.

The separation s1 of the elements 3a, 3b is substantially the same as the separation s1 of the mask regions 65, 67 and the orientation of the elements 3a, 3b is the same as the orientation of the respective mask regions 65, 67.

The integrity of separation s1 and orientation of elements 3a, 3b is preserved through the subsequent processing steps. Multiple masks may be used to photo-lithographically form the complete LED structure in the manner described, each with regions with the separation s1.

Alternatively, the LED chips may be formed by means of nanoimprint lithography or other known lithography method. Such processes preserve a separation s1 and orientations of elements 3a and 3b.

Figure 28C:
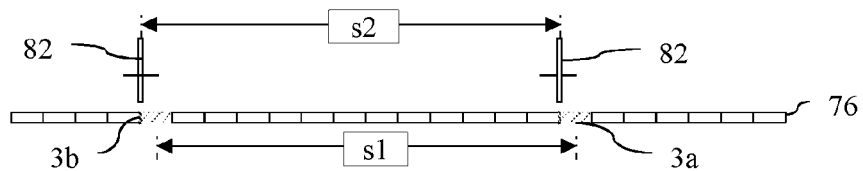

As illustrated in FIG. 28C in a third step, the light-emitting elements 3a,3b are cut and scribed or broken by means of a cutting device 82, which may for example be a scribe, cutting wheel, laser beam or saw.

The separation s2 of the cut or break locations for a respective edge of elements 3a, 3b are provided to be substantially the same as the separation s1.

Figure 28D:
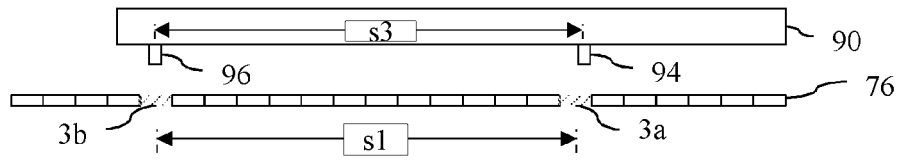

As illustrated in FIG. 28D in a fourth step, a tool 90 may have fingers 94, 96 with separation s3, and is aligned to the plurality of micro-LEDs 3a, b. The separation s3, orientation and placement of the fingers 94, 96 are provided as substantially the same as the separation s1, orientation and placement of the light-emitting elements of the array.

The separation s3 may not be precisely identical to the separation s1, or the orientation and placement of the fingers 94, 96 may not be identical to the orientation and placement of the light-emitting elements 3a, 3b. Advantageously the alignment tolerance and tool 90 fabrication tolerances are relaxed, reducing cost and complexity of the assembly method.

In an alternative method for the fourth step a laser may be arranged to illuminate the micro-LEDs 3a, 3b to provide cutting and separation. For example an excimer laser may illuminate the micro-LEDs 3a, 3b through the sapphire wafer. The gallium nitride material at the interface may decompose to nitrogen and gallium, providing a separation force and achieving a patterned laser lift off of the elements 3a, 3b. The separation of the illumination regions may be s1. The cutting or breaking step may further be eliminated, with breakage of the edges of the micro-LEDs 3a, 3b provided by the force of lift off and illumination structure at the gallium nitride layer during exposure to the excimer laser. The lifted off elements may be provided on tool 90 that may comprise fingers 94, 96 that may be provided as regions of an adhesive layer for example.

Figure 28E:
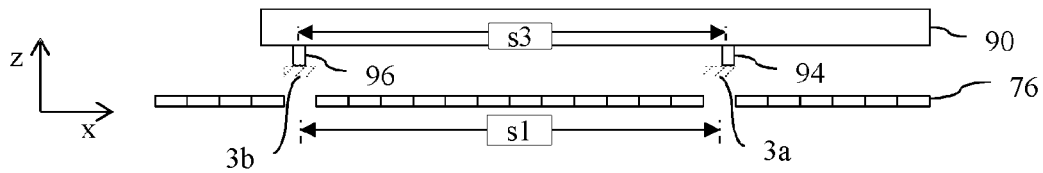

As illustrated in FIG. 28E in a fifth step the fingers 94, 96 are attached to the elements 3a, 3b respectively and used to extract the elements from the plurality of micro-LEDs 3a, 3b.

The separation s3 and orientation of the fingers 94, 96 may not be identical to the separation s1 and orientation of the elements 3a, 3b, however the integrity of the separation s1 and orientation of the elements 3a, 3b is nevertheless preserved in this extraction step.

Figure 28F:
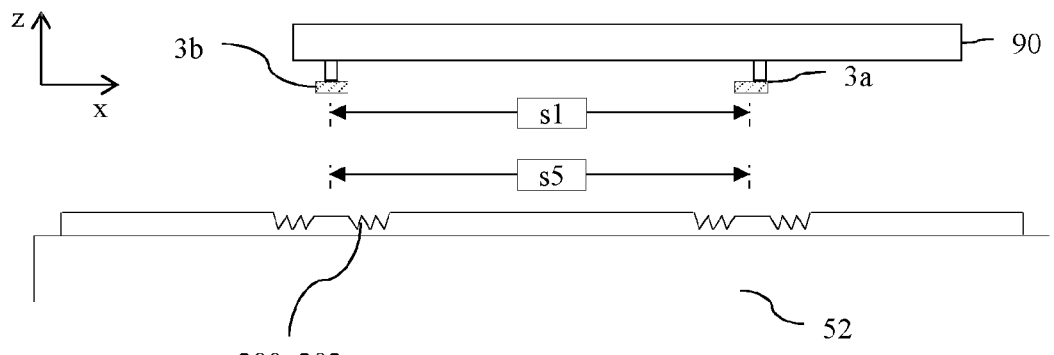
Figure 28G:
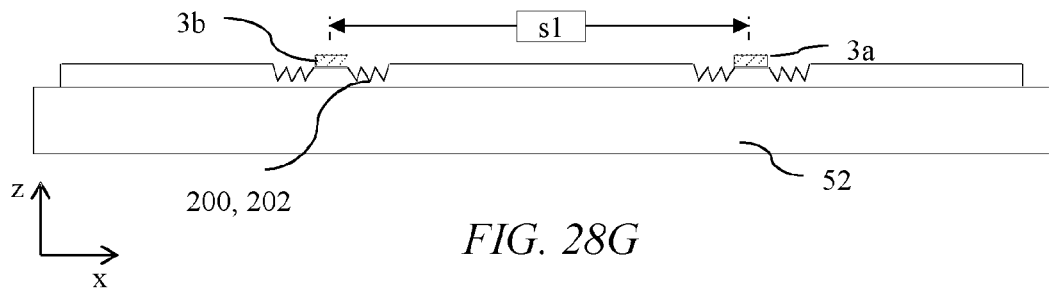

As illustrated in FIGS. 28F-G in a sixth step, the elements 3a, 3b may be transferred to backplane substrate 52. The separation of the elements 3a, 3b is the same as s1 on the monolithic substrate 2. This separation is preserved when the elements 3a, 3b are subsequently formed on substrate 52. Substrate 52 that may comprise light directing surfaces 200, 202 that have a separation s5 and that will typically be the same as separation s1. The surfaces 200, 202 may be provided by moulding methods for example.

Further electrical and thermal connections (not shown) to the micro-LEDs 3a, 3b may be provided with substantially the same separation s1 and may be provided by means of lithographic processing or printing for example.

In an alternative method, the micro-LEDs 3a, 3b may be separated from the monolithic wafer 2 without the first masking step. The electrodes and other structures may be formed on the elements 3a, 3b after forming on the substrate 52.

Figure 28H:
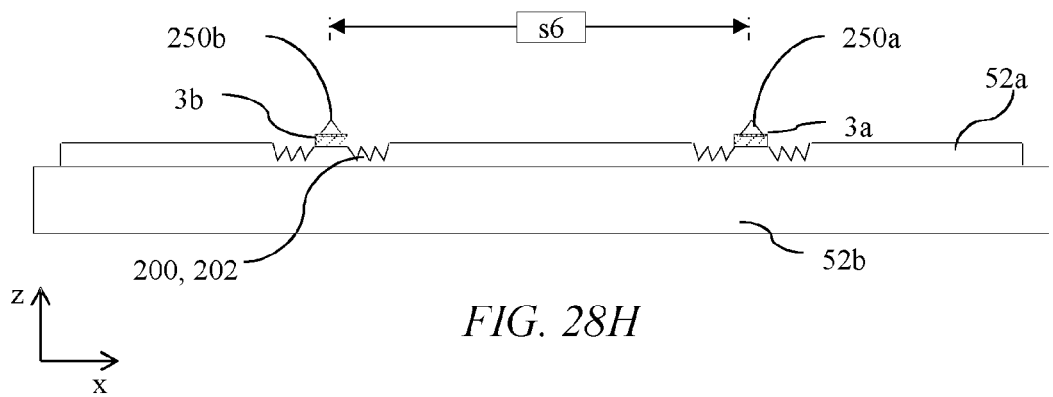

As illustrated in FIG. 28H in a seventh step prism elements 250a, 250b may be arranged on the micro-LEDs 3a, 3b with the separation s6 that may be the same as separation s1. The prisms may be formed by a moulding method.

Figure 28I:
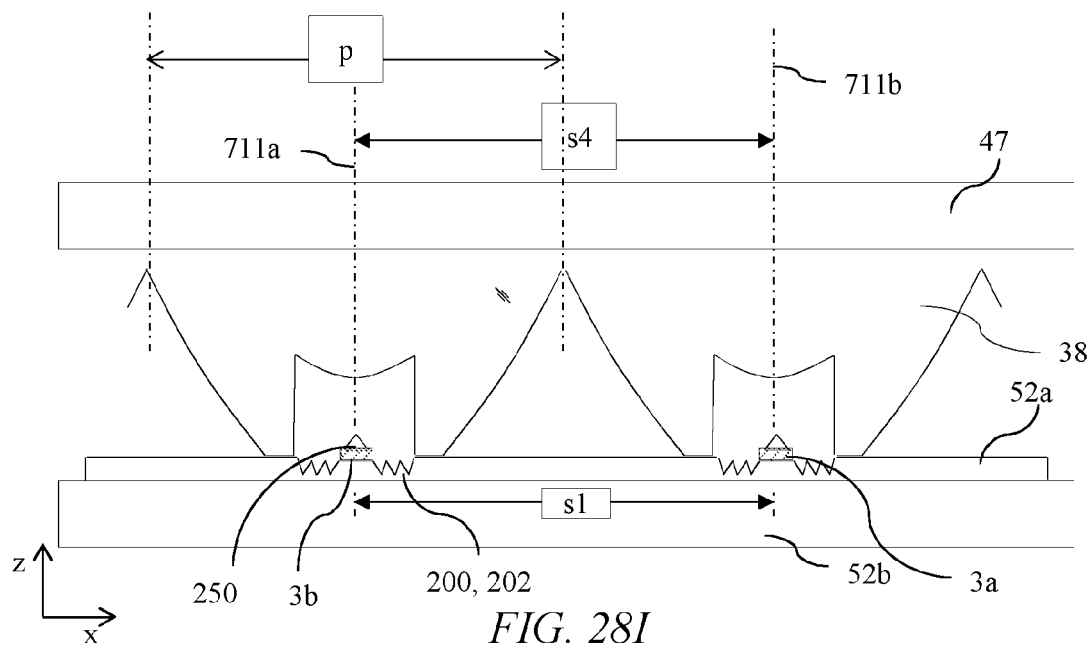

As illustrated in FIG. 28I in an eighth step the substrate 52 may be aligned to a plurality of catadioptric optical elements 38. The plurality of catadioptric optical elements 38 may be monolithic and/or may be formed on transparent substrate 47.

The relative spatial positions of the plurality of catadioptric optical elements 38 may be provided when the plurality of catadioptric optical elements 38 are formed. The separation s4 of the respective optical axes 711a, 711b may be the same as s1 to provide the same light output directional light output distribution from adjacent catadioptric optical elements. Alternatively the separation s4 may be different from s1 to provide different directional light output distributions from adjacent elements, for example to provide pupillation of the output of the illumination apparatus 110 across the area of the illumination apparatus.

Thus the non-monolithic light-emitting element array and the optical element array are aligned such that a given optical element is aligned with a respective light-emitting element. The light-emitting element is positioned substantially in the input aperture (entrance pupil) of the respective optical element 38.

The catadioptric optical elements 38 each have an output aperture (exit pupil), (illustrated with width p), and is greater in area than the area of the respective light-emitting element in the input aperture such that the respective catadioptric optical element 38 that is aligned with a light-emitting element 3a of the non-monolithic light-emitting element array directs light emitted by the light-emitting element 3a into a smaller solid angle than that at which the light is emitted by the light-emitting element 3a.

The step of selectively removing a plurality of light-emitting elements from the monolithic array in a manner that preserves the relative spatial position of the selectively removed light-emitting elements may further comprise removing the plurality of light-emitting elements from the monolithic array in a manner that preserves the relative orientation of the selectively removed light-emitting elements.

Advantageously this achieves an array of directional light output distributions that are substantially the same across the plurality of micro-LEDs 3a, 3b and respective aligned catadioptric optical elements 38. The illumination profile of the light output directional light output distribution can be substantially identical for respective elements with the same size and orientation of light-emitting elements 3a, 3b.

Advantageously the uniformity correction embodiments described elsewhere herein can be provided for each element of the plurality of micro-LEDs 3a, 3b, or pixel micro-LEDs 203 and respective aligned catadioptric optical elements 38. Thus a uniform illumination apparatus may be provided for backlighting, direct display or environmental lighting applications.

A method to form an illumination apparatus will now be further described.

FIGS. 29A-D are schematic diagrams illustrating in perspective views a method to form an illumination apparatus 110 comprising a plurality of micro-LEDs 3 and a plurality of catadioptric optical elements 38.

Figure 29A:
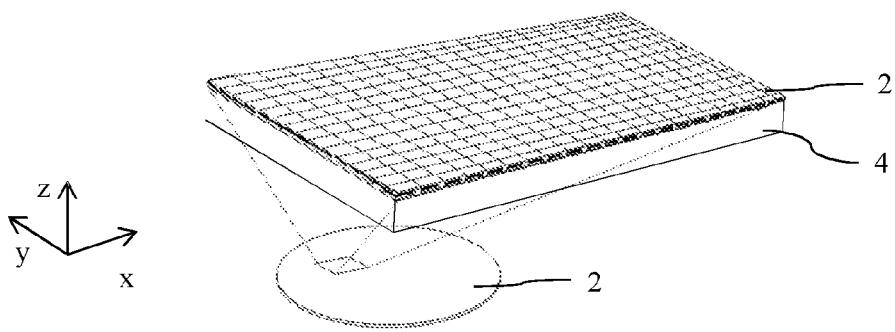
FIGS. 29A-D are schematic diagrams illustrating in perspective views a method to form an illumination apparatus comprising a plurality of micro-LEDs and a plurality of catadioptric optical elements, in accordance with the present disclosure.

As illustrated in FIG. 29A, the monolithic wafer 2 that may be gallium nitride for example and may be formed on a substrate 4 that may be sapphire for example.

Figure 29B:
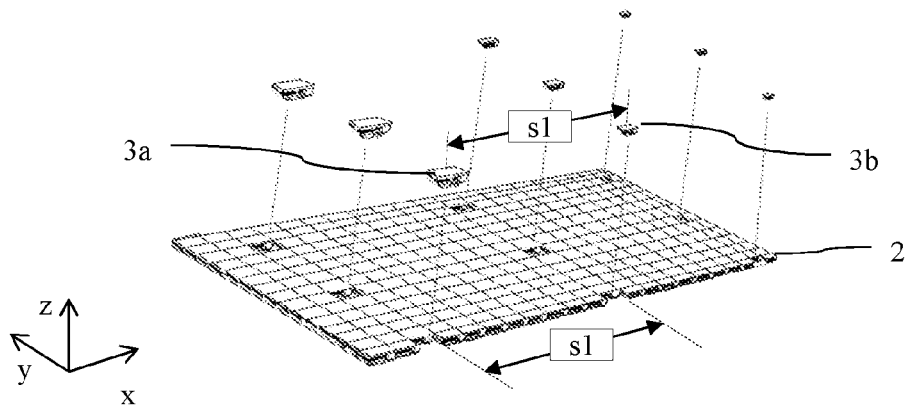

As illustrated in FIG. 29B, a non-monolithic plurality of micro-LEDs 3 may be extracted from the monolithic wafer 2 to provide micro-LEDs 3a, 3b with separation s1.

Figure 29C:
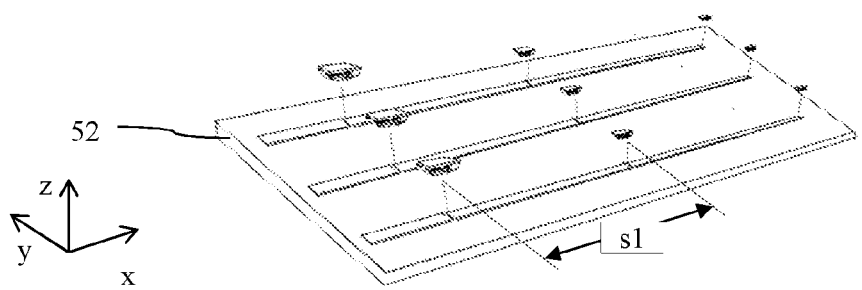

As illustrated in FIG. 29C, micro-LEDs 3a, 3b may be arranged on substrate 52 in alignment with electrodes and other optical elements (not shown).

Figure 29D:
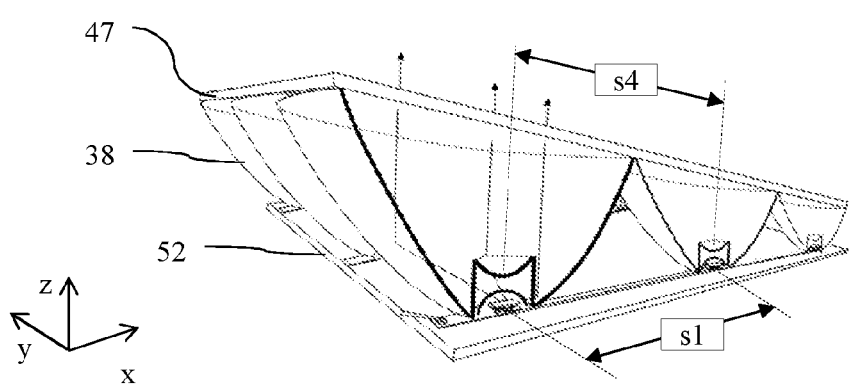

As illustrated in FIG. 29D, the substrate 52 may be aligned with a plurality of catadioptric optical elements 38 with separations s4 to provide an illumination apparatus, such that separation s4 may be the same as separation s1. Advantageously large numbers of elements may be formed over large areas using small numbers of extraction steps, while preserving alignment to a respective array of optical elements.

Figure 30A:
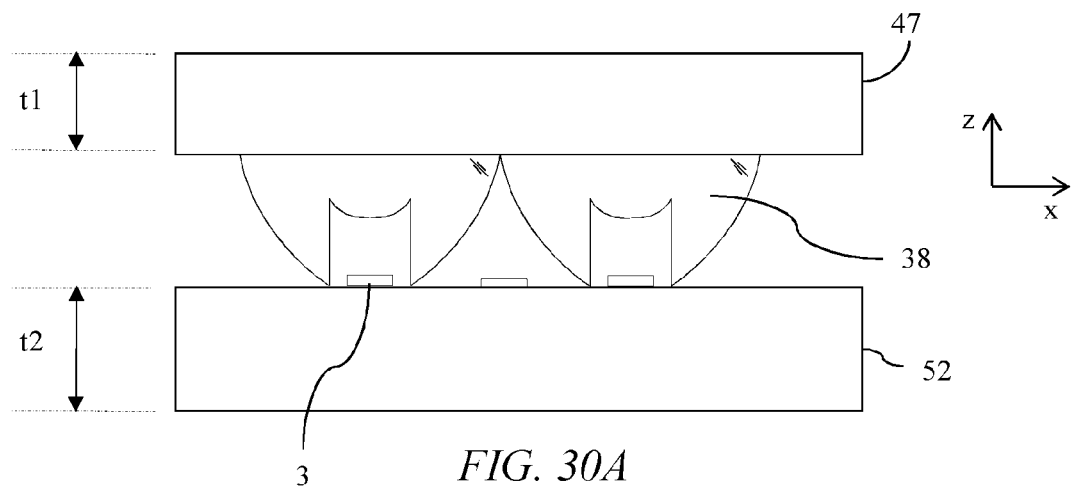
FIGS. 30A-B are schematic diagrams illustrating in side views thinning of an illumination apparatus, in accordance with the present disclosure.
Figure 30B:
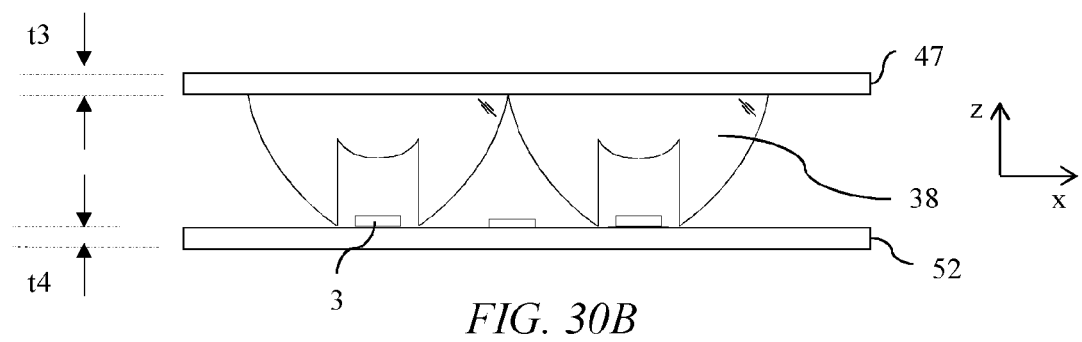

FIGS. 30A-B are schematic diagrams illustrating in side views thinning of an illumination apparatus. FIG. 30A illustrates that the thicknesses t1, t2 of substrates 52, 47 may be provided to achieve thermal and mechanical stability in the steps illustrated in FIGS. 29A-D. In operation, it may be desirable to provide reduced thickness t3, t4, that can be achieved for example by means of chemical-mechanical polishing of the illumination apparatus after alignment step of FIGS. 28I and 29D. Such a process is further disclosed in WO2012052723 and incorporated herein by reference. For example substrates of thickness 0.4 mm can be provided during manufacture and thinned to less than 0.1 mm to provide low device thickness and flexibility.

Advantageously manufacturing yield can be increased while achieving thin device profile and flexible applications.

It would be desirable to provide multiple illumination apparatuses from large areas of aligned optical elements.

Figure 31:
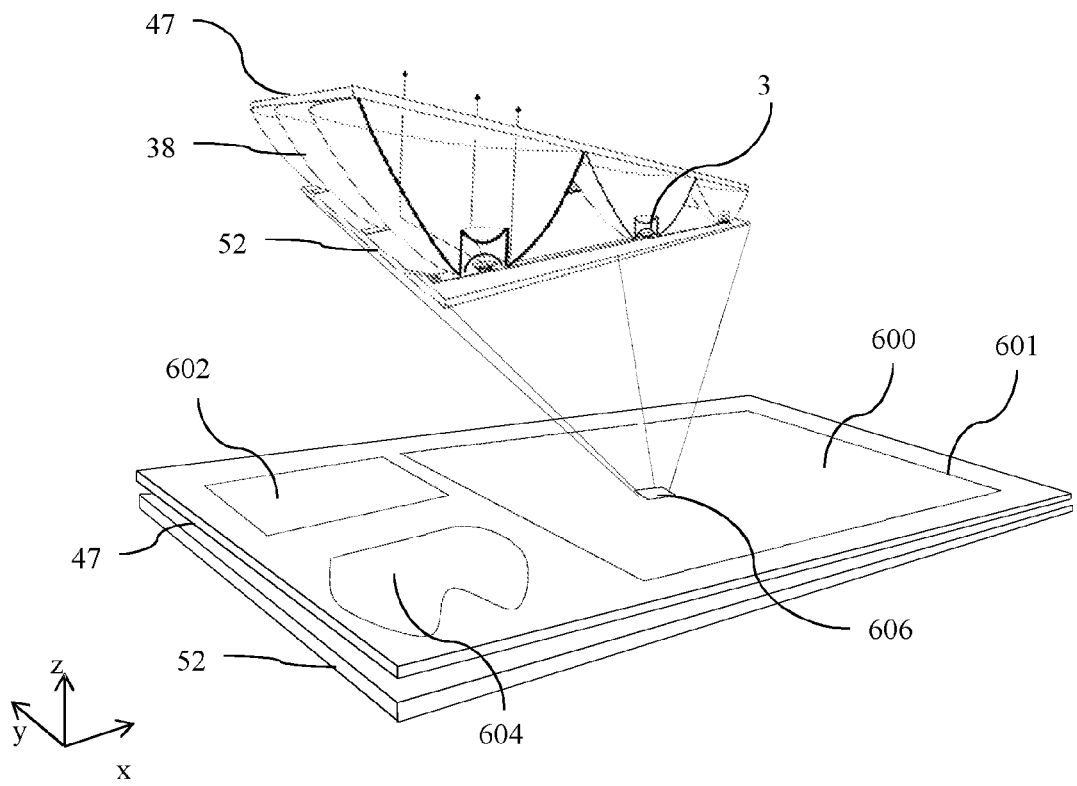
FIG. 31 is a schematic diagram illustrating in perspective view singulation of an illumination apparatus, in accordance with the present disclosure.

FIG. 31 is a schematic diagram illustrating in perspective view singulation of an illumination apparatus. FIG. 31 illustrates that illumination apparatuses with desirable directional light output distribution characteristics can be singulated from large area substrates 52, 47, for example to provide different size elements 600, 602 or different shape elements 604. Further device seal lines 601 may be provided at the edge of each element to provide hermetic sealing of the optical elements, and reduce dust and other material ingress into the optical elements during use.

Advantageously manufacturing cost and complexity can be reduced, and reliability during use increased.

Figure 32:
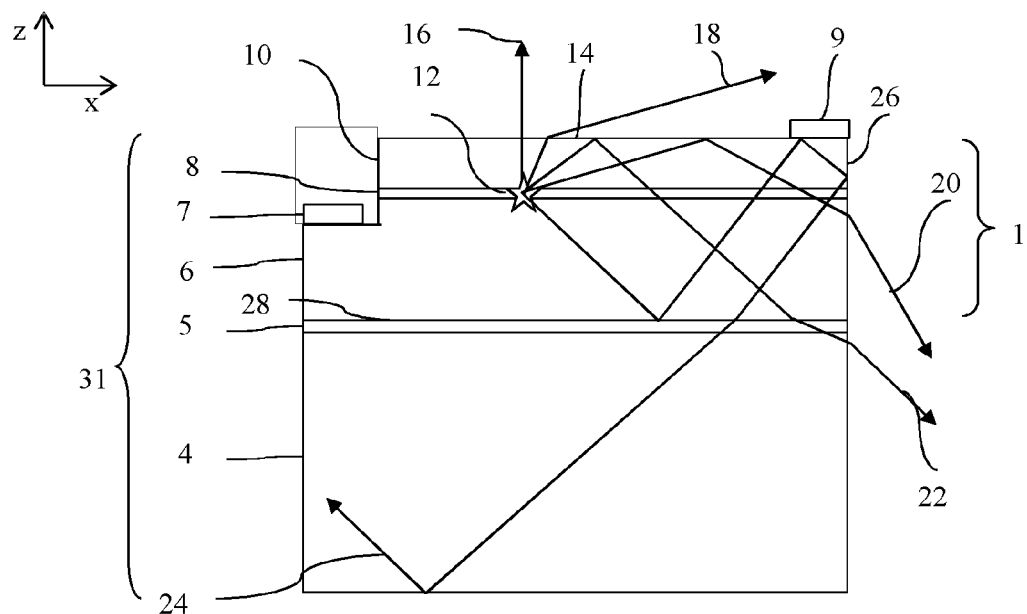
FIG. 32 is a schematic diagram illustrating in side view a prior art micro-LED device, in accordance with the present disclosure.

FIG. 32 is a schematic diagram illustrating in side view a prior art LED device 31 as an example of a micro-LED 3. In this specification, the term LED is used to include semiconductor LEDs including inorganic LED, organic LEDs and polymer LEDs.

A substrate 4, such as sapphire has an n-type gallium nitride (GaN) layer 6 layer formed on its surface, typically with intermediate functional layer 5 such as a lattice matching layer or a release layer. A multiple quantum well layer 8 and p-type GaN layer 10 are formed over the layer 6. The active region 1 thus comprises the layers 6, 8, 10 and perhaps part of layer 5 and may further comprise electrode contacts and other functional elements as part of the LED device 31 structure.

The substrate 4 and functional layer 5 may be removed in the process of extraction of the LED device 31 for example by means of patterned laser lift off as described elsewhere herein. In the case of lifted off LED device 31, electrode 7 may alternatively be arranged on the layer 6.

When a voltage is applied across the LED device 31 by means of electrodes 7, 9, emission 12 occurs within the layer 8.

Light rays 16, 18 transmitted close to normal to the outer surface 14 are transmitted. However, light rays 20, 22, 24 are internally reflected due to the relatively high refractive indices within the LED device 31. Light rays 20, 22 can exit through the edge 26 of the device. Such devices have relatively high internal absorption coefficients to light passing through the layers 6, 8, 10, resulting in loss of efficiency and increased device heating. As the dimensions of the device increases, the path length of many of the internally reflected light rays 20, 22, 24 increases and so the proportion of light rays that can escape from the device decreases, resulting in decreasing external efficiency for larger devices as size increases. In order to improve the external efficiency, surface roughening or photonic bandgap structures are added to the top surface 14. This enables light that would otherwise have been guided in the device layers to be extracted from the top surface 14. In thin film flip chip devices, the substrate 4 is further removed so as to improve external light coupling. In this case, the surface 28 is modified. Further the edges of the device may be formed by an etching process prior to cutting to provide improved facet quality.

It may be desirable to increase the output coupling efficiency of micro-LED 3.

Figure 33:
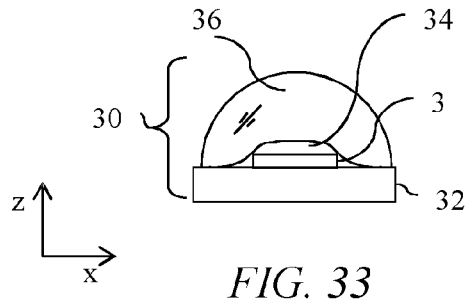
FIG. 33 is a schematic diagram illustrating in side view a micro-LED device mounted with phosphor layer and hemispherical structure, in accordance with the present disclosure.

FIG. 33 is a schematic diagram illustrating in side view the mounting of the LED device 31 onto a substrate 52 to form a substantially Lambertian light output micro-LED 3. Electrical connections (not shown) are made and in the case of white emission devices, a phosphor or colour conversion layer 34 is added. Further, a hemispherical refractive structure 36, for example a moulded silicone material, may be added to increase the forward optical coupling efficiency of the device. Alternatively, in thin film flip-chip, structures, the device 1 may be used in which the substrate 4 has been removed. The structure 36 serves in particular to couple the light output from the light-emitting element into air by providing an index matching function, reducing Fresnel losses and total internal reflection losses at the surface of the light-emitting element and at the surface of the structure. The structure 36 does not serve to provide any substantial light directing function so that if the LED has a Lambertian output then the output of the hemispherical structure will also be substantially Lambertian.

In the present embodiments the micro-LEDs 3 may be aligned to an array of refractive ancillary optics 36, such as hemispherical structures with separation s7, typically similar to the separation s4 so as to advantageously achieve efficient light extraction into air from the light-emitting elements 3a, 3b.

Figure 34:
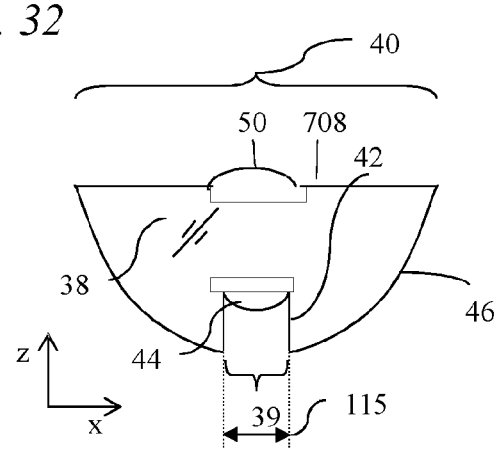
FIG. 34 is a schematic diagram illustrating in side view a catadioptric optical element, in accordance with the present disclosure.
Figure 35:
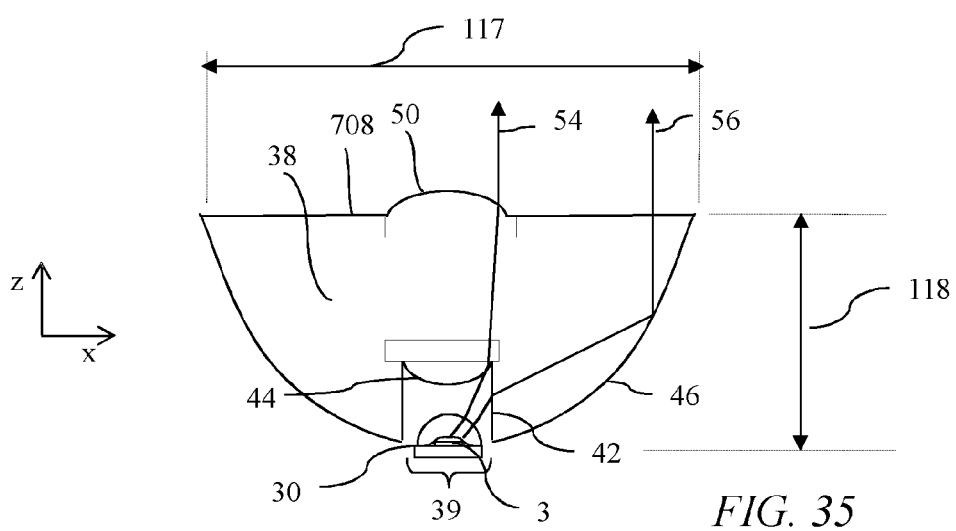
FIG. 35 is a schematic diagram illustrating in side view a directional micro-LED device, in accordance with the present disclosure.

FIG. 34 is a schematic diagram illustrating in side view a known macroscopic catadioptric light directing optical single element 38; and FIG. 35 is a schematic diagram illustrating in side view an arrangement of macroscopic light directing element 38 with the mounted device 30.

Surface 48 may comprise several features. For example, a lens surface 50, a diffuser, lenticular arrays or other optical function may be incorporated. Such an element operates by means of reflective and refractive optical structures (catadioptric). Further, some of the surfaces may be metallised so that reflections are by means of total internal reflection and/or metallised reflection. Typical structures may be compound parabolic collectors (CPC) or refractive-reflective-internal reflective (RXI) elements.

The input aperture 39 of the element 38 has a width or diameter 115 and the output aperture 40 has a width or diameter 117. Specifically the output aperture 40 has an area greater than the area of the input aperture 39 so that the width or diameter 117 is greater than the width or diameter 115. The optical element 38 thus provides a reduction in the solid angle of the output beam from the output aperture 40 compared to the solid angle of the input beam at the input aperture 39. In operation, the optical input aperture is defined by the size of the respective aligned light-emitting element and so the (effective) optical input aperture is smaller than the physical input aperture 115.

By way of comparison with the present embodiments, macroscopic catadioptric optical elements may be used with light-emitting elements such as 1 mm×1 mm LEDs are on a relatively large scale with output aperture sizes 117 and thickness of greater than 10 mm being typical. Such macroscopic optical elements may be mastered by means of diamond turning the form of a single element which is then replicated to produce individual macroscopic optical elements. Each of these is then aligned to at least one LED, typically using a pick-and-place process. Such techniques do not use lithographic level precision of placement of input and output apertures of the optical elements or of the light-emitting elements in the array. Such standard techniques are not adequately precise for use in microscopic array directional illumination systems described in this specification.

The device 30 is aligned centrally with the input aperture 39 and the optical axis 711. Light ray 54 passes through the surfaces 48, 50 and is directed parallel to the optical axis 52. Light ray 56 passes through the surface 42 and undergoes total internal reflection at the surface 46. Alternatively the surface 46 may be coated with a reflective material. In the case of a sideways displacement of the device 30 from the optical axis 711 of the element 38, the rays 54, 56 would no longer parallel to the optical axis 711, and the centre of the final output beam comprising rays 54, 56 may be angularly displaced with respect to the originally desired output directions 54, 56. Further, the final luminance structure of the angular output may be modified. In an array of such macroscopic optical elements it is desirable that the light-emitting elements are accurately aligned with the optical centre of the optical elements so that all the output beams are parallel. If this is not the case then the final output solid angle will be increased for the array compared to the solid angle for a single device.

The words "substantially" and "approximately", as may be used in this disclosure provide a tolerance which is accepted in the industry for its corresponding word and/or relativity between items. Such an industry-accepted tolerance ranges from zero to ten percent and corresponds to, but is not limited to, lengths, positions, angles, etc. Such relativity between items ranges between approximately zero to ten percent.

Embodiments of the present disclosure may be used in a variety of optical systems. The embodiment may include or work with a variety of lighting, backlighting, optical components, displays, tablets and smart phones for example. Aspects of the present disclosure may be used with practically any apparatus related to displays, environmental lighting, optical devices, optical systems, or any apparatus that may contain any type of optical system. Accordingly, embodiments of the present disclosure may be employed in displays, environmental lighting, optical systems and/or devices used in a number of consumer professional or industrial environments.

It should be understood that the disclosure is not limited in its application or creation to the details of particular arrangements illustrated, because the disclosure is capable of other embodiments. Moreover, aspects of the disclosure may be set forth in different combinations and arrangements to define embodiments unique in their own right. Also, the terminology used in this disclosure is for the purpose of description and not of limitation.

While embodiments in accordance with the principles that are disclosed herein have been described, it should be understood that they have been presented by way of example only, and not limitation. Therefore, the breadth and scope of this disclosure should not be limited by any of the exemplary embodiments described, but should be defined only in accordance with any claims and their equivalents issuing from this disclosure. In addition, the above advantages and features are provided in described embodiments, but shall not limit the application of such issued claims to processes and structures accomplishing any or all of the above advantages.

The section headings herein are included to provide organizational cues. These headings shall not limit or characterise the embodiments set out in any claims that may issue from this disclosure. To take a specific example, although the headings refer to a "Technical Field," the claims should not be limited by the language chosen under this heading to describe the field. Further, a description of technology in the "Background" is not to be construed as an admission that certain technology is prior art to any embodiment in this disclosure. Neither is the "Summary" to be considered as a characterization of the embodiments in issued claims. Furthermore, any reference in this disclosure to "invention" in the singular should not be used to argue that there is merely one point of novelty in this disclosure. Multiple embodiments may be set forth according to the limitations of the multiple claims issuing from this disclosure, and such claims define the embodiments, and their equivalents, that are protected by them. In all instances, the scope of claims shall be considered on their own merits in the light of this disclosure, and should not be constrained by the headings used in this disclosure.

The invention claimed is:

1. An illumination apparatus, comprising:
   a plurality of micro-LEDs, the plurality of micro-LEDs being arranged in a micro-LED array;
   a plurality of catadioptric optical elements arranged in a catadioptric optical element array, wherein each of the catadioptric optical elements of the plurality of catadioptric optical elements is aligned in correspondence with a respective one or more of the micro-LEDs of the plurality of micro-LEDs, each of the micro-LEDs of the plurality of micro-LEDs being aligned with only a respective one of the catadioptric optical elements of the plurality of catadioptric optical elements; the alignment being such that some of the light output from each of the micro-LEDs exits its respective catadioptric optical element with a first light output distribution;
   one or more reflective members, the one or more reflective members arranged relative to the first light output distribution such that some of the light that exits the respective catadioptric optical element is reflected by the one or more reflective members back into the catadioptric optical element; and
   a plurality of light recycle systems, the plurality of light recycle systems being arranged in an array, wherein each of the light recycle systems of the plurality of light recycle systems are aligned in correspondence with a respective micro-LED of the plurality of micro-LEDs, each of the light recycle systems being arranged relative to the catadioptric optical element and the one or more reflective members such as to further reflect some of said light that has been reflected back into its respective catadioptric optical element to provide recycled light that exits its respective catadioptric optical element with a second light output distribution, thereby providing a combined light output distribution comprising in combination the first light output distribution and the second light output distribution, the combined light output distribution having increased spatial uniformity compared to the spatial uniformity of the first light output distribution alone.

2. An illumination apparatus according to claim 1; wherein each light recycle system comprises at least a first part and a second part, the first part having a different reflection characteristic compared to the second part.

3. An illumination apparatus according to claim 1 wherein the first part of the light recycle system has a different reflectivity compared to the second part of the light recycle system.

4. An illumination apparatus according to claim 2 wherein the first part of the light recycle system provides a different direction of reflection compared to the second part of the light recycle system.

5. An illumination apparatus according to claim 4, wherein the different direction of reflection is provided by the first part of the light recycle system being of a different shape compared to the second part of the light recycle system.

6. An illumination apparatus according to claim 4, wherein the different direction of reflection is provided by the first part of the light recycle system facing a direction that is different compared to a direction faced by the second part of the light recycle system.

7. An illumination apparatus according to claim 1, wherein the width or diameter of the micro-LEDs is less than 300 microns, preferably less than 200 microns and more preferably less than 100 microns.

8. An illumination apparatus according to claim 1, wherein each of the light recycle systems of the plurality of light recycle systems are aligned in correspondence with a respective catadioptric optical element of the plurality of catadioptric optical elements.

9. An illumination apparatus according to claim 2, wherein the second part of the light recycle systems comprises a light absorbing material.

10. An illumination apparatus according to claim 1, wherein the light recycle system comprises at least one tilted reflective surface that is inclined with respect to the optical axis of the catadioptric optical elements of the plurality of catadioptric optical elements.

11. An illumination apparatus according to claim 1, wherein the light recycle system is arranged in proximity to a micro-LED that is aligned with the respective catadioptric optical element.

12. An illumination apparatus according to claim 10 wherein the normal of the tilted reflective surfaces are arranged to intersect an inner side wall of the catadioptric optical element.

13. An illumination apparatus according to claim 12 wherein the intersection of the normal of the tilted reflective surfaces and inner side wall of the catadioptric optical element is in the central one third region of the extent of the side wall.

14. An illumination apparatus according to claim 13 wherein the intersection of the normal of the tilted reflective surfaces bisects the inner side wall of the catadioptric optical element.

15. An illumination apparatus according to claim 10, wherein the least two tilted reflective surfaces have different tilt angles.

16. An illumination apparatus according to claim 10, wherein at least two of the tilted reflective surfaces have different normal directions that are opposing and disposed on either side of the optical axis of the catadioptric optical element.

17. An illumination apparatus according to claim 1, wherein the light recycle system comprises a plurality of tilted reflective surfaces arranged in an array.

18. An illumination apparatus according to claim 15, wherein the at least two tilted surfaces are interleaved.

19. An illumination apparatus according to claim 1, wherein;
the at least two tilted surfaces are arranged proximate to and around at least some of the micro-LEDs of the plurality of micro-LEDs.

20. An illumination apparatus according to claim 1, wherein at least one transparent prism is provided between at least one micro-LED of the plurality of micro-LEDs and the transparent inner surface of the catadioptric optical elements.

21. An illumination apparatus according to claim 1, wherein a refractive optical element is provided between the micro-LEDs of the plurality of micro-LEDs and the at least one transparent inner surface.

22. An illumination apparatus according to claim 21 wherein the refractive optical element is a hemispherical lens.

23. An illumination apparatus according to claim 1, wherein the plurality of micro-LEDs comprises inorganic micro-LEDs.

24. An illumination apparatus according to claim 1, wherein the plurality of micro-LEDs further comprises a wavelength converting layer.

25. An illumination apparatus according to claim 24 wherein the wavelength converting layer comprises a phosphor material or a quantum dot material.

26. An illumination apparatus according to claim 1, wherein
the micro-LEDs of the plurality of micro-LEDs are from a monolithic wafer arranged in an array with their original monolithic wafer positions and orientations relative to each other preserved; and
wherein in at least one direction, for at least one pair of the plurality of micro-LEDs in the at least one direction, for each respective pair there was at least one respective micro-LED in the monolithic wafer that was positioned in the monolithic wafer between the pair of micro-LEDs in the at least one direction and that is not positioned between them in the array of micro-LEDs.

27. A backlight for a display apparatus comprising the illumination apparatus of claim 1.

28. A direct display apparatus comprising an illumination apparatus according to claim 1 and a control apparatus arranged to provide image data to the plurality of micro-LEDs arranged in the micro-LED array.

29. A direct display according to claim 28 where the micro-LEDs are of width or diameter less than 100 microns, preferably less than 50 microns and more preferably less than 25 microns.

30. An illumination apparatus, comprising:
a plurality of micro-LEDs, the plurality of micro-LEDs being arranged in a micro-LED array;
a plurality of catadioptric optical elements arranged in a catadioptric optical element array, wherein each of the catadioptric optical elements of the plurality of catadioptric optical elements is aligned in correspondence with a respective one or more of the micro-LEDs of the plurality of micro-LEDs, each of the micro-LEDs of the plurality of micro-LEDs being aligned with only a respective one of the catadioptric optical elements of the plurality of catadioptric optical elements; and a plurality of light recycle systems, the plurality of light recycle systems being arranged in an array, wherein each of the light recycle systems of the plurality of light recycle systems is aligned in correspondence with a respective micro-LED of the plurality of micro-LEDs;

wherein each light recycle system comprises at least a first part and a second part, the first part having a different reflection characteristic compared to the second part.

31. An illumination apparatus according to claim 30; wherein the first part of the light recycle system has a different reflectivity compared to the second part of the light recycle system.

32. An illumination apparatus according to claim 30 wherein the first part of the light recycle system provides a different direction of reflection compared to the second part of the light recycle system.

33. An illumination apparatus according to claim 32, wherein the different direction of reflection is provided by the first part of the light recycle system being of a different shape compared to the second part of the light recycle system.

34. An illumination apparatus according to claim 32, wherein the different direction of reflection is provided by the first part of the light recycle system facing a direction that is different compared to a direction faced by the second part of the light recycle system.

35. An illumination apparatus according to claim 30, wherein the illumination apparatus further comprises one or more reflective members.

36. A backlight for a display apparatus comprising the illumination apparatus of claim 30.

37. A display apparatus comprising the backlight apparatus of claim 36 and a spatial light modulator.

38. A display apparatus comprising an illumination apparatus according to claim 30 and a control apparatus arranged to provide image data to the plurality of micro-LEDs arranged in the micro-LED array.

39. An illumination apparatus according to claim 1, wherein each of the catadioptric optical elements of the plurality of catadioptric optical elements comprises, in at least one cross-sectional plane through its optical axis:
a first outer surface and a second outer surface facing the first outer surface;
wherein the first and second outer surfaces extend from a first end of the catadioptric optical element to a second end of the catadioptric optical element, the second end of the catadioptric optical element facing the first end of the catadioptric optical element;
wherein the distance between the first and second outer surfaces at the first end of the catadioptric optical element is less than the distance between the first and second outer surfaces at the second end of the catadioptric optical element; and
at least one transparent inner surface arranged between the first and second ends and between the first and second outer surfaces.

40. An illumination apparatus according to claim 1, wherein the alignment in correspondence between a catadioptric optical element of the plurality of catadioptric optical elements and its respective one or more of the LEDs of the first plurality of LEDs comprising the respective one or more of the LEDs of the first plurality of LEDs being positioned at the first end of the catadioptric optical element and aligned with the catadioptric optical element or positioned between the first end of the catadioptric optical element and the at least one transparent inner surface of the catadioptric optical element and aligned with the catadioptric optical element.

41. An illumination apparatus according to claim 1, wherein in the at least one catadioptric cross-sectional plane the distance between the first and second outer surfaces at the second end of the catadioptric optical element is less than 3 mm, preferably less than 1.5 mm and more preferably less than 0.75 mm.

42. An illumination apparatus according to claim 1, wherein the cross-section from one side to the other side of the micro-LED is aligned within the first end of the catadioptric optical element.

43. An illumination apparatus according to claim 1, wherein the reflective member comprises a planar reflective structure.

44. An illumination apparatus according to claim 1, wherein the reflective member comprises a reflective polariser.

45. An illumination apparatus according to claim 1, wherein a retarder layer is arranged between the plurality of catadioptric optical elements and the reflective member.

46. An illumination apparatus according to claim 1, wherein the reflective member comprises a patterned reflector.

47. An illumination apparatus according to claim 1, wherein the patterned reflector is arranged between the catadioptric optical elements and LEDs of a second plurality of LEDs.

48. An illumination apparatus according to claim 1, wherein the reflective member comprises at least one prism microstructure.

49. An illumination apparatus according to claim 1, wherein the at least one prism microstructure is arranged to reflect light by means of total internal reflection.

50. An illumination apparatus according to claim 1, wherein;
the catadioptric optical elements of the plurality of catadioptric optical elements are elongate in a first direction;
at least some of the micro-LEDs of the plurality of micro-LEDs are separated by gaps in the first direction; and
the at least two tilted surfaces are arranged in the gaps.

51. An illumination apparatus according to claim 1, wherein in the at least one catadioptric cross-sectional plane, the exterior angle between the first end and the first and second outer surfaces at the first end is less than the exterior angle between the first end and the first and second outer surface at the second end.

52. An illumination apparatus according to claim 1, wherein in the at least one catadioptric cross-sectional plane at least one of the transparent inner surfaces has positive optical power.

53. An illumination apparatus according to claim 1, wherein in the at least one catadioptric cross-sectional plane at least one of the transparent inner surfaces has zero optical power.

54. An illumination apparatus according to claim 1, wherein in the at least one catadioptric cross-sectional plane some of the light output of micro-LEDs of the plurality of micro-LEDs is transmitted by the at least one transparent inner surface before it is reflected at the first or second outer surfaces and directed into the first directional light output distribution; and
some of the light output of the micro-LEDs of the plurality of micro-LEDs is transmitted by the at least one transparent inner surface and directed into the first directional light output distribution without reflection at the first or second outer surfaces.

55. An illumination apparatus according to claim 1, wherein at least some of the catadioptric optical elements of the plurality of catadioptric optical elements are extended in a direction that is normal to the catadioptric optical element cross sectional plane.

56. An illumination apparatus according to claim 1, wherein the second end of at least one catadioptric optical element of the plurality of catadioptric optical elements is arranged on the first side of an optical element support substrate.

57. An illumination apparatus according to claim 1, wherein the catadioptric optical elements of the plurality of catadioptric optical elements comprise a material transparent to at least one operating wavelength of at least one element of the plurality of micro-LEDs.

58. A display apparatus comprising the backlight apparatus of claim 27 and a spatial light modulator.

59. A display apparatus according to claim 1, wherein the reflective polariser is arranged between the backlight and the spatial light modulator.

60. A display apparatus according to claim 37, wherein the reflective polariser is arranged between the backlight and the spatial light modulator.

* * * * *